(12) United States Patent
Imamura et al.

(10) Patent No.: US 9,886,110 B2
(45) Date of Patent: Feb. 6, 2018

(54) TRANSPARENT ELECTROCONDUCTIVE LAMINATE

(71) Applicant: Teijin Limited, Osaka (JP)

(72) Inventors: Koichi Imamura, Tokyo (JP); Ryuhei Kanzaki, Tokyo (JP); Atsushi Sasaki, Tokyo (JP); Yohei Okada, Tokyo (JP); Kazuhito Kobayashi, Osaka (JP); Yusuke Nakata, Osaka (JP)

(73) Assignee: TEIJIN LIMITED, Osaka (JP)

( * ) Notice: Subject to any disclaimer, the term of this patent is extended or adjusted under 35 U.S.C. 154(b) by 719 days.

(21) Appl. No.: 14/388,946

(22) PCT Filed: Mar. 19, 2013

(86) PCT No.: PCT/JP2013/057892
§ 371 (c)(1),
(2) Date: Sep. 29, 2014

(87) PCT Pub. No.: WO2013/146483
PCT Pub. Date: Oct. 3, 2013

(65) Prior Publication Data
US 2015/0055033 A1    Feb. 26, 2015

(30) Foreign Application Priority Data

Mar. 30, 2012  (JP) ................................. 2012-079776
Mar. 30, 2012  (JP) ................................. 2012-079781
(Continued)

(51) Int. Cl.
*G06F 3/041*   (2006.01)
*B32B 7/02*    (2006.01)
(Continued)

(52) U.S. Cl.
CPC .............. *G06F 3/041* (2013.01); *B32B 7/02* (2013.01); *B32B 27/08* (2013.01); *B32B 27/20* (2013.01);
(Continued)

(58) Field of Classification Search
CPC ........... G06F 3/041; B32B 7/02; B32B 27/08; B32B 27/20; B32B 27/308;
(Continued)

(56) References Cited

U.S. PATENT DOCUMENTS 9,639,227 B2 * 5/2017 Kobayashi .............. B32B 27/36
2005/0147809 A1   7/2005 Hongo et al.
(Continued)

FOREIGN PATENT DOCUMENTS

CN      1611968      5/2005
JP      2007-191587  8/2007
(Continued)

OTHER PUBLICATIONS

International Preliminary Report on Patentability dated Oct. 1, 2014 in International (PCT) Application No. PCT/JP2013/057892.
(Continued)

*Primary Examiner* — Ling Choi
*Assistant Examiner* — Ronald Grinsted
(74) *Attorney, Agent, or Firm* — Wenderoth, Lind & Ponack, L.L.P.

(57) ABSTRACT

The purpose of the present invention is to provide a transparent electroconductive laminate having extremely high visibility. A transparent electroconductive laminate in which a hard coat layer, a color difference adjustment layer, and a transparent electroconductive layer are formed in this order, wherein (1) the hard coat layer being obtained by applying and curing a hard coating composition including (A) a phenol Novolac-type acrylate having two or more acrylate
(Continued)

groups and (B) an aromatic-group-containing mono- or poly(meth)acrylate compound having 1-2 moles of a C2 or C3 alkylene oxide structure in the molecule thereof, (2) and the color difference adjustment layer includes a cured resin component (i), and metal oxide particles (ii) having an average primary particle diameter of 100 nm or less and/or metal fluoride particles (iii); having an average primary particle diameter of 100 nm or less, where the total mass of particles (ii) and (iii) in the color difference adjustment layer is 0-200 parts by mass with respect to 100 parts by mass of the cured resin component (i).

26 Claims, 2 Drawing Sheets

(30) Foreign Application Priority Data

Mar. 30, 2012 (JP) ................................. 2012-079787
Mar. 30, 2012 (JP) ................................. 2012-081350

(51) Int. Cl.
*B32B 27/08* (2006.01)
*B32B 27/20* (2006.01)
*C23C 14/08* (2006.01)
*C23C 14/35* (2006.01)
*G02B 1/04* (2006.01)
*G02B 1/10* (2015.01)
*H05K 1/02* (2006.01)
*B32B 27/30* (2006.01)

(52) U.S. Cl.
CPC .......... *B32B 27/308* (2013.01); *C23C 14/086* (2013.01); *C23C 14/35* (2013.01); *G02B 1/04* (2013.01); *G02B 1/105* (2013.01); *H05K 1/0274* (2013.01); *B32B 2255/10* (2013.01); *B32B 2255/26* (2013.01); *B32B 2264/102* (2013.01); *B32B 2307/202* (2013.01); *B32B 2307/412* (2013.01); *B32B 2307/418* (2013.01); *B32B 2457/00* (2013.01); *B32B 2457/208* (2013.01)

(58) Field of Classification Search
CPC ............ B32B 2255/10; B32B 2255/26; B32B 2264/102; B32B 2307/202; B32B 2307/412; B32B 2457/00; B32B 2457/208; C23C 14/086; C23C 14/35; G02B 1/04; G02B 1/105; H05K 1/0274
USPC .......................................................... 428/323
See application file for complete search history.

(56) References Cited

U.S. PATENT DOCUMENTS

| | | | |
|---|---|---|---|
| 2006/0251848 A1* | 11/2006 | Armstrong ........... | G11B 7/2542 428/64.4 |
| 2010/0113678 A1* | 5/2010 | Suzuki .................... | C08L 61/06 524/541 |
| 2012/0181063 A1 | 7/2012 | Nakajima et al. | |
| 2015/0049261 A1* | 2/2015 | Kobayashi ............... | C08G 8/30 349/12 |

FOREIGN PATENT DOCUMENTS

| JP | 2010-163535 | | 7/2010 |
|---|---|---|---|
| JP | 2010-182528 | | 8/2010 |
| JP | 2010182528 A | * | 8/2010 |
| JP | 2010-270186 | | 12/2010 |
| JP | 2011-76802 | | 4/2011 |
| JP | 2011-76932 | | 4/2011 |

OTHER PUBLICATIONS

International Search Report dated Jul. 2, 2013 in International (PCT) Application No. PCT/JP2013/057892.

* cited by examiner

TRANSPARENT ELECTROCONDUCTIVE LAMINATE

TECHNICAL FIELD

The present invention relates to a transparent electroconductive laminate having an excellent visibility.

BACKGROUND OF THE INVENTION

A liquid crystal display device has advantages such as thinness, lightweight, low power consumption and so on, and is widely used in various technical fields such as computers, word processors, television sets, mobile phones, handheld terminal devices and so on. In addition, so-called touch panels of such liquid crystal display devices having a mechanics of manipulation by touch on their screen are spreading rapidly. The touch panels are widely used in mobile phones like smart phones, tablet computers, handheld terminal devices, automated teller machines, automatic vending machines, personal digital assistances, copying machines, facsimiles, game machines, guiding devices set up in facilities such as museums and department stores, car navigation systems, multifunctional terminals set up in convenience stores or monitoring devices of railroad vehicles.

The touch panel generally has a transparent electroconductive laminate comprising a transparent substrate on which a transparent electrically conductive layer is formed. A PET film or a polycarbonate film is commonly used as a substrate film of a transparent electroconductive laminate thanks to its high transparency and reasonable price.

A transparent hard coat layer can be preferably applied onto such a substrate film with a view to improving scratch resistance and durability.

A transparent electrically conducting layer of a transparent electroconductive laminate can be produced in use of a metal oxide such as indium tin oxide (ITO) by a processing such as a vacuum deposition method, a sputtering method, a chemical vapor deposition (CVD) method, an ion plating method, a spray method, to obtain a transparent electrically conducting layer on a substrate film.

In order to fit a multi-point input system which is mainly used in recent years, further patterning process is needed. On the other hand, there is a trouble of visual discrimination between an area having a transparent electrically conducting layer such as ITO and an area without the electrically conducting layer, which is caused by a patterning of the electrically conducting layer.

The trouble provides largely visibility deterioration of a touch panel.

JP No. 2011-076932 A (Patent Document 1) describes a transparent conductive film in which a first transparent dielectric layer and a transparent conductive layer are formed on a transparent substrate in this order, wherein a pattern portion and a pattern opening portion are formed in the transparent conductive layer by patterning, and a relationship $0<=|a*P-a*O|<=4.00$ is satisfied and a relationship $0<=|b*P-b*O|<=5.00$ is satisfied where a hue $a*$ value and a hue $b*$ value of reflected light when the pattern portion is irradiated with white light are $a*P$ and $b*P$, respectively, and a hue $a*$ value and a hue $b*$ value of reflected light when a portion directly under the pattern opening portion is irradiated with white light are $a*O$ and $b*O$, respectively (claim 1).

In Patent Document 1, controlling of layer thicknesses and refraction indexes of the first transparent dielectric layer and the second transparent dielectric layer results in satisfaction of the above characteristics (claim 3, paragraph 0012 and the like).

JP No. 2011-076802 A (Patent Document 2) describes a transparent conductive film comprising a transparent substrate, a second transparent conductive layer, an insulating color difference adjusting layer and a first transparent conductive layer laminated in sequence, the second transparent conductive layer, the insulating color difference adjusting layer and the first transparent conductive layer being possibly formed on each side of the transparent substrate, in which the conductive face is formed as the upper face of a first transparent conductive layer by patterning the first transparent conductive layer, and the insulating face is formed as the upper face of the insulating color difference adjusting layer (claim 1). Patent Document 2 discloses that applying the second transparent conductive layer can reach a high transmittance and suppression of a difference between visibilities (paragraph 0014 and the like).

PRIOR ART DOCUMENTS

Patent Documents

Patent Document 1: JP No. 2011-076932 A
Patent Document 2: JP No. 2011-076802 A

SUMMARY OF THE INVENTION

Problems to be Resolved by the Invention

The present invention has an object to resolve the above problems in the conventional technology. In details, the present invention has an object to provide a transparent electroconductive laminate having excellent visibility.

Means of Solving the Problems

The present invention provides a transparent electroconductive laminate in which a hard coat layer, a color difference adjusting layer, and a transparent electrically conducting layer are formed in this order on at least one surface of a transparent polymer substrate, wherein (1) the hard coat layer is obtained by applying and curing a hard coating composition comprising (A) a phenolic novolac acrylate having two or more acrylate groups and (B) an aromatic group-containing mono or poly (meth)acrylate having 1 or 2 mols of ah alkylene oxide structure with two or three carbon atoms in each molecule, wherein the hard coating composition comprises 60 to 85 parts by mass of the phenolic novolac acrylate (A) and 15 to 30 parts by mass of the (meth)acrylate (B), providing that 100 parts by mass of a resin content in the hard coating composition, and (2) the color difference adjusting layer comprises a curing resin component (i), and metal oxide particles having an average primary particle diameter of 100 nm or less (ii) and/or metal fluoride particles having an average primary particle diameter of 100 nm or less (iii), and where the total mass of particles (ii) and (iii) in the color difference adjusting layer is 0-200 parts by mass with respect to 100 parts by mass of the curing resin component (i), and (3) a difference $\Delta R$ of R1 and R2 is not greater than 1, wherein R1 is a reflectance obtained by irradiation with a light source having a wavelength in a range of 500 to 750 nm toward the transparent electroconductive laminate, and R2 is a reflectance obtained by irradiation with a light source having a wavelength in a range of 500 to 750 nm toward a transparent electroconductive laminate after immersion into a strong acid aqueous solution at 40° C. for three minutes and dried, wherein the strong acid aqueous solution is obtained by a mixing of 12 N hydrochloric acid, 16 N nitric acid and water in a mass ratio of 12 N hydrochloric acid:16 N nitric acid:water being 3.3:1.0:7.6.

In the transparent electroconductive laminate, the curing resin component (i) in the color difference adjusting layer may preferably be an ultraviolet curing resin, and
a difference ΔH of H1 and H2 may preferably be not greater than 0.3%, wherein H1 is a haze value of the transparent electroconductive laminate, and H2 is a haze value of a transparent electroconductive laminate after immersion into a strong acid aqueous solution at 40° C. for three minutes and dried, wherein the strong acid aqueous solution is obtained by a mixing of 12 N hydrochloric acid, 16 N nitric acid and water in a mass ratio of 12 N hydrochloric acid:16 N nitric acid:water being 3.3:1.0:7.6.

In the transparent electroconductive laminate, the phenolic novolac acrylate (A) may preferably be represented by the following formula (I):

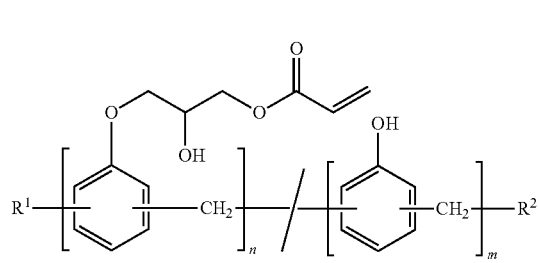

(I)

wherein $R^1$ represents H or $CH_2OH$, $R^2$ represents H or OH, n represents a number of 2 to 5 and m represents a number of 0 to 5.

In the transparent electroconductive laminate, the (meth) acrylate (B) may preferably be an aromatic group-containing (meth)acrylate having a refractive index within a range of 1.56 to 1.64.

In the transparent electroconductive laminate, the hard coat layer may preferably be obtained by applying and curing the hard coating composition further comprising (C) a fluorene unit-containing (meth)acrylate having two or more (meth)acrylate groups in addition to the components (A) and (B), wherein
the hard coating composition comprises 40 to 70 parts by mass of the phenolic novolac acrylate (A), 10 to 30 parts by mass of the (meth)acrylate (B) and 15 to 40 parts by mass of the fluorene unit-containing (meth)acrylate (C), providing that 100 parts by mass of a resin content in the hard coating composition.

In the transparent electroconductive laminate, the fluorene unit-containing (meth)acrylate (C) may preferably be represented by the following formula (II):

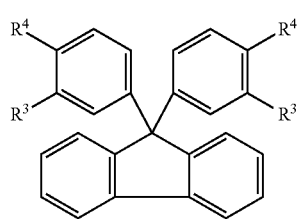

(II)

wherein each of $R^3$ independently represents H or $CH_3$, $R^4$ represents -A-OC(O)CR=$CH_2$, wherein A each represents —$OCH_2CH_2$—, —$OCH_2CH_2CH_2$—, —$OCH(CH_3)CH_2$— or —$OCH_2CH(CH_3)$— and R each represents H or $CH_3$.

In the transparent electroconductive laminate, a total content of ZnO, $TiO_2$, $CeO_2$, $SnO_2$, $ZrO_2$ and indium tin oxide in the hard coat layer may preferably be less than or equal to 0.0001% by mass.

In the transparent electroconductive laminate, the hard coat layer may preferably have a refractive index within a range of 1.565 to 1.620.

In the transparent electroconductive laminate, the curing resin component (i) in the color difference adjusting layer may preferably be a (meth)acrylate having two or more acrylate groups and a molecular weight of 1400 to 1800, and the curing resin component (i) may preferably have a hydroxyl value of 60 to 100 mgKOH/g, and a thickness of the color difference adjusting layer may preferably be within a range of 50 nm to 200 nm.

In the transparent electroconductive laminate, the transparent electrically conducting layer may preferably be a crystalline layer comprising indium oxide, and the transparent electrically conducting layer may preferably have a thickness within a range of 5 to 50 nm.

In the transparent electroconductive laminate, the transparent electroconductive laminate may preferably have a metal oxide layer between the color difference adjusting layer and the transparent electrically conducting layer, and the metal oxide layer may preferably have a thickness within a range of 0.5 to 5.0 nm.

In the transparent electroconductive laminate, the hard coat layer, the color difference adjusting layer, and the transparent electrically conducting layer are formed in this order on one side of the transparent polymer substrate, and an antiblocking layer may preferably be formed on the other side of the transparent polymer substrate.

In the transparent electroconductive laminate, the antiblocking layer may preferably be obtained by applying and curing a composition for forming an antiblocking layer comprising a first component and a second component, wherein
the first component is an unsaturated double bond containing acrylic copolymer, and
the second component comprises a polyfunctional acrylate, and
a difference of SP values (ΔSP) of the first component (SP1) and the second component (SP2) is within a range of 1 to 2, and
phase separation occurs between the first component and the second component after the composition for forming an antiblocking layer is applied, to form an antiblocking layer having a microscopic convexoconcave on its surface.

The present invention also provides a touch panel having the transparent electroconductive laminate.

In the transparent electroconductive laminate in which a high refractive index antiblocking layer, a color difference adjusting layer, and a transparent electrically conducting layer may preferably be formed in this order on at least one surface of a transparent polymer substrate, wherein
(1) the high refractive index antiblocking layer is obtained by applying a composition for forming a high refractive index antiblocking layer comprising a first component and a second component, wherein
the first component is an unsaturated double bond containing acrylic copolymer, and the second component comprises (A) a phenolic novolac acrylate having two or more acrylate groups, and (B) an aromatic group-containing mono or poly (meth) acrylate having 1 or 2 mols of an alkylene oxide structure with two or three carbon atoms in each molecule, wherein the second component comprises 60 to 85 parts by mass of the phenolic novolac acrylate (A) and 15 to 30 parts by mass of the (meth)acrylate (B), providing that 100 parts by mass of the second component, and a difference of SP values (ΔSP) of the first component (SP1) and the second component (SP2) is within a range of 1 to 4, and a mass ratio of the first component to the second component in the composition is from 0.5:99.5 to 20:80, and phase separation occurs between the first component and the second component after the composition for forming a high refractive index antiblocking layer is applied, to form an antiblocking layer having a microscopic convexoconcave on its surface, (2) the color difference adjusting layer comprises a curing resin component (i), and metal oxide particles having an average primary particle diameter of 100 nm or less (ii) and/or metal fluoride particles having an average primary particle diameter of 100 nm or less (iii), and where the total mass of particles (ii) and (iii) in the color difference adjusting layer is 0-200 parts by mass with respect to 100 parts by mass of the curing resin component (i), and (3) a difference ΔR of R1 and R2 is not greater than 1, wherein R1 is a reflectance obtained by irradiation with a light source having a wavelength in a range of 500 to 750 nm toward the transparent electroconductive laminate, and R2 is a reflectance obtained by irradiation with a light source having a wavelength in a range of 500 to 750 nm toward a transparent electroconductive laminate after immersion into a strong acid aqueous solution at 40° C. for three minutes and dried, wherein the strong acid aqueous solution is obtained by a mixing of 12 N hydrochloric acid, 16 N nitric acid and water in a mass ratio of 12 N hydrochloric acid:16 N nitric acid:water being 3.3:1.0:7.6.

In the transparent electroconductive laminate, the curing resin component (i) in the color difference adjusting layer may preferably be an ultraviolet curing resin, and a difference ΔH of H1 and H2 may preferably be not greater than 0.3%, wherein H1 is a haze value of the transparent electroconductive laminate, and H2 is a haze value of a transparent electroconductive laminate after immersion into a strong acid aqueous solution at 40° C. for three minutes and dried, wherein the strong acid aqueous solution is obtained by a mixing of 12 N hydrochloric acid, 16 N nitric acid and water in a mass ratio of 12 N hydrochloric acid:16 N nitric acid:water being 3.3:1.0:7.6.

In the transparent electroconductive laminate, the phenolic novolac acrylate (A) may preferably be represented by the following formula (I):

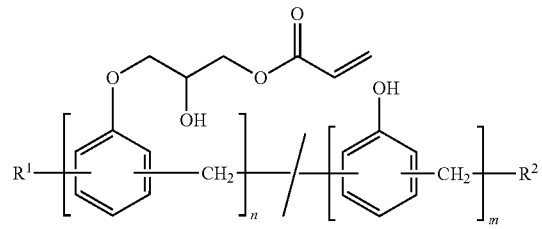

wherein $R^2$ represents H or $CH_2OH$, $R^2$ represents H or OH, n represents a number of 2 to 5 and m represents a number of 0 to 5.

In the transparent electroconductive laminate, the (meth) acrylate (B) may preferably be an aromatic group-containing (meth)acrylate having a refractive index within a range of 1.56 to 1.64.

In the transparent electroconductive laminate, a total content of ZnO, $TiO_2$, $CeO_2$, $SnO_2$, $ZrO_2$ and indium tin oxide in the high refractive index antiblocking layer may preferably be less than or equal to 0.0001% by mass.

In the transparent electroconductive laminate, the high refractive index antiblocking layer may preferably have a refractive index within a range of 1.565 to 1.620, and the high refractive index antiblocking layer may preferably have an arithmetic average roughness (Ra) of 0.001 to 0.09 μm and a ten-point average roughness (Rz) of 0.01 to 0.5 μm.

In the transparent electroconductive laminate, the high refractive index antiblocking layer may preferably have a range of 0.05 to 10 μm.

In the transparent electroconductive laminate, the transparent electrically conducting layer may preferably be a crystalline layer comprising indium oxide, and the transparent electrically conducting layer may preferably have a thickness within a range of 5 to 50 nm.

In the transparent electroconductive laminate, the transparent electroconductive laminate may preferably have a metal oxide layer between the color difference adjusting layer and the transparent electrically conducting layer, and the metal oxide layer may preferably have a thickness within a range of 0.5 to 5.0 nm.

In the transparent electroconductive laminate, the high refractive index antiblocking layer, the color difference adjusting layer, and the transparent electrically conducting layer may preferably be formed in this order on one side of the transparent polymer substrate, and an antiblocking layer may preferably be formed on the other side of the transparent polymer substrate.

In the transparent electroconductive laminate, the antiblocking layer may preferably be obtained by applying and curing a composition for forming an antiblocking layer comprising a first component and a second component, wherein the first component is an unsaturated double bond containing acrylic copolymer, and the second component comprises a polyfunctional acrylate, and a difference of SP values (ΔSP) of the first component (SP1) and the second component (SP2) is within a range of 1 to 2, and phase separation occurs between the first component and the second component after the composition for forming an antiblocking layer is applied, to form an antiblocking layer having a microscopic convexoconcave on its surface.

The present invention also provides a touch panel having the transparent electroconductive laminate.

Advantageous Effect of the Invention

The transparent electroconductive laminate according to the present invention is characterized as having an extremely high level of visibility. The high level of visibility in the transparent electroconductive laminate according to the present invention is achieved by allowing the hard coat layer possessed by the transparent electroconductive laminate to be a layer obtained by curing a specific hard coating composition and allowing the amount of particles in the color difference adjusting layer to lie within a specific range. In the production of the transparent electroconductive laminate, at the time of processing for disposing a transparent electrically conducting layer, there is a tendency that a partial load is applied to a substrate film having a hard coat layer. It follows that this partial load causes the lowering in visibility which results from the discrimination ability visually observing a part where the transparent electrically conducting layer such as ITO exists and a part where the transparent electrically conducting layer does not exist. The transparent electroconductive laminate according to the present invention is characterized as eliminating the lowering in visibility by disposing a specific hard coat layer and a color difference adjusting layer.

Moreover, in the case of disposing a specific color difference adjusting layer, the poor adhesion which has hitherto been sometimes caused is eliminated even where an auxiliary electrode for forming a touch panel electrode substrate is produced with a bulk metal film having low resistance.

In another embodiment of the present invention, the high level of visibility in the transparent electroconductive laminate is achieved by allowing the high refractive index antiblocking layer possessed by the transparent electroconductive laminate to be a layer obtained by curing a specific composition for forming an antiblocking layer and allowing the amount of particles in the color difference adjusting layer to lie within a specific range. In the production of the transparent electroconductive laminate, at the time of processing for disposing a transparent electrically conducting layer, there is a tendency that a partial load is applied to a substrate film having a high refractive index antiblocking layer. It follows that this partial load causes the lowering in visibility which results from the discrimination ability visually recognizing a part where the transparent electrically conducting layer such as ITO exists and a part where the transparent electrically conducting layer does not exist. The transparent electroconductive laminate according to the present invention is characterized as eliminating the lowering in visibility by disposing a specific high refractive index antiblocking layer and a color difference adjusting layer.

DETAILED DESCRIPTION OF THE PREFERRED EMBODIMENTS

Figure 1:
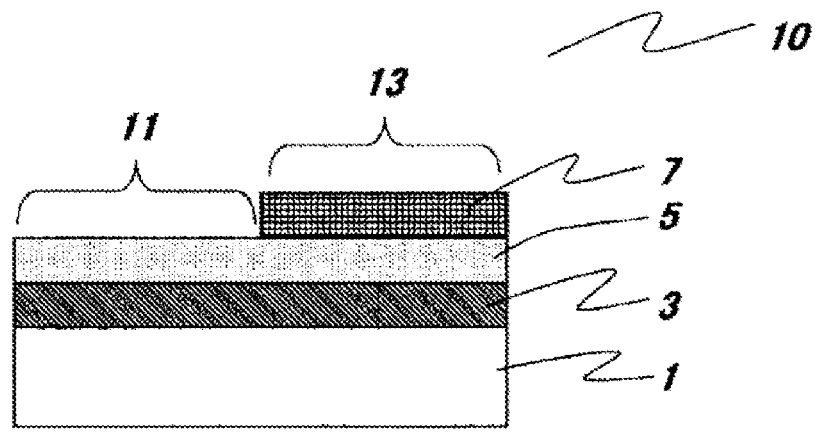
FIG. 1 is a schematic explanatory view showing a transparent electroconductive laminate subjected to an etching treatment.

The transparent electroconductive laminate according to the present invention is a transparent electroconductive laminate in which a hard coat layer, a color difference adjusting layer, and a transparent electrically conducting layer are formed in this order on at least one surface of a transparent polymer substrate. Each layers constituting the transparent electroconductive laminate according to the present invention is explained below.

Transparent Polymer Substrate

A transparent polymer substrate which can be used in the transparent electroconductive laminate according to the present invention includes a substrate which is composed of a transparent polymer, for example;

a polyester film such as a polycarbonate film, a polyethylene terephthalate film and a polyethylene naphthalate film;

a cellulose film such as a diacetylcellulose film and a triacetylcellulose film;

an acrylic film such as a polymethylmethacrylate film.

In addition, a transparent polymer substrate which can be used in the transparent electroconductive laminate according to the present invention also includes a substrate which is composed of a transparent polymer, for example;

a styrene film such as a polystyrene film and an acrylonitrile-styrene copolymer film;

an olefin film such as a polyvinyl chloride film, a polyethylene film, a polypropylene film, a polyolefin film having a cyclic or norbornene structure, an ethylene-propylene copolymer film; and an amide film such as a nylon film and an aromatic polyamide film.

A transparent polymer substrate which can be used in the transparent electroconductive laminate according to the present invention also includes a substrate which is composed of a transparent polymer, for example, a polyimide, a polysulfone, a polyether sulfone, a polyether ether ketone, a polyphenylene sulfide, a polyvinyl alcohol, a polyvinylidene chloride, a polyvinyl butyral, a polyarylate, a polyoxymethylene, an epoxy resin, and a blend polymer thereof.

In these transparent polymers, a polycarbonate or a polyethylene terephthalate may be most preferable in view of its transparency, heat resistance and versatile property.

As for an application of the transparent electroconductive laminate according to the present invention, a substrate having less optical birefringence, a substrate having controlled phase difference such as one out of four (¼) of a wavelength such as 550 nm, i.e., $\lambda/4$, or one out of two (½) of a wavelength, i.e., $\lambda/2$, or a substrate without controlled birefringence of the transparent polymer substrates can be selected in view of its use.

The selection in view of its use includes, for example, using the transparent electroconductive laminate according to the present invention with a display which expresses a function by polarization such as linearly polarization, elliptic polarization or circular polarization, specifically, for example, a polarizing plate or a phase difference film used in a liquid-crystal display, an inner-type touch panel.

A thickness of the transparent polymer substrate can be appropriately selected. The length may be 10 to 500 μm in view of its strength or handling property, preferably 20 to 300 μm, more preferably 30 to 200 μm.

Hard Coat Layer

The hard coat layer in the transparent electroconductive laminate according to the present invention is obtained by applying and curing a hard coating composition comprising (A) a phenolic novolac acrylate having two or more acrylate groups,
(B) an aromatic group-containing mono or poly (meth) acrylate having 1 or 2 mols of ah alkylene oxide structure with two or three carbon atoms in each molecule, and
an optional component of (C) a fluorene unit-containing (meth)acrylate having two or more (meth)acrylate groups. In case that the hard coating composition comprises two components, i.e., the components (A) and (B), the hard coating composition comprises 60 to 85 parts by mass of the phenolic novolac acrylate (A) and 15 to 30 parts by mass of the (meth)acrylate (B), providing that 100 parts by mass of a resin content in the hard coating composition.

In case that the hard coating composition comprises three components, i.e., the components (A), (B) and (C), the hard coating composition comprises 40 to 70 parts by mass of the phenolic novolac acrylate (A), 10 to 30 parts by mass of the (meth)acrylate (B) and 15 to 40 parts by mass of the fluorene unit-containing (meth)acrylate (C), providing that 100 parts by mass of a resin content in the hard coating composition.

(A) A Phenolic Novolac Acrylate Having Two or More Acrylate Groups

The hard coating composition contains (A) a phenolic novolac acrylate having two or more acrylate groups. The hard coating composition containing the phenolic novolac acrylate (A) can provide a high refractive index hard coat layer with transparency and excellent hardness. The technical feature can effectively prevent appearance of interference fringes.

The phenolic novolac acrylate (A) may preferably be represented by the following formula (I):

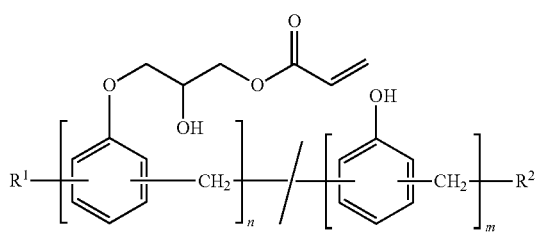

wherein $R^1$ represents H or $CH_2OH$, $R^2$ represents H or OH, n represents a number of 2 to 5 and m represents a number of 0 to 5.

In the following formula (I), n may preferably represent a number of 2 to 4 and m may preferably represent a number of 0 to 3, more preferably n may represent a number of 2 to 4 and m may represent a number of 0 to 1.

The phenolic novolac acrylate (A) may preferably have a weight average molecular weight of 400 to 2500, more preferably 450 to 2000. The phenolic novolac acrylate (A) may preferably have a hydroxyl value of 100 to 180 mgKOH/g, more preferably 120 to 160 mgKOH/g.

In this specification, weight average molecular weights of various components can be measured by gel permeation chromatography (GPC). In a measurement of weight average molecular weights, a high performance gel permeation chromatography apparatus such as HLC-8220GPC (manufactured by Tosoh Corporation) can be used. A concrete measurement condition of weight average molecular weights in use of HLC-8220GPC (manufactured by Tosoh Corporation) is, for example, measuring a test sample (2 g), drying the test sample in a vacuum dryer at 40° C. for 2 hours to remove a water, diluting the sample by THF solution in a concentration of 0.2%, then measuring under the following conditions: column injection amount of 10 μl, flow late of 0.35 ml/min.

The hard coating composition comprises 60 to 85 parts by mass of the phenolic novolac acrylate (A) providing that 100 parts by mass of a resin content in the hard coating composition.

When an amount of the phenolic novolac acrylate (A) is less than 60 parts by mass or an amount of the phenolic novolac acrylate (A) is more than 85 parts by mass, a hardness of the resulting hard coat layer is lowered, respectively.

(B) An Aromatic Group-Containing Mono or Poly (Meth) Acrylate Having 1 or 2 Mols of an Alkylene Oxide Structure with Two or Three Carbon Atoms in Each Molecule The hard coating composition contains (B) an aromatic group-containing mono or poly (meth)acrylate having 1 or 2 mols of an alkylene oxide structure with two or three carbon atoms in each molecule. The (meth)acrylate (B) may preferably have a viscosity of less than 300 mPa·s and a refractive index within a range of 1.56 to 1.64.

In the (meth)acrylate of the component (B), the presence of 1 or 2 mols of an alkylene oxide structure in each molecular in which the alkylene oxide structure has two or three carbon atoms enables the design of a viscosity of the component (B) of less than 300 mPa·s.

In addition, the presence of 1 or 2 mols of an alkylene oxide structure in each molecular in which the alkylene oxide structure has two or three carbon atoms of the (meth)acrylate component (B) can provide improved stretchability of the resulting hard coat layer.

The alkylene oxide structure having two or three carbon atoms includes an ethylene oxide structure and a propylene oxide structure.

The (meth)acrylate of the component (B) also has a technical feature of having an aromatic group(s).

The presence of the aromatic group(s) in the (meth)acrylate of the component (B) can provide a high refractive index, for example, within a range of 1.56 to 1.64.

An aromatic group-containing (meth)acrylate which can be preferably used as the component (B) includes, for example, a (meth)acrylate having 1 or 2 mols of an alkylene oxide structure in each molecular in which the alkylene oxide structure has two or three carbon atoms, such as alkylene oxylated phenol (meth)acrylate, alkylene oxylated orthophenylphenol (meth)acrylate, alkylene oxylated meta-phenylphenol (meth)acrylate, alkylene oxylated paraphenylphenol (meth)acrylate, alkylene oxylated cumylphenylphenol (meth)acrylate and the like. In the above compounds, a (meth)acrylate having two aromatic groups may preferably be used due to its high refractive index.

An refractive index of the component (B) can be measured by an Abbe's refractometer in conformity with JIS (Japanese Industrial Standard) K0062.

The component (B) may preferably have a viscosity of less than 300 mPa·s. When the viscosity is not less than 300 mPa·s, the composition's hardening reactivity may be deteriorated and a hardness of the resulting hard coat layer may be lowered. The component (B) may more preferably have a viscosity of 1 to 300 mPa·s, most preferably 1 to 200 mPa·s.

A viscosity of the component (B) can be measured by a B-type viscometer (TVB-22L, manufactured by Toki Sangyo co., ltd.). A B-type viscometer includes, for example, TVB-22L manufactured by Toki Sangyo co., ltd.

The (meth)acrylate (B) may preferably have a weight average molecular weight within a range of 150 to 600, more preferably 200 to 400.

In the present invention, the hard coating composition comprises 15 to 30 parts by mass of the component (B) providing that 100 parts by mass of a resin content in the hard coating composition. The presence of the component (B) within the above mass amount in the coating composition provides advantages such as excellent hardness and a high refractive index of the resulting hard coat layer. When an amount of the component (B) is less than 15 parts by mass or an amount of the component (B) is more than 30 parts by mass, a hardness of the resulting hard coat layer is lowered, respectively.

(C) A Fluorene Unit-Containing (Meth)Acrylate Having Two or More (Meth)Acrylate Groups An embodiment of the hard coating composition includes an embodiment of further containing (C) a fluorene unit-containing (meth)acrylate having two or more (meth)acrylate groups, in addition to the above components (A) and (B). Using the fluorene unit-containing (meth)acrylate (C) has advantages such as enabling the design of a higher refractive index in the resulting hard coat layer, because the fluorene unit-containing (meth)acrylate (C) has a high refractive index.

A preferable example of the fluorene unit-containing (meth)acrylate (C) may include an acrylic monomer which is represented by the following formula (II):

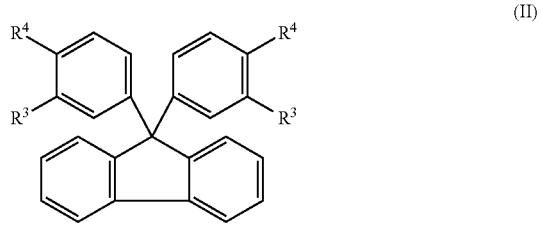

(II)

wherein each of $R^3$ independently represents H or $CH_3$, $R^4$ represents -A-OC(O)CR=$CH_2$, wherein A independently represents —$OCH_2CH_2$—, —$OCH_2CH_2CH_2$—, —OCH($CH_3$)$CH_2$— or —$OCH_2CH(CH_3)$— and R independently represents H or $CH_3$.

A more preferable example of the fluorene unit-containing (meth)acrylate (C) may include an acrylic monomer which is represented by the following formula (II)-1:

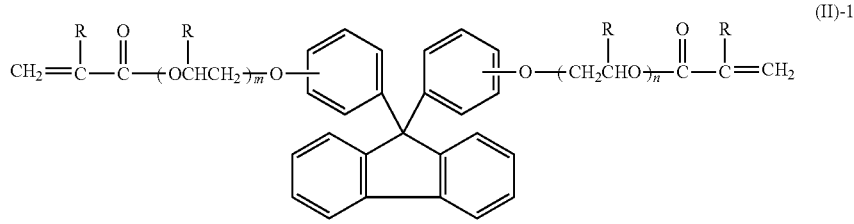

(II)-1 wherein each of R independently represents H or $CH_3$, and each of m and n independently represents a number of 1 to 5.

Commercially available products may be used as the fluorene unit-containing (meth)acrylate (C). A commercially available fluorene unit-containing (meth)acrylate (C) includes, for example, NK ester series available from Shin-Nakamura Chemical Co., Ltd., Ogsol EA series available from Osaka Gas Chemicals Co., Ltd.

A commercially available product which is represented by the above formula (II)-1 includes, for example, Ogsol EA-0200 (each of R represents H, and m+n=2), Ogsol EA-0500 (each of R represents H, and m+n=5), Ogsol EA-1000 (each of R represents H, and m+n=10), Ogsol EA-F5003 (each of R represents H, a low-viscosity product) and Ogsol EA-F5503 (each of R represents H, a low-viscosity product).

When the hard coating composition contains the fluorene unit-containing (meth)acrylate (C), the hard coating composition comprises 40 to 70 parts by mass of the phenolic novolac acrylate (A), 10 to 30 parts by mass of the (meth)acrylate (B) and 15 to 40 parts by mass of the fluorene unit-containing (meth)acrylate (C), providing that 100 parts by mass of a resin content in the hard coating composition.

When the hard coating composition contains the fluorene unit-containing (meth)acrylate (C), it should be necessary that the hard coating composition comprises 40 to 70 parts by mass of the phenolic novolac acrylate (A), providing that 100 parts by mass of a resin content in the hard coating composition. When an amount of the phenolic novolac acrylate (A) is less than 40 parts by mass or an amount of the phenolic novolac acrylate (A) is more than 70 parts by mass, a hardness of the resulting hard coat layer is lowered, respectively.

When the hard coating composition contains the fluorene unit-containing (meth)acrylate (C), it should be necessary that the hard coating composition comprises 10 to 30 parts by mass of the (meth)acrylate (B), providing that 100 parts by mass of a resin content in the hard coating composition. The presence of the component (B) within the above mass amount in the coating composition provides advantages such as excellent hardness and a high refractive index of the resulting hard coat layer. When an amount of the (meth)acrylate (B) is less than 10 parts by mass or an amount of the (meth)acrylate (B) is more than 30 parts by mass, a hardness of the resulting hard coat layer is lowered, respectively.

When the hard coating composition contains the fluorene unit-containing (meth)acrylate (C), it should be necessary that the hard coating composition comprises 15 to 40 parts by mass of the fluorene unit-containing (meth)acrylate (C), providing that 100 parts by mass of a resin content in the hard coating composition. When an amount of the fluorene unit-containing (meth)acrylate (C) is more than 40 parts by mass, a hardness of the resulting hard coat layer may be lowered.

Another (Meth)Acrylate

A hard coating composition may contain another (meth)acrylate in addition to the components (A) and (B), and optional component (C). Such an another (meth)acrylate includes, for example, polyfunctional (meth)acrylate monomer and/or polyfunctional (meth)acrylate oligomer. The polyfunctional (meth)acrylate monomer and/or polyfunctional (meth)acrylate oligomer can cause a cure reaction due to a (meth)acryloyl group reaction, with an exposure to active energy rays after applying the hard coating composition. The cure reaction can provide a hard coat layer with excellent hardness, in which may be advantageous.

The polyfunctional (meth)acrylate monomer and/or polyfunctional (meth)acrylate oligomer may preferably have monomer and/or oligomer having three or more (meth)acryloyl groups. Having three or more (meth)acryloyl groups can provide a hard coat layer having excellent hardness with an exposure to active energy rays, in which may be advantageous.

The polyfunctional (meth)acrylate monomer and/or polyfunctional (meth)acrylate oligomer includes, for example, hydroxypropylated trimethylolpropane triacrylate, isocyanuric acid ethylene oxide modified diacrylate, pentaerythritol triacrylate, dipentaerythritol pentaacrylate, trimethylolpropane triacrylate, tris(acryloxyethyl) isocyanurate, ditrimethylolpropane tetraacrylate, pentaerythritol tetraacrylate, dipentaerythritol hexaacrylate and oligomers thereof. The monomer and/or oligomer may be used with alone or a combination of two or more.

When the hard coating composition contains the monomer and/or oligomer, the hard coating composition may preferably contain 1 to 30 parts by mass of the monomer and/or oligomer, more preferably 1 to 25 parts by mass, providing that 100 parts by mass of a resin content in the hard coating composition.

Polymerization Initiator and the Like

The hard coating composition according to the present invention may preferably contain a polymerization initiator. Containing a polymerization initiator may provide an excellent polymerization of resin components with an exposure to active energy rays such as ultraviolet rays. The polymerization initiator includes, for example, alkyl phenon type photopolymerization initiator, acyl phosphine oxide type photopolymerization initiator, titanocene type photopolymerization initiator, oxime ester type photopolymerization initiator, and the like. An alkyl phenon type photopolymerization initiator includes, for example, 2,2-dimethoxy-1,2-diphenylethane-1-one, 1-hydroxy cyclohexyl phenyl ketone, 2-hydroxy-2-methyl-1-phenyl propane-1-one, 1-[4-(2-hydroxyethoxy)-phenyl]-2-hydroxy-2-methyl-1-propane-1-one, 2-hydroxy-1-{4-[4-(2-hydroxy-2-methyl propionyl)benzyl]phenyl}-2-methyl propan-1-one, 2-methyl-1-(4-methylthiophenyl)-2-morpholinopropan-1-one, 2-benzyl-2-dimethylamino-1-(4-morpholinophenyl)-butanone-1,2-(dimethylamino)-2-[(4-methylphenyl)methyl]-1-[4-(4-morpholinyl)phenyl]-1-butanone and the like. An acyl phosphine oxide type photopolymerization initiator includes, for example, 2,4,6-trimethyl benzoyl diphenyl phosphine oxide, bis(2,4,6-trimethyl benzoyl) phenyl phosphine oxide and the like. A titanocene type photopolymerization initiator includes, for example, bis(η5-2,4-cyclopentadiene-1-yl)-bis(2,6-difluoro-3-(1H-pyrrol-1-yl)phenyl)titanium and the like. An oxime ester type photopolymerization initiator includes, for example, 1,2-octanedione, 1-[4-(phenylthio)-, 2-(O-benzoyloxime)], ethanone, 1-[9-ethyl-6-(2-methyl benzoyl)-9H-carbazole-3-yl]-, 1-(O-acetyl oxime), oxyphenylacetic acid, 2-[2-oxo-2-phenyl acetoxy ethoxy]ethyl ester, 2-(2-hydroxy ethoxy) ethyl ester and the like. These photopolymerization initiator may be used with alone or a combination of two or more.

In the above photopolymerization initiators, 2-hydroxy-2-methyl-1-phenyl propan-1-one, 1-hydroxy cyclohexyl phenyl ketone, 2-methyl-1-(4-methylthiophenyl)-2-morpholinopropan-1-one, 2-benzyl-2-dimethylamino-1-(4-morpholinophenyl) butanone-1,2,2-dimethoxy-1,2-diphenyl ethan-1-one and the like may be preferably used.

A preferable amount of the photopolymerization initiator may be 0.01 to 20 parts by mass, more preferably 1 to 10 parts by mass, providing that 100 parts by mass of the components (A) and (B), and optional component (C) and another monomer and/or oligomer (a total of all these components is called "resin components").

The hard coating composition used in the present invention may contain a solvent. A solvent is not limited and may be appropriately selected with consideration of the components of the hard coating composition, a type of a substrate to be applied, means for application and the like. A solvent includes, for example, aromatic solvents such as toluene, xylene; ketone solvents such as methyl ethyl ketone, acetone, methyl isobutyl ketone, cyclohexanone; ether solvents such as diethyl ether, isopropyl ether, tetrahydrofuran, dioxane, ethyleneglycol dimethyl ether, ethyleneglycol diethyl ether, diethyleneglycol dimethyl ether, diethyleneglycol diethyl ether, propyleneglycol monomethyl ether, anisole, phenetole; ester solvents such as ethyl acetate, butyl acetate, acetic acid isopropyl, ethylene glycol diacetate; amide solvents such as dimethylformamide, diethylformamide, N-methylpyrrolidon; cellosolve solvents such as methylcellosolve, ethylcellosolve, butyl cellosolve; alcohol solvents such as methanol, ethanol, propanol; halogen solvents such as dichloromethane, chloroform; and the like. The solvent may be used with alone or a combination of two or more. In the above solvents, ester solvents, ether solvents, alcohol solvent and ketone solvent may preferably be used.

The hard coating composition may optionally contain an additive. The additive includes conventional additives such as an antistatic agent, a plasticizer, a surfactant, an antioxidant and the like.

The hard coating composition has a technical feature that the hard coating composition can provide a hard coat layer with an high refractive index even if the hard coating composition does not contain a high refractive index material of metal oxide such as ZnO, TiO$_2$, CeO$_2$, SnO$_2$, ZrO$_2$ and indium tin oxide. Therefore, the hard coating composition may preferably contain no metal oxide high refractive index materials selected from the group consisting of ZnO, TiO$_2$, CeO$_2$, SnO$_2$, ZrO$_2$ and indium tin oxide. For more details, a total content of ZnO, TiO$_2$, CeO$_2$, SnO$_2$, ZrO$_2$ and indium tin oxide in the hard coating composition may preferably be less than or equal to 0.0001% by mass. When the high refractive index materials such as a metal oxide are included in a hard coat layer, the hard coat layer generally has inferior stretchability and bending resistance compared with a hard coat layer without the high refractive index materials.

The hard coat layer formed by applying the hard coating composition has a technical feature of a high refractive index within a range of 1.565 to 1.620, as well as excellent hardness of the hard coat layer.

Thanks to the high refractive index of the hard coat layer, it is advantageous that the transparent electroconductive laminate has prevention of the appearance of interference fringes.

The hard coat layer obtained by applying the hard coating composition has a technical characteristic of having excellent stretchability, as well as excellent visibility and excellent hardness which is required in the field of a hard coat layer.

The excellent stretchability can provide remarkably-improved visibility of the transparent electroconductive laminate and is advantageous.

In a processing for applying a transparent electrically conducting layer, a substrate film having a hard coat layer tends to be exposed a partial load.

The partial load may cause a swell or a kink of a film which results from a difference of thermal shrinkage and/or thermal expansion among a hard coat layer and a substrate film.

The swell or the kink of a film provides deterioration of visibility due to visually distinguish about presence or absence of a transparent electrically conductive layer such as ITO. The deterioration of visibility distinctly deteriorates visibility of a touch panel.

The hard coat layer obtained by applying the hard coating composition has a technical characteristic of having stretchability, as well as excellent visibility and excellent hardness which is required in the field of a hard coat layer.

Even if a substrate film is exposed a partial thermal load such as heating at a stage of applying a transparent electrically conductive layer and obtains a partial thermal expansion, the hard coat film has advantages such as decreased kink because of excellent stretchability of the hard coat layer and accompanying followings of the hard coat layer.

Therefore, it is advantageous that deterioration of visibility due to visually distinguish about presence or absence of a transparent electrically conductive layer such as ITO is solved.

Color Difference Adjusting Layer

The transparent electroconductive laminate according to the present invention has a color difference adjusting layer on a hard coat layer. That is, the color difference adjusting layer is a layer existing between the hard coat layer and a transparent electrically conducting layer. The color difference adjusting layer may be a single layer or may be a layer composed of two or more layers. The color difference adjusting layer is a layer for improving the adhesion between layers and the optical properties (the transmittance, the color tone and the like) of the transparent electroconductive laminate.

In the present invention, the color difference adjusting layer is a layer containing a curing resin component (i), and metal oxide particles having an average primary particle diameter of 100 nm or less (ii) and/or metal fluoride particles having an average primary particle diameter of 100 nm or less (iii). In this context, provided that the total mass of the particles (ii) and (iii) in the color difference adjusting layer lies within the range of 0 to 200 parts by mass with respect to 100 parts by mass of the curing resin component (i).

As the curing resin component (i), an ultraviolet curing resin or a thermosetting resin can be used. With regard to the color difference adjusting layer in the present invention, it is more preferred that an ultraviolet curing resin be used as the curing resin component (i).

The ultraviolet curing resin can be obtained from a composition containing a monomer having ultraviolet curing performance. Examples of the monomer having ultraviolet curing performance include monofunctional and polyfunctional acrylates such as a polyol acrylate, a polyester acrylate, a urethane acrylate, an epoxy acrylate, a modified styrene acrylate, a melamine acrylate and a silicon-containing acrylate.

Specific examples of the monomer include trimethylolpropane trimethacrylate, a trimethylolpropane ethylene oxide-modified acrylate, a trimethylolpropane propylene oxide-modified acrylate, an isocyanuric acid alkylene oxide-modified acrylate, pentaerythritol triacrylate, dipentaerythritol hexaacrylate, dimethylol tricyclodecane diacrylate, tripropylene glycol triacrylate, diethylene glycol diacrylate, 1,6-hexanediol diacrylate, an epoxy-modified acrylate, a urethane-modified acrylate such as a urethane (meth)acrylate, and a polyfunctional monomer such as an epoxy-modified acrylate. These monomers may be used alone or two or more thereof may be used together.

Of these monomers having ultraviolet curing performance, a urethane-modified acrylate is preferred. As the urethane-modified acrylate, a commercial product thereof can be used, and for example, products in the SHIKOH series available from The Nippon Synthetic Chemical Industry Co., Ltd. such as UV1700B, UV6300B, UV765B, UV7640B and UV7600B; products in the Art Resin series available from Negami Chemical Industrial Co., Ltd. such as Art Resin HDP, Art Resin UN9000H, Art Resin UN3320HA, Art Resin UN3320HB, Art Resin UN3320HC, Art Resin UN3320HS, Art Resin UN901M, Art Resin UN902MS and Art Resin UN903; UA100H, U4H, U6H, U15HA, UA32P, U6LPA, U324A, U9HAMI and the like available from Shin Nakamura Chemical Co., Ltd.; products in the Ebecryl series available from Daicel-UCB Co. Ltd. such as 1290, 5129, 254, 264, 265, 1259, 1264, 4866, 9260, 8210, 204, 205, 6602, 220 and 4450; products in the BEAMSET series available from ARAKAWA CHEMICAL INDUSTRIES, LTD. such as 371, 371MLV, 371S, 577, 577BV and 577AK; products in the RQ series available from MITSUBISHI RAYON CO., LTD.; products in the UNIDIC series available from DIC Corporation; DPHA40H (available from Nippon Kayaku Co., Ltd.), CN9006 and CN968 (available from SARTOMER company), and the like can be used.

Curing resin component (i) A (meth)acrylate having two or more acrylate groups, a molecular weight of 1400 to 1800, and a hydroxyl value of 60 to 80 mgKOH/g It is preferred that a curable resin in the color difference adjusting layer have two or more acrylate groups, a molecular weight of 1400 to 1800, and a hydroxyl value of 60 to 80 mgKOH/g.

Since the acrylate equivalent is maintained so as not to exceed 900 when the molecular weight of the curing resin component (i) is 1400 to 1800 and the curing resin component (i) has two or more acrylate groups, the resulting degree of crosslinking density is not adjusted to an extremely high value, and moreover the hydroxyl value, which is 60 to 100 mgKOH/g, is not adjusted to an extremely high value. Accordingly, it is possible to prevent degradation of the color difference adjusting layer at the time of subjecting an electroconductive laminate to an etching treatment and to prevent lowering in visibility caused by the degradation of the color difference adjusting layer.

Since the hydroxyl value of the curing resin component (i) is 60 to 100 mgKOH/g and hydroxyl groups possessed by each of the hard coat layer and the color difference adjusting layer form hydrogen bonds, it is possible to eliminate the poor adhesion at the time of laminating the color difference adjusting layer on the hard coat layer.

Since the hydroxyl value of the curing resin component (i) is 60 to 100 mgKOH/g and a hydroxyl group possessed by the metal oxide layer on which a transparent electrically conducting layer is formed and a hydroxyl group possessed by the color difference adjusting layer form hydrogen bonds, it is possible to eliminate the poor adhesion at the time of laminating the transparent electrically conducting layer on the color difference adjusting layer.

Moreover, it is preferred that the maximum breaking elongation at the time of curing the curing resin component (i) so as to have a thickness of 100 µm be 100% or more. When the maximum breaking elongation at the time of being cured so as to have a thickness of 100 µm is 100% or more, it is possible to eliminate the poor adhesion at the time of laminating the color difference adjusting layer on the hard coat layer since the color difference adjusting layer exhibits sufficient followability against a change in volume of the hard coat layer at the time of laminating the color difference adjusting layer on the hard coat layer. And moreover, it is possible to eliminate the poor adhesion at the time of laminating the transparent electrically conducting layer on the color difference adjusting layer since the color difference adjusting layer exhibits sufficient followability against a change in volume of the transparent electrically conducting layer at the time of laminating the transparent electrically conducting layer on the color difference adjusting layer. On the other hand, in order to maintain the resistance against the pattern etching treatment of the electroconductive laminate, it is preferred that the maximum breaking elongation be 150% or less since it is necessary to enhance the crosslinking density. Thus, the maximum breaking elongation at the time of being cured so as to have a thickness of 100 µm is preferably 100 to 150%, more preferably 110 to 140%.

In this connection, the measurement of the maximum breaking elongation at the time of curing the curing resin component (i) by ultraviolet rays so as to have a thickness of 100 µm is performed in accordance with JIS-C-2151. Specifically, a sample is pulled at a rate of 200 mm/minute using a tensile testing machine, and the rate of elongation at the time when the sample is torn apart (broken) is determined.

Moreover, with regard to a test specimen used for the measurement, a test specimen is prepared by coating a solution obtained by adding 5 parts by mass of Irgacure 184D and 70 parts by mass of methylisobutyl ketone to 100 parts by mass of the curing resin component (i) on a Teflon sheet so that the coating film thickness becomes 166 µm with an applicator, drying the coating film at 80° C. for 10 minutes, irradiating the coating film with ultraviolet rays of 3 J using a high pressure mercury lamp to cure the coating film, and peeling off a film from the Teflon sheet.

As mentioned above, it is preferred that the hydroxyl value of the curing resin component (i) be high in order to enhance the adhesion to the hard coat layer and the transparent electrically conducting layer. On the other hand, it is preferred that the hydroxyl value be low in order to maintain the resistance against the pattern etching treatment of the electroconductive laminate. Thus, the hydroxyl value is preferably 60 to 100 mgKOH/g, and it is more preferred that the hydroxyl value lie within the range of 70 to 90 mgKOH/g.

With regard to the number of acrylate groups and the molecular weight of the curing resin component (i), it is preferred that the number of acrylate groups be small and the molecular weight be high in order to maintain the flexibility for enhancing the adhesion to the hard coat layer and the transparent electrically conducting layer. On the other hand, it is preferred that the number of acrylate groups be large and the molecular weight be low in order to maintain the resistance against the pattern etching treatment of the electroconductive laminate since it is necessary to enhance the crosslinking density. Thus, the number of acrylate groups is preferably 2 or more, more preferably 2 to 4. Moreover, the molecular weight is preferably 1400 to 1800, more preferably 1500 to 1700.

The curing resin component (i) can be obtained by allowing a hydroxy group-containing acrylate such as 2-hydroxyethyl acrylate, 2-hydroxypropyl acrylate, 2-hydroxybutyl acrylate, 4-hydroxybutyl acrylate and phenoxyhydroxypropyl acrylate, a lactone-modified product of the above-mentioned compound and an alkylene oxide-modified product with ethylene oxide, propylene oxide or the like to react with an acid anhydride such as phthalic anhydride, maleic anhydride, succinic anhydride, hexahydrophthalic anhydride, dodecenyl succinic anhydride and dodecenyl phthalic anhydride, and furthermore, adding the reactant to an epoxy resin such as a bisphenol A type epoxy resin, a bisphenol S type epoxy resin, a bisphenol F type epoxy resin, a phenol novolak type epoxy resin, a cresol novolak type epoxy resin and 3,4-epoxy-6-methylcyclohexylmethyl-3,4-epoxy-cyclohexanecarboxylate.

In the case where the curing resin component (i) is an ultraviolet curing resin, it is preferred that a composition forming the color difference adjusting layer contain a photopolymerization initiator. As the photopolymerization initiator, for example, a photopolymerization initiator commonly used such as acetophenone, benzophenone, benzoin, benzoylbenzoate and thioxanthone can be used.

The composition forming the color difference adjusting layer may further contain a photosensitizer. As the photosensitizer, for example, a photosensitizer commonly used such as triethylamine and tri-n-butylphosphine can be used.

The composition forming the color difference adjusting layer may further contain hydrolysates of various alkoxysilanes.

In the case where the curing resin component (i) is a thermosetting resin, the composition forming the color difference adjusting layer may contain a thermosetting monomer such as an organosilane-based thermosetting monomer in which a silane compound such as methyltriethoxysilane or phenyltriethoxysilane constitutes a monomer, a melamine-based thermosetting monomer in which an etherified methylolmelamine or the like constitutes a monomer, an isocyanate-based thermosetting monomer, a phenol-based thermosetting monomer and an epoxy-based thermosetting monomer. These thermosetting monomers may be used alone or two or more thereof may be used in combination. In addition to the above-mentioned thermosetting monomer, the composition may contain a thermoplastic resin component as necessary.

In the case where the curing resin component (i) is a thermosetting resin, it is preferred that the composition forming the color difference adjusting layer contain a reaction accelerator or a curing agent. Examples of the reaction accelerator include triethylenediamine, dibutyltin dilaurate, benzyl methylamine, pyridine and the like. Examples of the curing agent include methylhexahydrophthalic anhydride, 4,4'-diaminodiphenylmethane, 4,4'-diamino-3,3'-diethyldiphenylmethane, diaminodiphenylsulfone and the like.

In the present invention, in addition to the above-mentioned curing resin component (i), metal oxide particles having an average primary particle diameter of 100 nm or less (ii) and/or metal fluoride particles having an average primary particle diameter of 100 nm or less (iii) are contained in the color difference adjusting layer. Then, provided that the total mass of these particles (ii) and (iii) lies within the range of 0 to 200 parts by mass with respect to 100 parts by mass of the curing resin component (i). The total mass of the particles (ii) and (iii) can be appropriately adjusted depending on the refractive index of each of (i), (ii) and (iii) in order to attain desired optical properties. From the viewpoint of film strength after curing, it is preferred that the total mass lie within the range of 0 to 150 parts by mass, and it is more preferred that the total mass lie within the range of 0 to 100 parts by mass, with respect to 100 parts by mass of the curing resin component (i).

In the case where the total mass of the particles (ii) and (iii) in the color difference adjusting layer exceeds 200 parts by mass, there occurs a defect that the adhesion between layers is deteriorated.

Specific examples of the metal oxide particles (ii) include ZnO, $TiO_2$, $CeO_2$, $SnO_2$, $ZrO_2$, an indium-tin oxide and the like. Any of these metal oxide particles (ii) are characterized as having a high refractive index. On that account, a color difference adjusting layer in which the metal oxide particles (ii) are contained basically becomes a high refractive index layer. As the metal oxide particle (ii), ZnO, $TiO_2$ and $ZrO_2$ are more preferably used. The metal oxide particles (ii) may be used alone or two or more thereof may be used together.

In this connection, as described above, provided that any of these metal oxide particles (ii) have an average primary particle diameter of 100 nm or less. In the case where the average primary particle diameter exceeds 100 nm, there occurs a defect that the haze value rises, drawbacks in appearance such as the formation of a lump of foreign materials are caused or the like since the particles of a visible size are easily formed due to aggregation of particles and the like at the time of forming the color difference adjusting layer. In the present specification, the average primary particle diameter refers to a 50% volume particle diameter at the time of measuring a liquid prepared by dispersing particles in a solvent such as n-BuOH with a particle size analyzer.

Specific examples of a metal constituting the metal fluoride particles (iii) include calcium, barium, magnesium, strontium and the like. Of these metals, it is more preferred that the metal be magnesium. These metal fluoride particles (iii) may be used alone or two or more thereof may be used together. In this connection, as necessary, the metal fluoride particles (iii) and $SiO_2$ may be used in combination.

Any of these metal fluoride particles (iii) are characterized as having a low refractive index. On that account, a color difference adjusting layer in which the metal fluoride particles (iii) are contained basically becomes a low refractive index layer. In this connection, as described above, provided that any of these metal fluoride particles (iii) have an average primary particle diameter of 100 nm or less. In the case where the average primary particle diameter exceeds 100 nm, there occurs a defect that the haze value rises, drawbacks in appearance such as the formation of a lump of foreign materials are caused or the like since the particles of a visible size are easily formed due to aggregation of particles and the like at the time of forming the color difference adjusting layer.

The color difference adjusting layer in the present invention may be composed of a single layer or may be composed of two or more layers. In the case where the color difference adjusting layer is a single layer, it is preferred that the layer be a high refractive index layer containing the metal oxide particles (ii). Examples of another aspect thereof include an aspect containing both the metal oxide particles (ii) and the metal fluoride particles (iii) mentioned above. The thickness of the color difference adjusting layer in the case where the color difference adjusting layer is a single layer is preferably 30 to 300 nm, more preferably 50 nm to 200 nm.

Moreover, for example, in the case where the color difference adjusting layer is a layer composed of two layers, it is preferred that the layer have a two-layered structure composed of a high refractive index layer containing the metal oxide particles (ii) and a low refractive index layer containing the metal fluoride particles (iii). In this case, it is more preferred to be an aspect in which a hard coat layer and the high refractive index layer are brought into contact with each other. In the case where the color difference adjusting layer is constituted of two layers composed of one layer of a high refractive index layer and one layer of a low refractive index layer, the thickness of the whole color difference adjusting layer is preferably 30 to 300 nm, more preferably 50 nm to 200 nm.

With regard to the formation of the color difference adjusting layer, for example, the layer can be formed by applying a composition containing a monomer having ultraviolet curing performance and the metal oxide particles (ii) and/or the metal fluoride particles (iii) on a hard coat layer of a transparent polymer substrate having the hard coat layer, and then, irradiating the composition with active energy rays such as ultraviolet rays to cure the composition. Alternatively, the layer can be formed by applying a composition containing a thermosetting monomer and the metal oxide particles (ii) and/or the metal fluoride particles (iii) on a hard coat layer of a transparent polymer substrate having the hard coat layer, and then, thermally curing the composition.

As an example of the case where the color difference adjusting layer is a layer composed of two layers, a color difference adjusting layer composed of two layers can be formed by firstly applying a composition containing the metal oxide particles (ii) on a hard coat layer and curing the composition, and then, applying a composition containing the metal fluoride particles (iii) and curing the composition.

As another example of the case where the color difference adjusting layer is a layer composed of two layers, a color difference adjusting layer composed of two layers can be formed by firstly applying a composition containing the metal fluoride particles (iii) on a hard coat layer and curing the composition, and then, applying a composition containing the metal oxide particles (ii) and curing the composition.

Examples of a method for applying the composition include an applying method using a coating machine such as a doctor knife, a bar coater, a gravure roll coater, a curtain coater, a knife coater or a spin coater which is usually performed by a person skilled in the art, an applying method using a spray, an applying method by immersion and the like.

Moreover, the composition may contain an organic solvent as necessary. Examples of the organic solvent include alcohol-based solvents such as ethanol, isopropyl alcohol, butanol and 1-methoxy-2-propanol, hydrocarbon-based solvents such as hexane, cyclohexane, ligroin and cyclohexanone, ketone-based solvents such as methyl isobutyl ketone and isobutyl acetate, aromatic hydrocarbon-based solvents such as xylene and toluene, and the like. These organic solvents may be used alone or two or more thereof may be used together.

In the case of curing a composition containing a monomer having ultraviolet curing performance, the curing can be performed by using a light source emitting active energy rays of a required wavelength and irradiating the composition with the active energy rays. As the active energy ray to be irradiated, for example, light of 0.1 to 1.5 $J/cm^2$ in terms of an exposure quantity, preferably light of 0.3 to 1.5 $J/cm^2$, can be used. Moreover, although the wavelength of the irradiation light is not particularly limited, for example, irradiation light having a wavelength of 360 nm or less and the like can be used. Such light can be obtained by using a high pressure mercury lamp, an ultra-high pressure mercury lamp or the like.

Moreover, in the case of curing a composition containing a thermosetting monomer, for example, the composition can be cured by heating at 60 to 140° C. for 1 to 60 minutes. In this context, the heating temperature and the heating time can be selected according to the kind of the thermosetting monomer contained in the composition.

Metal Oxide Layer

With regard to the transparent electroconductive laminate according to the present invention, a metal oxide layer may be formed between the color difference adjusting layer and the transparent electrically conducting layer as necessary. Examples of a component constituting the metal oxide layer include metal oxides such as silicon oxide, aluminum oxide, titanium oxide, magnesium oxide, zinc oxide, indium oxide and tin oxide. Examples of the metal oxide layer include a metal oxide layer with a thickness of 0.5 to 5.0 nm.

By disposing a metal oxide layer between the color difference adjusting layer and the transparent electrically conducting layer, it is possible to improve the adhesion between each layer. Moreover, by allowing a metal oxide layer to exist, there is also an advantage that the performance such as durability of the laminate is enhanced.

The metal oxide layer can be formed by a known method. As the method for forming a metal oxide layer, a physical vapor deposition method (hereinafter referred to as "a PVD method") such as a DC magnetron sputtering method, an RF magnetron sputtering method, an ion plating method, a vacuum vapor deposition method or a pulse laser deposition method can be used. Of these methods, a DC magnetron sputtering method, which is a method capable of forming a metal oxide layer with a uniform thickness and excellent in industrial productivity, is especially preferred. In this connection, in addition to the physical vapor deposition method (PVD method), a chemical vapor deposition method (hereinafter referred to as "a CVD method") such as a sol-gel method can also be used.

It is preferred that a target used in the sputtering method be a metal target. Moreover, as the sputtering method, a reactive sputtering method is widely used. This is because it is difficult to use a DC magnetron sputtering method in the case of a metal oxide target since the oxide of an element used as the metal oxide layer is often an insulator. In this connection, a pseudo RF magnetron sputtering method in which the formation of an insulator to a target is suppressed by executing the simultaneous discharge of two cathodes, and the like can also be used.

Transparent Electrically Conducting Layer and Transparent Electroconductive Laminate With regard to the transparent electroconductive laminate according to the present invention, a transparent electrically conducting layer is formed on the color difference adjusting layer or the metal oxide layer. Although no particular restriction is put on the constituent material for the transparent electrically conducting layer, examples thereof include a metal layer and a metal compound layer. Examples of a component constituting the transparent electrically conducting layer include a layer of a metal oxide such as silicon oxide, aluminum oxide, titanium oxide, magnesium oxide, zinc oxide, indium oxide and tin oxide. Of these, a crystalline layer composed mainly of indium oxide is preferred, and in particular, a layer composed of crystalline ITO (Indium Tin Oxide) is preferably used.

Moreover, in the case where the transparent electrically conducting layer is composed of crystalline ITO, although it is not particularly necessary to provide an upper limit to the crystal grain size, it is preferred that the crystal grain size be 500 nm or less. When the crystal grain size exceeds 500 nm, it is not preferred because the bending durability deteriorates. In this context, the crystal grain size is defined as a maximum size among diagonal lines or diameters in each area having a polygonal shape or an elliptical shape observed with a transmission electron microscope (TEM). In the case where the transparent electrically conducting layer is composed of amorphous ITO, the environmental reliability may be lowered.

The transparent electrically conducting layer can be formed by a known method, and for example, a physical vapor deposition method such as a DC magnetron sputtering method, an RF magnetron sputtering method, an ion plating method, a vacuum vapor deposition method or a pulse laser deposition method can be used. In the case where attention is paid to industrial productivity such that a metal compound layer with a uniform film thickness is formed on a large area, a DC magnetron sputtering method is desirable. In this connection, although a chemical vapor deposition method such as a chemical vapor phase deposition method or a sol-gel method can also be used in addition to the physical vapor deposition method (PVD method), from the viewpoint of film thickness control, a sputtering method is still desirable.

The film thickness of the transparent electrically conducting layer is preferably 5 to 50 nm from the points of transparency and electrical conductivity. The film thickness is further preferably 5 to 30 nm. Since there is a tendency that the resistance value is unsatisfactory in temporal stability when the film thickness of the transparent electrically conducting layer is less than 5 nm, and moreover, the lowering in bending durability and the coloration due to the transparent electrically conducting layer become significant when the film thickness exceeds 50 nm, a transparent electroconductive laminate prepared with the transparent electrically conducting layer is not preferred as a touch panel.

In the case where the transparent electroconductive laminate according to the present invention is used as a touch panel, from aspects of reduction in power consumption of a touch panel, the need for circuit processing and the like, it is preferred that a transparent electrically conducting layer in which the surface resistance value of the transparent electrically conducting layer with a film thickness of 10 to 40 nm lies within the range of 10 to 2000 Ω/square, more preferably 30 to 1000 Ω/square, be used.

In this connection, as the transparent electrically conducting layer, a layer formed by coating a dispersion prepared by dispersing a metal nanowire, a carbon nanotube, electroconductive oxide fine particles and the like on a polymer substrate by a wet process (for example, a spin coating method, gravure coating, slot die coating, or printing) can also be used.

The transparent electrically conducting layer thus formed is subjected to pattern formation by an etching treatment. The etching treatment is generally performed by covering the transparent electrically conducting layer with a mask for forming a pattern, and then, etching the transparent electrically conducting layer with an etchant such as an acid aqueous solution. Examples of the etchant include inorganic acids such as hydrogen chloride, hydrogen bromide, sulfuric acid, nitric acid and phosphoric acid, organic acids such as acetic acid, a mixture thereof, and an aqueous solution thereof. Specific examples of the etchant include a strong acid aqueous solution obtained by a mixing of 12 N hydrochloric acid, 16 N nitric acid and water in a mass ratio of 12 N hydrochloric acid:16 N nitric acid:water being 3.3:1.0:7.6.

In this connection, a heat treatment may be performed as necessary before or after patterning the transparent electrically conducting layer. In the case where the transparent electrically conducting layer is composed of ITO which crystallizes by the heat treatment, by performing a heat treatment, there is an advantage that the transparency and the electrical conductivity can be enhanced. For example, the heat treatment can be performed by heating at 100 to 150° C. for 15 to 180 minutes.

The transparent electroconductive laminate according to the present invention is characterized as having a difference ΔR of R1 and R2 of not greater than 1, wherein R1 is a reflectance obtained by irradiation with a light source having a wavelength in a range of 500 to 750 nm toward the transparent electroconductive laminate, and R2 is a reflectance obtained by irradiation with a light source having a wavelength in a range of 500 to 750 nm toward a transparent electroconductive laminate after immersion into a strong acid aqueous solution at 40° C. for three minutes and dried, wherein the strong acid aqueous solution is obtained by a mixing of 12 N hydrochloric acid, 16 N nitric acid and water in a mass ratio of 12 N hydrochloric acid:16 N nitric acid:water being 3.3:1.0:7.6.

The strong acid aqueous solution is a strong acid aqueous solution which is so-called aqua regia commonly used in an etching treatment. By performing an etching treatment with the strong acid aqueous solution, it follows that the transparent electrically conducting layer is etched. FIG. 1 is a schematic explanatory view showing a transparent electroconductive laminate subjected to an etching treatment. A transparent electroconductive laminate (10) has a structure in which a hard coat layer (3), a color difference adjusting layer (5), and a transparent electrically conducting layer (7) are formed in this order on one surface of a transparent polymer substrate (1). In this context, the portion shown by a reference numeral (11) is a portion from which the transparent electrically conducting layer (7) was eliminated by patterning by an etching treatment, and the portion shown by a reference numeral (13) is a portion which had been covered with a mask at the time of the etching treatment and a portion in which the transparent electrically conducting layer has been left as it is. In this context, the reflectance R1 means a reflectance at the portion of the reference numeral (13) in FIG. 1, and the reflectance R2 means a reflectance at the portion of the reference numeral (11) in FIG. 1. Then, the transparent electroconductive laminate according to the present invention is characterized as having a difference ΔR of R1 and R2 of not greater than 1, which are reflectances obtained by irradiation with a light source having a wavelength in a range of 500 to 750 nm. That is, in the transparent electroconductive laminate according to the present invention, there is almost no difference of reflectance between a part where the transparent electrically conducting layer (7) exists and a part where the transparent electrically conducting layer (7) does not exist. This achieves an extremely high level of visibility.

With regard to the measurement of the reflectance of the transparent electroconductive laminate, for example, using a spectrophotometer such as U-3000 available from Hitachi, Ltd., the spectral reflectance at an incident angle of 10° can be measured in accordance with JIS K5600-4-5.

Furthermore, with regard to the transparent electroconductive laminate according to the present invention, it is preferred that a difference ΔH of H1 and H2 be not greater than 0.3%, wherein H1 is a haze value of the transparent electroconductive laminate, and H2 is a haze value of a transparent electroconductive laminate after immersion into a strong acid aqueous solution at 40° C. for three minutes and dried, wherein the strong acid aqueous solution is obtained by a mixing of 12 N hydrochloric acid, 16 N nitric acid and water in a mass ratio of 12 N hydrochloric acid:16 N nitric acid:water being 3.3:1.0:7.6. In this context, the haze value H1 means a haze value at the portion of the reference numeral (13) in FIG. 1, and the haze value H2 means a haze value at the portion of the reference numeral (11) in FIG. 1. Then, in the transparent electroconductive laminate according to the present invention, it is preferred that the difference ΔH of haze value H1 and haze value H2 be not greater than 0.3%. In this case, in the transparent electroconductive laminate according to the present invention, it follows that there is almost no difference of the haze value between a part where the transparent electrically conducting layer (7) exists and a part where the transparent electrically conducting layer (7) does not exist. This achieves an extremely high level of visibility.

A Haze value of the transparent electroconductive laminate is obtained by calculating the following formula, in conformity with JIS (Japanese Industrial Standard) K7105:

$$H(\%) = \frac{Td}{Tt} \times 100$$

H: a Haze value (a fogging value) (%)
$T_d$: a diffuse transmittance (%)
$T_t$: a total light transmittance (%)

A total light transmittance ($T_t$ (%)) is obtained by measuring an incident light intensity ($T_0$) for a hard coat film and a total transmitted light intensity ($T_1$) through the hard coat film, and calculating the following formula:

$$Tt(\%) = \frac{T1}{T0} \times 100$$

Measurement of a haze value can be performed by use of, for example, a haze meter (manufactured by Suga Test Instruments Co., Ltd.).

Antiblocking Layer

The transparent electroconductive laminate according to the present invention has a structure in which a hard coat layer, a color difference adjusting layer, and a transparent electrically conducting layer are formed in this order on at least one surface of a transparent polymer substrate.

The transparent electroconductive laminate may optionally have an antiblocking layer formed on the other side of the transparent polymer substrate.

Forming the antiblocking layer on the other side of the substrate can prevent occurrence of blocking in a production process of the transparent electroconductive laminate, which provides improved preservation stability.

A composition for forming an antiblocking layer includes, for example, a composition for an antiblocking layer containing a first component and a second component. It may be preferable that the composition is a composition for an antiblocking layer in which a difference of SP values (ΔSP) of the first component (SP1) and the second component (SP2) is within a range of 1 to 2, and phase separation occurs between the first component and the second component after the composition for forming an antiblocking layer is applied, to form an antiblocking layer having a microscopic convexoconcave on its surface.

An unsaturated double bond containing acrylic copolymer is used as the first component.

The unsaturated double bond containing acrylic copolymer includes, for example, a resin obtained by copolymerization of (meth)acrylic monomer and other ethylenically unsaturated double bond containing monomer;

a resin obtained by a reaction of (meth)acrylic monomer with other ethylenically unsaturated double bond and epoxy group containing monomer; and a resin obtained by addition reaction of a component having both of an unsaturated double bond and other functional group, for example, acrylic acid or glycidyl acrylate, to a resin obtained by a reaction of (meth)acrylic monomer with other ethylenically unsaturated double bond and isocyanate containing monomer.

These unsaturated double bond containing acrylic copolymers can be used with alone or a combination of two or more. The unsaturated double bond containing acrylic copolymer may preferably have a weight-average molecular weight of 2000 to 100000, more preferably 5000 to 50000.

A polyfunctional unsaturated double bond containing monomer or oligomer thereof may be preferably used as the second component (monomer or oligomer).

An "oligomer" used in the present specification means a polymerization product having a repeat unit, in which the number of the repeat unit is 3 to 10.

The polyfunctional unsaturated double bond containing monomer includes, for example, a polyfunctional acrylate obtained by dealcoholization reaction of a polyalcohol and (meth)acrylate, specifically, dipentaerythritol hexa(meta)acrylate, dipentaerythritol penta(meta)acrylate, trimethylol propane tri(meta)acrylate, the trimethylolpropane tetra(meta)acrylate, neopentylglycol di(meta)acrylate, and the like. In addition, an acrylate monomer having polyethylene glycol structure such as polyethylene glycol #200 diacrylate (produced by Kyoeisha Chemical Co., Ltd.) may be used. These polyfunctional unsaturated double bond containing monomers can be used with alone or a combination of two or more.

In case that the first component and the second component are the above combinations, a suitable solvent includes, for example, a ketone solvent such as methyl ethyl ketone, acetone, methyl isobutyl ketone, cyclohexanone and the like; an alcohol solvent such as methanol, ethanol, propanol, isopropanol, butanol and the like; an ether solvent such as anisole, phenetole, propylene glycol monomethylether, ethyleneglycol dimethyl ether, ethyleneglycol diethyl ether, diethyleneglycol dimethyl ether, diethyleneglycol diethyl ether, and the like. These solvents may be used with alone or a combination of two or more.

The composition for forming an antiblocking layer may preferably contain a photopolymerization initiator. The photopolymerization initiator includes, for example, 2-hydroxy-2-methyl-1-phenyl propan-1-one, 1-hydroxy cyclohexyl phenyl ketone, 2-methyl-1-[4-(methylthio)phenyl]-2-morpholino propan-1-one, 2,2-dimethoxy-1,2-diphenylethan-1-one, 2-benzyl-2-dimethylamino-1-(4-morpholino phenyl)-butanone-1, and the like.

In the composition for forming an antiblocking layer, a difference of SP values of the first component and the second component provides phase separation.

An antiblocking layer having microscopic convexoconcave on its surface can be formed by the phase separation.

The difference of SP values of the first component and the second component may preferably be not less than 1, more preferably within a range of 1 to 2.

When the difference of the first component and the second component is not less than 1, the first component and the second component are less compatible. Thus phase separation seems to occur between the first component and the second component after the composition for forming an antiblocking layer is applied.

A SP value means a solubility parameter, and is a criterion for solubility. The more SP value means a higher polarity, and the little SP value means a lower polarity.

The SP value can be determined by the following procedure.

Reference: Suh, Clarke [J.P.S.A.-1, 5, 1671-1681 (1967)]
Measuring temperature: 20° C.
Sample: A resin (0.5 g) is measured and is put into a 100 ml beaker, next, 10 ml of a good solvent is added using a whole pipette and is dissolved by means of a magnetic stirrer.
Solvent:
Good solvent: Dioxane, acetone, and the like
Poor solvent: n-Hexane, deionized water, and the like
Determination of cloud point: Using a 50 ml biuret, the poor solvent is dropped and read the amount dripped up to the point where clouding takes place.

A SP value δ of a resin is given by the following equation:

$$\delta=(V_{ml}^{1/2}\delta_{ml}+V_{mh}^{1/2}\delta_{mh})/(V_{ml}^{1/2}+V_{mh}^{1/2})$$

$$V_m=V_1V_2/(\varphi_1V_2+\varphi_2V_1)$$

$$\delta_m=\varphi_1\delta_1+\varphi_2\delta_2$$

$V_i$: a molar volume of each solvent (ml/mol)
$\varphi_i$: a volume fraction of each solvent at cloud point
$\delta_i$: a SP value of each solvent
ml: low SP poor solvent mixture system
mh: high SP poor solvent mixture system The composition for forming an antiblocking layer may further contain conventional additives such as an antistatic agent, a plasticizer, a surfactant, an antioxidant, an ultraviolet absorber and the like.

The composition for forming an antiblocking layer may contain a conventional resin component in addition to the first component and the second component.

The composition for forming an antiblocking layer has a technical feature of obtaining a resin layer with convexoconcave without including particles such as resin particles. Therefore the composition for forming an antiblocking layer may preferably include no resin particles.

On the other hand, the composition for forming an antiblocking layer may optionally contain at least one of inorganic particles, organic particles and a complex material thereof.

These particles can be added not for the purpose of forming convexoconcave on a surface of the resin layer. These particles can be added for the purpose of controlling phase separation and a segregation to obtain more microscopic convexoconcave. These particles may have a mean diameter of not greater than 0.5 μm, preferably 0.01 μm to 0.3 μm. When the mean diameter is more than 0.5 μm, a transparency may slightly be deteriorated.

Examples of the inorganic particles include at least one selected from the group consisting of silica, alumina, titania, zeolite, mica, synthetic mica, calcium oxide, zirconium oxide, zinc oxide, magnesium fluoride, smectite, synthetic smectite, vermiculite, ITO (indium oxide/tin oxide), ATO (antimony oxide/tin oxide), tin oxide, indium oxide and antimony oxide.

Examples of the organic particles include at least one selected from the group consisting of acrylic, olefin, polyether, polyester, urethane, polyester, silicone, polysilane, polyimide and fluorine particles.

The composition for forming an antiblocking layer can be prepared by mixing the first component and the second component, and an optional solvent, and optional additives such as a photopolymerization initiator, a catalyst, a photosensitizer.

A mass ratio of the first component and the second component in the composition for forming an antiblocking layer may preferably satisfy the following formula, the first composition:the second composition being 0.1:99.9 to 50:50, more preferably 0.3:99.7 to 20:80, most preferably 0.5:99.5 to 10:90.

In case that an additive such as a photopolymerization initiator, a catalyst or a photosensitizer are included in the composition, total amount of the additives may preferably be 0.01 to 20 parts by mass providing that 100 parts by mass of a total mass of the first component and the second component (a total of all these components is called "resin components"), more preferably 1 to 10 parts by mass.

In case that a solvent are included in the composition, an amount of the solvent may preferably be 1 to 9900 parts by mass providing that 100 parts by mass of a total mass of the first component and the second component, more preferably 10 to 900 parts by mass.

The composition for forming an antiblocking layer is applied and cured to form an antiblocking layer having a microscopic convexoconcave on its surface. A method for applying the composition for forming an antiblocking layer may include, for example, a dip coating method, an air knife coating method, a curtain coating method, a roller coating method, a wire bar coating method, a gravure coating method, an extrusion coating method and the like. A thickness of the antiblocking layer may be, for example 0.01 μm to 20 μm.

After applying the composition for forming an antiblocking layer, phase separation and curing are generated by irradiation of light. As the irradiation of light, a light having exposure value of, for example, 0.1 to 3.5 J/cm$^2$, preferably 0.5 to 1.5 J/cm$^2$, may be used. A wavelength region of the irradiation of light is not limited and may appropriately be, for example, not greater than 360 nm. A light with such wavelength can be obtained by a high-pressure mercury lamp, an extra high-pressure mercury lamp and the like.

Touch Panel

A touch panel according to the present invention has the transparent electroconductive laminate. The touch panel according to the present invention includes, for example, an electrostatic capacity type touch panel. The transparent electroconductive laminate according to the present invention may also be used in a resistive film type touch panel.

An embodiment of layer formation in use of the transparent electroconductive laminate as a substrate for a touch panel includes the following constructions:

a transparent electrically conductive layer/a color difference adjusting layer/a hard coat layer/a transparent polymer substrate;

a transparent electrically conductive layer/a metal-oxide layer/a color difference adjusting layer/a hard coat layer/a transparent polymer substrate;

a transparent electrically conductive layer/a color difference adjusting layer/a hard coat layer/a transparent polymer substrate/an antiblocking layer;

a transparent electrically conductive layer/a metal-oxide layer/a color difference adjusting layer/a hard coat layer/a transparent polymer substrate/an antiblocking layer;

a transparent electrically conductive layer/a color difference adjusting layer/a hard coat layer/a transparent polymer substrate/a hard coat layer/a color difference adjusting layer/a transparent electrically conductive layer;

a transparent electrically conductive layer/a metal-oxide layer/a color difference adjusting layer/a hard coat layer/a transparent polymer substrate/a hard coat layer/a color difference adjusting layer/a metal-oxide layer/a transparent electrically conductive layer;

an auxiliary electrode layer/a transparent electrically conductive layer/a color difference adjusting layer/a hard coat layer/a transparent polymer substrate;

an auxiliary electrode layer/a transparent electrically conductive layer/a metal-oxide layer/a color difference adjusting layer/a hard coat layer/a transparent polymer substrate;

an auxiliary electrode layer/a transparent electrically conductive layer/a color difference adjusting layer/a hard coat layer/a transparent polymer substrate/an antiblocking layer;

an auxiliary electrode layer/a transparent electrically conductive layer/a metal-oxide layer/a color difference adjusting layer/a hard coat layer/a transparent polymer substrate/an antiblocking layer;

an auxiliary electrode layer/a transparent electrically conductive layer/a color difference adjusting layer/a hard coat layer/a transparent polymer substrate/a hard coat layer/a color difference adjusting layer/a transparent electrically conductive layer/an auxiliary electrode layer;

an auxiliary electrode layer/a transparent electrically conductive layer/a metal-oxide layer/a color difference adjusting layer/a hard coat layer/a transparent polymer substrate/a hard coat layer/a color difference adjusting layer/a metal-oxide layer/a transparent electrically conductive layer/an auxiliary electrode layer.

The auxiliary electrode layer referred to herein means a layer usable as an electrode material for wiring. As the material of the auxiliary electrode layer, one with a specific resistance of $1 \times 10^{-6}$ Ωcm or more and $1 \times 10^{-4}$ Ωcm or less is desirable. When a metal material with a specific resistance of less than $1 \times 10^{-6}$ Ωcm is used, the layer is unstable from the viewpoints of uses and functions and it becomes difficult to form the layer as a thin film. On the other hand, when a metal material with a specific resistance of more than $1 \times 10^{-4}$ Ωcm is used, the resistance value becomes higher at the time of forming fine wiring since the resistance value is too high. For the foregoing reasons, as a metal suitable for practical use, a single metal selected from the group of Cu, Ag, Al, Au, Ni, Ni/Cr and Ti, or an alloy composed of a plurality of metals is recommended. In particular, from the points of being a metal which is high in electrical conductivity and excellent in processability such as pattern etching and electroplating, being satisfactory in electrical and mechanical connectability between an electrode and a lead part of a circuit or the like (solder, an anisotropic conductive connector and the like), being strong against bending, being high in thermal conductivity and being inexpensive, Cu, Al and the like are preferred and Cu is especially preferred.

Although the thickness of the auxiliary electrode layer is not particularly limited, the range of 0.001 to 100 μm in a usual design specification, preferably 0.01 to 25 μm, is recommended. Although a known treatment method can be used for the formation of an auxiliary electrode, it is preferred to form the electrode by a sputtering method. Afterward, as necessary, the conductivity may be enhanced by performing electrolytic/electroless wet metal plating or the like to further make the film thickness thick.

Moreover, as necessary, for the purpose of the protection (mainly oxidation prevention) of the auxiliary electrode layer, a high melting point metal layer composed of Ni, Ni/Cr, Cr, Ti, Mo and the like and an oxide layer composed of oxides thereof may be disposed as upper and lower layers of the auxiliary electrode layer.

Transparent Electroconductive Laminate Having a High Refractive Index Antiblocking Layer The present invention also provides a transparent electroconductive laminate in which the hard coat layer, the color difference adjusting layer, and the transparent electrically conducting layer are formed in this order on one side of the transparent polymer substrate.

Each layers constituting the transparent electroconductive laminate according to the present invention is explained below.

Transparent Polymer Substrate

A transparent polymer substrate which can be used in the transparent electroconductive laminate is the same as a transparent polymer substrate described above.

A High Refractive Index Antiblocking Layer

A high refractive index antiblocking layer in the transparent electroconductive laminate according to the present invention is a layer obtained by a composition for forming a high refractive index antiblocking layer.

The composition for forming a high refractive index antiblocking layer contains a first component and a second component.

The first component is an unsaturated double bond containing acrylic copolymer.

The second component contains (A) a phenolic novolac acrylate having two or more acrylate groups, and (B) an aromatic group-containing mono or poly (meth)acrylate having 1 or 2 mols of an alkylene oxide structure with two or three carbon atoms in each molecule.

It is subject to that the second component contains 60 to 85 parts by mass of the phenolic novolac acrylate (A) and 15 to 30 parts by mass of the (meth)acrylate (B), providing that 100 parts by mass of the second component.

Furthermore, it is subject to that a difference of SP values (ΔSP) of the first component (SP1) and the second component (SP2) is within a range of 1 to 4, and a mass ratio of the first component and the second component in the composition satisfies the following formula, the first composition:the second composition being 0.5:99.5 to 20:80.

The composition for forming a high refractive index antiblocking layer has a technical feature of that phase separation occurs between the first component and the second component after the composition is applied, to form an antiblocking layer having a microscopic convexoconcave on its surface.

A First Component

An unsaturated double bond containing acrylic copolymer is used as the first component. The unsaturated double bond containing acrylic copolymer may be, for example, a resin obtained by a copolymerization of a (meth)acrylate monomer and other monomer having ethylene unsaturated double bond; a resin obtained by a copolymerization of a (meth)acrylate monomer and other monomer having ethylene unsaturated double bond and epoxy group; a resin obtained by copolymerizing a (meth)acrylate monomer and other monomer having ethylene unsaturated double bond and isocyanate group, then reacting a component having unsaturated double bond and other functional group, such as acrylic acid or glycidyl acrylate; and the like. These unsaturated double bond containing acrylic copolymers may be used with alone or a combination of two or more. The unsaturated double bond containing acrylic copolymer may preferably have a weight average molecular weight of 2000 to 100000, more preferably 5000 to 50000.

A Second Component

The second component contains
(A) a phenolic novolac acrylate having two or more acrylate groups, and
(B) an aromatic group-containing mono or poly (meth)acrylate having 1 or 2 mols of an alkylene oxide structure with two or three carbon atoms in each molecule. The components (A) and (B) are described as follows.

(A) A Phenolic Novolac Acrylate Having Two or More Acrylate Groups

A phenolic novolac acrylate having two or more acrylate groups (A) is a same component of the component (A) in the hard coat layer, thus its detailed description is omitted.

An amount of the phenolic novolac acrylate (A) is 60 to 85 parts by mass providing that 100 parts by mass of the second component. When an amount of the phenolic novolac acrylate (A) is less than 60 parts by mass or an amount of the phenolic novolac acrylate (A) is more than 85 parts by mass, a hardness of resulting antiblocking layer is lowered, respectively.

(B) An Aromatic Group-Containing Mono or Poly (Meth) Acrylate Having 1 or 2 Mols of an Alkylene Oxide Structure with Two or Three Carbon Atoms in Each Molecule A component (B) is a same component of the component (B) in the hard coat layer, i.e., the aromatic group-containing mono or poly (meth)acrylate, thus its detailed description is omitted.

An amount of the component (B) is 15 to 30 parts by mass providing that 100 parts by mass of the second component in the composition for forming a high refractive index antiblocking layer. When an amount of the component (B) is less than 15 parts by mass or an amount of the component (B) is more than 30 parts by mass, a hardness of resulting antiblocking layer is lowered, respectively.

Another (Meth)Acrylate

The second component in the composition for forming a high refractive index antiblocking layer according to the present invention may contain another (meth)acrylate in addition to the components (A) and (B). The another (meth) acrylate is a same component of the another (meth)acrylate in the hard coat layer, thus its detailed description is omitted.

In case that the second component in the composition for forming a high refractive index antiblocking layer according to the present invention contains the another (meth)acrylate, an amount of the another (meth)acrylate may preferably be 1 to 30 parts by mass providing that 100 parts by mass of the second component, more preferably 1 to 25 parts by mass.

A Composition for Forming a High Refractive Index Antiblocking Layer

The composition for forming a high refractive index antiblocking layer can be prepared by mixing the first component and the second component, and an optional solvent, and optional additives such as a photopolymerization initiator, a catalyst, a photosensitizer. A mass ratio of the first component and the second component in the composition for forming a high refractive index antiblocking layer according to the present invention satisfies the following formula, the first composition:the second composition being 0.5:99.5 to 20:80. The mass ratio may preferably be, the first composition:the second composition being 1:99 to 20:80, more preferably be, the first composition:the second composition being 1:99 to 15:85.

In the composition for forming a high refractive index antiblocking layer, phase separation occurs based on a difference between a SP value of the first component and a SP value of the second component. The phase separation provides a formation of an antiblocking layer having a microscopic convexoconcave on its surface. In the present invention, it is subject to that a difference of SP values (ΔSP) of the first component (SP1) and the second component (SP2) is within a range of 1 to 4. When the difference of the first component (SP1) and the second component (SP2) is not less than 1, the first component and the second component are less compatible. Thus phase separation seems to occur between the first component and the second component after the composition for forming a high refractive index antiblocking layer is applied. The difference of SP values (ΔSP) may preferably be within a range of 2.0 to 3.5.

A SP value means a solubility parameter, and is a criterion for solubility. The more SP value means a higher polarity, and the little SP value means a lower polarity.

The SP value can be determined by the following procedure.
Reference: Suh, Clarke [J.P.S.A.-1, 5, 1671-1681 (1967)]
Measuring temperature: 20° C.
Sample: A resin (0.5 g) is measured and is put into a 100 ml beaker, next, 10 ml of a good solvent is added using a whole pipette and is dissolved by means of a magnetic stirrer.
Solvent:
Good solvent: Dioxane, acetone, and the like
Poor solvent: n-Hexane, deionized water, and the like
Determination of cloud point: Using a 50 ml biuret, the poor solvent is dropped and read the amount dripped up to the point where clouding takes place.

A SP value δ of a resin is given by the following equation:

$$\delta = (V_{ml}^{1/2}\delta_{ml} + V_{mh}^{1/2}\delta_{mh})/(V_{ml}^{1/2} + V_{mh}^{1/2})$$

$$V_m = V_1 V_2 /(\varphi_1 V_2 + \varphi_2 V_1)$$

$$\delta_m = \varphi_1 \delta_1 + \varphi_2 \delta_2$$

$V_i$: a molar volume of each solvent (ml/mol)
$\varphi_i$: a volume fraction of each solvent at cloud point
$\delta_i$: a SP value of each solvent
ml: low SP poor solvent mixture system
mh: high SP poor solvent mixture system The composition for forming a high refractive index antiblocking layer according to the present invention may further contain a solvent, a photopolymerization initiator, and an additive, in addition to the first component and the second component.

In case that the first component and the second component are the above combinations, a suitable solvent includes, for example, a ketone solvent such as methyl ethyl ketone, acetone, methyl isobutyl ketone, cyclohexanone and the like; an alcohol solvent such as methanol, ethanol, propanol, isopropanol, butanol and the like; an ether solvent such as anisole, phenetole, propylene glycol monomethylether, ethyleneglycol dimethyl ether, ethyleneglycol diethyl ether, diethyleneglycol dimethyl ether, diethyleneglycol diethyl ether, and the like. These solvents may be used with alone or a combination of two or more. In case that a solvent are included in the composition, an amount of the solvent may preferably be 1 to 9900 parts by mass providing that 100 parts by mass of a total mass of the first component and the second component (a total of all these components is called "resin components"), more preferably 10 to 900 parts by mass.

The composition for forming a high refractive index antiblocking layer according to the present invention may preferably contain a photopolymerization initiator. The photopolymerization initiator includes, for example, 2-hydroxy-2-methyl-1-phenyl propan-1-one, 1-hydroxy cyclohexyl phenyl ketone, 2-methyl-1-[4-(methylthio)phenyl]-2-morpholino propan-1-one, 2,2-dimethoxy-1,2-diphenylethan-1-one, 2-benzyl-2-dimethylamino-1-(4-morpholino phenyl)-butanone-1, and the like. A preferable amount of the photopolymerization initiator may be 0.01 to 20 parts by mass providing that 100 parts by mass of the resin components, more preferably 1 to 10 parts by mass.

The composition for forming a high refractive index antiblocking layer according to the present invention may optionally contain a conventional additive such as an antistatic agent, a plasticizer, a surfactant, an antioxidant, an ultraviolet absorber and the like. In case that such additive(s) is included in the composition, an amount of the additive(s) may preferably be 0.01 to 20 parts by mass providing that 100 parts by mass of the resin components, more preferably 1 to 10 parts by mass.

The composition for forming a high refractive index antiblocking layer according to the present invention has a technical feature of obtaining a resin layer with convexoconcave without including particles such as resin particles. Therefore the composition for forming high refractive index antiblocking layer may preferably include no resin particles. On the other hand, the composition for forming a high refractive index antiblocking layer may optionally contain at least one of inorganic particles, organic particles and a complex material thereof. These particles may be added not for the purpose of forming convexoconcave on a surface of the resin layer. These particles may be added for the purpose of controlling phase separation and a segregation to obtain more microscopic convexoconcave. These particles may have a mean diameter of not greater than 0.5 μm, preferably 0.01 μm to 0.3 μm. When the mean diameter is more than 0.5 μm, a transparency may slightly be deteriorated.

Examples of the inorganic particles include at least one selected from the group consisting of silica, alumina, zeolite, mica, synthetic mica, calcium oxide, magnesium fluoride, smectite, synthetic smectite, vermiculite, ITO (indium oxide/tin oxide), ATO (antimony oxide/tin oxide), tin oxide, indium oxide and antimony oxide.

Examples of the organic particles include at least one selected from the group consisting of acrylic, olefin, polyether, polyester, urethane, polyester, silicone, polysilane, polyimide and fluorine particles.

The composition for forming a high refractive index antiblocking layer according to the present invention is applied and cured to form an antiblocking layer having a microscopic convexoconcave on its surface. A method for applying the composition for forming a high refractive index antiblocking layer may include, for example, a dip coating method, an air knife coating method, a curtain coating method, a roller coating method, a wire bar coating method, a gravure coating method, an extrusion coating method and the like. A thickness of the antiblocking layer may be, for example 0.01 μm to 20 μm.

After applying the composition for forming a high refractive index antiblocking layer, phase separation and curing are generated by irradiation of light. As the irradiation of light, a light having exposure value of, for example, 0.1 to 3.5 J/cm², preferably 0.5 to 1.5 J/cm², may be used. A wavelength region of the irradiation of light is not limited and may appropriately be, for example, not greater than 360 nm. A light with such wavelength can be obtained by a high-pressure mercury lamp, an extra high-pressure mercury lamp and the like. Irradiation of the light provides phase separation and curing.

The antiblocking layer obtained by applying the composition for forming a high refractive index antiblocking layer according to the present invention has a technical feature of having a microscopic convexoconcave. The antiblocking layer may preferably have an arithmetic average roughness (Ra) of less than 0.1 μm, more preferably 0.001 μm to 0.09 μm, most preferably 0.002 μm to 0.08 μm. In this specification, an arithmetic average roughness (Ra) is a parameter defined by JIS (Japanese Industrial Standard) B 0601-2001. When an arithmetic average roughness (Ra) of the antiblocking layer is not less than 0.1 μm, problems of glare and chalking of the layer may occur. When an arithmetic average roughness (Ra) of the antiblocking layer is less than 0.001 μm, it may not be preferable in view of occurrence of blocking. JIS (Japanese Industrial Standard) B 0601-2001 is a standard in conformity with ISO 4288.

An arithmetic average roughness (Ra) is a parameter obtained by followings:
a section of standard length is sampled from its average line on a roughness chart,
the average line is plotted with the average line in the horizontal X axis, and the surface deviation from the average line in the vertical Y axis, and the roughness curve is shown a numerical formula y=f(x), and
the average surface roughness Ra in microns, is calculated by the following formula.

$$Ra = \frac{1}{l} \int_0^l |f(x)| dx$$

The antiblocking layer obtained by applying the composition for forming a high refractive index antiblocking layer according to the present invention may preferably have a ten-point average roughness (Rz) of not greater than 0.5 μm. In this specification, a ten-point average roughness (Rz) is a parameter defined by JIS (Japanese Industrial Standard) B 0601-2001. A ten-point average roughness (Rz) may more preferably be not greater than 0.3 μm, most preferably not greater than 0.2 μm. A lower limit of a ten-point average roughness (Rz) may preferably be 0.01 μm.

An arithmetic average roughness (Ra) and a ten-point average roughness (Rz) of the antiblocking layer obtained by applying the composition for forming a high refractive index antiblocking layer according to the present invention can be measured by use of a measuring instrument for micro surface with high accuracy (manufactured by Kosaka Laboratory Ltd.) or a color 3D laser microscope (manufactured by Keyence Corporation), in conformity with JIS (Japanese Industrial Standard) B 0601-2001.

The antiblocking layer obtained by applying the composition for forming a high refractive index antiblocking layer according to the present invention has an irregular, minute and microscopic convexoconcave, which provide an excellent antiblocking property. The antiblocking layer according to the present invention has further technical advantages that the layer does not lower a sharpness of images shown by a light source such as a liquid crystal module and the like. A high definition liquid crystal display device in recent years emits finer beam pitches. Therefore, more minute and microscopic convezoconcave is required in order to keep a sharpness of images. Thanks to minute and microscopic convezoconcave, the antiblocking layer according to the present invention has technical advantages that the layer does not provide lowering of a sharpness of images such as deterioration of contrast, degrading of luminance.

The antiblocking layer according to the present invention has a technical characteristic of having a high refractive index in a range of 1.565 to 1.620, even if the antiblocking layer does not substantially include high refractive index materials. A refractive index of the antiblocking layer can be measured by, for example, an Abbe's refractometer in conformity with JIS (Japanese Industrial Standard) K7142.

The composition for forming a high refractive index antiblocking layer may optionally contain an additive. The additive includes conventional additives such as an antistatic agent, a plasticizer, a surfactant, an antioxidant and the like.

The composition for forming a high refractive index antiblocking layer has a technical characteristic of providing the high refractive index antiblocking layer without including high refractive index materials such as ZnO, $TiO_2$, $CeO_2$, $SnO_2$, $ZrO_2$ and indium tin oxide. Therefore, the high refractive index antiblocking layer may preferably have no high refractive index materials such as ZnO, $TiO_2$, $CeO_2$, $SnO_2$, $ZrO_2$ and indium tin oxide. For more details, a total content of ZnO, $TiO_2$, $CeO_2$, $SnO_2$, $ZrO_2$ and indium tin oxide in the high refractive index antiblocking layer may preferably be less than or equal to 0.0001% by mass. When the high refractive index materials such as a metal oxide are included in an antiblocking layer, the high refractive index antiblocking layer generally has inferior stretchability and bending resistance compared with the antiblocking layer without the high refractive index materials.

The high refractive index antiblocking layer formed by applying the composition for forming a high refractive index antiblocking layer has a technical feature of a high refractive index within a range of 1.565 to 1.620, as well as excellent hardness of the high refractive index antiblocking layer. Thanks to the high refractive index of the high refractive index antiblocking layer, it is advantageous that the transparent electroconductive laminate has prevention of the appearance of interference fringes.

The high refractive index antiblocking layer obtained by applying the composition for forming a high refractive index antiblocking layer has a technical characteristic of having stretchability, as well as excellent visibility and excellent hardness which is required in the field of a antiblocking layer.

The stretchability can provide remarkably-improved visibility of the transparent electroconductive laminate and is advantageous.

In a processing for applying a transparent electrically conducting layer, a substrate film having a high refractive index antiblocking layer tends to be exposed a partial load. The partial load may cause a swell or a kink of a film which results from a difference of thermal shrinkage and/or thermal expansion among a high refractive index antiblocking layer and a substrate film.

The swell or the kink of a film provides deterioration of visibility due to visually distinguish about presence or absence of a transparent electrically conductive layer such as ITO. The deterioration of visibility distinctly deteriorates visibility of a touch panel.

The high refractive index antiblocking layer obtained by applying the composition for forming a high refractive index antiblocking layer has a technical characteristic of having stretchability, as well as excellent visibility and excellent hardness which is required in the field of a antiblocking layer.

Even if a substrate film is exposed a partial thermal load such as heating at a stage of applying a transparent electrically conductive layer and obtains a partial thermal expansion, the high refractive index antiblocking layer has advantages such as decreased kink because of excellent stretchability of the high refractive index antiblocking layer and accompanying followings of the high refractive index antiblocking layer.

Therefore, it is advantageous that deterioration of visibility due to visually distinguish about presence or absence of a transparent electrically conductive layer such as ITO is solved.

Color Difference Adjusting Layer

The transparent electroconductive laminate according to the present invention has a color difference adjusting layer on a high refractive index antiblocking layer. That is, the color difference adjusting layer is a layer existing between the high refractive index antiblocking layer and a transparent electrically conducting layer. The color difference adjusting layer may be a single layer or may be a layer composed of two or more layers. The color difference adjusting layer is a layer for improving the adhesion between layers and the optical properties (the transmittance, the color tone and the like) of the transparent electroconductive laminate.

In the present invention, the color difference adjusting layer is a layer containing a curing resin component (i), and metal oxide particles having an average primary particle diameter of 100 nm or less (ii) and/or metal fluoride particles having an average primary particle diameter of 100 nm or less (iii). In this context, provided that the total mass of the particles (ii) and (iii) in the color difference adjusting layer lies within the range of 0 to 200 parts by mass with respect to 100 parts by mass of the curing resin component (i).

As the curing resin component (i), an ultraviolet curing resin or a thermosetting resin can be used. With regard to the color difference adjusting layer in the present invention, it is more preferred that an ultraviolet curing resin be used as the curing resin component (i).

The ultraviolet curing resin can be obtained from a composition containing a monomer having ultraviolet curing performance. Examples of the monomer having ultraviolet curing performance include monofunctional and polyfunctional acrylates such as a polyol acrylate, a polyester acrylate, a urethane acrylate, an epoxy acrylate, a modified styrene acrylate, a melamine acrylate and a silicon-containing acrylate.

Specific examples of the monomer include trimethylolpropane trimethacrylate, a trimethylolpropane ethylene oxide-modified acrylate, a trimethylolpropane propylene oxide-modified acrylate, an isocyanuric acid alkylene oxide-modified acrylate, pentaerythritol triacrylate, dipentaerythritol hexaacrylate, dimethylol tricyclodecane diacrylate, tripropylene glycol triacrylate, diethylene glycol diacrylate, 1,6-hexanediol diacrylate, an epoxy-modified acrylate, a urethane-modified acrylate such as a urethane (meth)acrylate, and a polyfunctional monomer such as an epoxy-modified acrylate. These monomers may be used alone or two or more thereof may be used together.

Of these monomers having ultraviolet curing performance, a urethane-modified acrylate is preferred. As the urethane-modified acrylate, a commercial product thereof can be used, and for example, products in the SHIKOH series available from The Nippon Synthetic Chemical Industry Co., Ltd. such as UV1700B, UV6300B, UV765B, UV7640B and UV7600B; products in the Art Resin series available from Negami Chemical Industrial Co., Ltd. such as Art Resin HDP, Art Resin UN9000H, Art Resin UN3320HA, Art Resin UN3320HB, Art Resin UN3320HC, Art Resin UN3320HS, Art Resin UN901M, Art Resin UN902MS and Art Resin UN903; UA100H, U4H, U6H, U15HA, UA32P, U6LPA, U324A, U9HAMI and the like available from Shin Nakamura Chemical Co., Ltd.; products in the Ebecryl series available from Daicel-UCB Co. Ltd. such as 1290, 5129, 254, 264, 265, 1259, 1264, 4866, 9260, 8210, 204, 205, 6602, 220 and 4450; products in the BEAMSET series available from ARAKAWA CHEMICAL INDUSTRIES, LTD. such as 371, 371MLV, 371S, 577, 577BV and 577AK; products in the RQ series available from MITSUBISHI RAYON CO., LTD.; products in the UNIDIC series available from DIC Corporation; DPHA40H (available from Nippon Kayaku Co., Ltd.), CN9006 and CN968 (available from SARTOMER company), and the like can be used.

In the case where the curing resin component (i) is an ultraviolet curing resin, it is preferred that a composition forming the color difference adjusting layer contain a photopolymerization initiator. As the photopolymerization initiator, for example, a photopolymerization initiator commonly used such as acetophenone, benzophenone, benzoin, benzoylbenzoate and thioxanthone can be used.

The composition forming the color difference adjusting layer may further contain a photosensitizer. As the photosensitizer, for example, a photosensitizer commonly used such as triethylamine and tri-n-butylphosphine can be used.

The composition forming the color difference adjusting layer may further contain hydrolysates of various alkoxysilanes.

In the case where the curing resin component (i) is a thermosetting resin, the composition forming the color difference adjusting layer may contain a thermosetting monomer such as an organosilane-based thermosetting monomer in which a silane compound such as methyltriethoxysilane or phenyltriethoxysilane constitutes a monomer, a melamine-based thermosetting monomer in which an etherified methylolmelamine or the like constitutes a monomer, an isocyanate-based thermosetting monomer, a phenol-based thermosetting monomer and an epoxy-based thermosetting monomer. These thermosetting monomers may be used alone or two or more thereof may be used in combination. In addition to the above-mentioned thermosetting monomer, the composition may contain a thermoplastic resin component as necessary.

In the case where the curing resin component (i) is a thermosetting resin, it is preferred that the composition forming the color difference adjusting layer contain a reaction accelerator or a curing agent. Examples of the reaction accelerator include triethylenediamine, dibutyltin dilaurate, benzyl methylamine, pyridine and the like. Examples of the curing agent include methylhexahydrophthalic anhydride, 4,4'-diaminodiphenylmethane, 4,4'-diamino-3,3'-diethyldiphenylmethane, diaminodiphenylsulfone and the like.

In the present invention, in addition to the above-mentioned curing resin component (i), metal oxide particles having an average primary particle diameter of 100 nm or less (ii) and/or metal fluoride particles having an average primary particle diameter of 100 nm or less (iii) are contained in the color difference adjusting layer. Then, provided that the total mass of these particles (ii) and (iii) lies within the range of 0 to 200 parts by mass with respect to 100 parts by mass of the curing resin component (i). The total mass of the particles (ii) and (iii) can be appropriately adjusted depending on the refractive index of each of (i), (ii) and (iii) in order to attain desired optical properties. From the viewpoint of film strength after curing, it is preferred that the total mass lie within the range of 0 to 150 parts by mass, and it is more preferred that the total mass lie within the range of 0 to 100 parts by mass, with respect to 100 parts by mass of the curing resin component (i).

In the case where the total mass of the particles (ii) and (iii) in the color difference adjusting layer exceeds 200 parts by mass, there occurs a defect that the adhesion between layers is deteriorated.

Specific examples of the metal oxide particles (ii) include $ZnO$, $TiO_2$, $CeO_2$, $SnO_2$, $ZrO_2$, an indium-tin oxide and the like. Any of these metal oxide particles (ii) are characterized as having a high refractive index. On that account, a color difference adjusting layer in which the metal oxide particles (ii) are contained basically becomes a high refractive index layer. As the metal oxide particle (ii), $ZnO$, $TiO_2$ and $ZrO_2$ are more preferably used. The metal oxide particles (ii) may be used alone or two or more thereof may be used together.

In this connection, as described above, provided that any of these metal oxide particles (ii) have an average primary particle diameter of 100 nm or less. In the case where the average primary particle diameter exceeds 100 nm, there occurs a defect that the haze value rises, drawbacks in appearance such as the formation of a lump of foreign materials are caused or the like since the particles of a visible size are easily formed due to aggregation of particles and the like at the time of forming the color difference adjusting layer. In the present specification, the average primary particle diameter refers to a 50% volume particle diameter at the time of measuring a liquid prepared by dispersing particles in a solvent such as n-BuOH with a particle size analyzer.

Specific examples of a metal constituting the metal fluoride particles (iii) include calcium, barium, magnesium, strontium and the like. Of these metals, it is more preferred that the metal be magnesium. These metal fluoride particles (iii) may be used alone or two or more thereof may be used together. In this connection, as necessary, the metal fluoride particles (iii) and $SiO_2$ may be used in combination.

Any of these metal fluoride particles (iii) are characterized as having a low refractive index. On that account, a color difference adjusting layer in which the metal fluoride particles (iii) are contained basically becomes a low refractive index layer. In this connection, as described above, provided that any of these metal fluoride particles (iii) have an average primary particle diameter of 100 nm or less. In the case where the average primary particle diameter exceeds 100 nm, there occurs a defect that the haze value rises, drawbacks in appearance such as the formation of a lump of foreign materials are caused or the like since the particles of a visible size are easily formed due to aggregation of particles and the like at the time of forming the color difference adjusting layer.

The color difference adjusting layer in the present invention may be composed of a single layer or may be composed of two or more layers. In the case where the color difference adjusting layer is a single layer, it is preferred that the layer be a high refractive index layer containing the metal oxide particles (ii). Examples of another aspect thereof include an aspect containing both the metal oxide particles (ii) and the metal fluoride particles (iii) mentioned above. The thickness of the color difference adjusting layer in the case where the color difference adjusting layer is a single layer is preferably 30 to 300 nm, more preferably 50 nm to 200 nm.

Moreover, for example, in the case where the color difference adjusting layer is a layer composed of two layers, it is preferred that the layer have a two-layered structure composed of a high refractive index layer containing the metal oxide particles (ii) and a low refractive index layer containing the metal fluoride particles (iii). In this case, it is more preferred to be an aspect in which a high refractive index antiblocking layer and the high refractive index layer are brought into contact with each other. In the case where the color difference adjusting layer is constituted of two layers composed of one layer of a high refractive index layer and one layer of a low refractive index layer, the thickness of the whole color difference adjusting layer is preferably 30 to 300 nm, more preferably 50 nm to 200 nm.

With regard to the formation of the color difference adjusting layer, for example, the layer can be formed by applying a composition containing a monomer having ultraviolet curing performance and the metal oxide particles (ii) and/or the metal fluoride particles (iii) on a high refractive index antiblocking layer of a transparent polymer substrate, and then, irradiating the composition with active energy rays such as ultraviolet rays to cure the composition. Alternatively, the layer can be formed by applying a composition containing a thermosetting monomer and the metal oxide particles (ii) and/or the metal fluoride particles (iii) on a high refractive index antiblocking layer of a transparent polymer substrate, and then, thermally curing the composition.

As an example of the case where the color difference adjusting layer is a layer composed of two layers, a color difference adjusting layer composed of two layers can be formed by firstly applying a composition containing the metal oxide particles (ii) on a high refractive index antiblocking layer and curing the composition, and then, applying a composition containing the metal fluoride particles (iii) and curing the composition.

As another example of the case where the color difference adjusting layer is a layer composed of two layers, a color difference adjusting layer composed of two layers can be formed by firstly applying a composition containing the metal fluoride particles (iii) on a high refractive index antiblocking layer and curing the composition, and then, applying a composition containing the metal oxide particles (ii) and curing the composition.

Examples of a method for applying the composition include an applying method using a coating machine such as a doctor knife, a bar coater, a gravure roll coater, a curtain coater, a knife coater or a spin coater which is usually performed by a person skilled in the art, an applying method using a spray, an applying method by immersion and the like.

Moreover, the composition may contain an organic solvent as necessary. Examples of the organic solvent include alcohol-based solvents such as ethanol, isopropyl alcohol, butanol and 1-methoxy-2-propanol, hydrocarbon-based solvents such as hexane, cyclohexane, ligroin and cyclohexanone, ketone-based solvents such as methyl isobutyl ketone and isobutyl acetate, aromatic hydrocarbon-based solvents such as xylene and toluene, and the like. These organic solvents may be used alone or two or more thereof may be used together.

In the case of curing a composition containing a monomer having ultraviolet curing performance, the curing can be performed by using a light source emitting active energy rays of a required wavelength and irradiating the composition with the active energy rays. As the active energy ray to be irradiated, for example, light of 0.1 to 1.5 $J/cm^2$ in terms of an exposure quantity, preferably light of 0.3 to 1.5 $J/cm^2$, can be used. Moreover, although the wavelength of the irradiation light is not particularly limited, for example, irradiation light having a wavelength of 360 nm or less and the like can be used. Such light can be obtained by using a high pressure mercury lamp, an ultra-high pressure mercury lamp or the like.

Moreover, in the case of curing a composition containing a thermosetting monomer, for example, the composition can be cured by heating at 60 to 140° C. for 1 to 60 minutes. In this context, the heating temperature and the heating time can be selected according to the kind of the thermosetting monomer contained in the composition.

Metal Oxide Layer

With regard to the transparent electroconductive laminate according to the present invention, a metal oxide layer may be formed between the color difference adjusting layer and the transparent electrically conducting layer as necessary. Examples of a component constituting the metal oxide layer include metal oxides such as silicon oxide, aluminum oxide, titanium oxide, magnesium oxide, zinc oxide, indium oxide and tin oxide. Examples of the metal oxide layer include a metal oxide layer with a thickness of 0.5 to 5.0 nm.

By disposing a metal oxide layer between the color difference adjusting layer and the transparent electrically conducting layer, it is possible to improve the adhesion between each layer. Moreover, by allowing a metal oxide layer to exist, there is also an advantage that the performance such as durability of the laminate is enhanced.

The metal oxide layer can be formed by a known method. As the method for forming a metal oxide layer, a physical vapor deposition method (hereinafter referred to as "a PVD method") such as a DC magnetron sputtering method, an RF magnetron sputtering method, an ion plating method, a vacuum vapor deposition method or a pulse laser deposition method can be used. Of these methods, a DC magnetron sputtering method, which is a method capable of forming a metal oxide layer with a uniform thickness and excellent in industrial productivity, is especially preferred. In this connection, in addition to the physical vapor deposition method (PVD method), a chemical vapor deposition method (hereinafter referred to as "a CVD method") such as a sol-gel method can also be used.

It is preferred that a target used in the sputtering method be a metal target. Moreover, as the sputtering method, a reactive sputtering method is widely used. This is because it is difficult to use a DC magnetron sputtering method in the case of a metal oxide target since the oxide of an element used as the metal oxide layer is often an insulator. In this connection, a pseudo RF magnetron sputtering method in which the formation of an insulator to a target is suppressed by executing the simultaneous discharge of two cathodes, and the like can also be used.

Transparent Electrically Conducting Layer and Transparent Electroconductive Laminate With regard to the transparent electroconductive laminate according to the present invention, a transparent electrically conducting layer is formed on the color difference adjusting layer or the metal oxide layer. Although no particular restriction is put on the constituent material for the transparent electrically conducting layer, examples thereof include a metal layer and a metal compound layer. Examples of a component constituting the transparent electrically conducting layer include a layer of a metal oxide such as silicon oxide, aluminum oxide, titanium oxide, magnesium oxide, zinc oxide, indium oxide and tin oxide. Of these, a crystalline layer composed mainly of indium oxide is preferred, and in particular, a layer composed of crystalline ITO (Indium Tin Oxide) is preferably used.

Moreover, in the case where the transparent electrically conducting layer is composed of crystalline ITO, although it is not particularly necessary to provide an upper limit to the crystal grain size, it is preferred that the crystal grain size be 500 nm or less. When the crystal grain size exceeds 500 nm, it is not preferred because the bending durability deteriorates. In this context, the crystal grain size is defined as a maximum size among diagonal lines or diameters in each area having a polygonal shape or an elliptical shape observed with a transmission electron microscope (TEM). In the case where the transparent electrically conducting layer is composed of amorphous ITO, the environmental reliability may be lowered.

The transparent electrically conducting layer can be formed by a known method, and for example, a physical vapor deposition method such as a DC magnetron sputtering method, an RF magnetron sputtering method, an ion plating method, a vacuum vapor deposition method or a pulse laser deposition method can be used. In the case where attention is paid to industrial productivity such that a metal compound layer with a uniform film thickness is formed on a large area, a DC magnetron sputtering method is desirable. In this connection, although a chemical vapor deposition method such as a chemical vapor phase deposition method or a sol-gel method can also be used in addition to the physical vapor deposition method (PVD method), from the viewpoint of film thickness control, a sputtering method is still desirable.

The film thickness of the transparent electrically conducting layer is preferably 5 to 50 nm from the points of transparency and electrical conductivity. The film thickness is further preferably 5 to 30 nm. Since there is a tendency that the resistance value is unsatisfactory in temporal stability when the film thickness of the transparent electrically conducting layer is less than 5 nm, and moreover, the lowering in bending durability and the coloration due to the transparent electrically conducting layer become significant when the film thickness exceeds 50 nm, a transparent electroconductive laminate prepared with the transparent electrically conducting layer is not preferred as a touch panel.

In the case where the transparent electroconductive laminate according to the present invention is used as a touch panel, from aspects of reduction in power consumption of a touch panel, the need for circuit processing and the like, it is preferred that a transparent electrically conducting layer in which the surface resistance value of the transparent electrically conducting layer with a film thickness of 10 to 40 nm lies within the range of 10 to 2000 Ω/square, more preferably 30 to 1000 Ω/square, be used.

In this connection, as the transparent electrically conducting layer, a layer formed by coating a dispersion prepared by dispersing a metal nanowire, a carbon nanotube, electroconductive oxide fine particles and the like on a polymer substrate by a wet process (for example, a spin coating method, gravure coating, slot die coating, or printing) can also be used.

The transparent electrically conducting layer thus formed is subjected to pattern formation by an etching treatment. The etching treatment is generally performed by covering the transparent electrically conducting layer with a mask for forming a pattern, and then, etching the transparent electrically conducting layer with an etchant such as an acid aqueous solution. Examples of the etchant include inorganic acids such as hydrogen chloride, hydrogen bromide, sulfuric acid, nitric acid and phosphoric acid, organic acids such as acetic acid, a mixture thereof, and an aqueous solution thereof. Specific examples of the etchant include a strong acid aqueous solution obtained by a mixing of 12 N hydrochloric acid, 16 N nitric acid and water in a mass ratio of 12 N hydrochloric acid:16 N nitric acid:water being 3.3:1.0:7.6.

In this connection, a heat treatment may be performed as necessary before or after patterning the transparent electrically conducting layer. In the case where the transparent electrically conducting layer is composed of ITO which crystallizes by the heat treatment, by performing a heat treatment, there is an advantage that the transparency and the electrical conductivity can be enhanced. For example, the heat treatment can be performed by heating at 100 to 150° C. for 15 to 180 minutes.

The transparent electroconductive laminate according to the present invention is characterized as having a difference ΔR of R1 and R2 of not greater than 1, wherein R1 is a reflectance obtained by irradiation with a light source having a wavelength in a range of 500 to 750 nm toward the transparent electroconductive laminate, and R2 is a reflectance obtained by irradiation with a light source having a wavelength in a range of 500 to 750 nm toward a transparent electroconductive laminate after immersion into a strong acid aqueous solution at 40° C. for three minutes and dried, wherein the strong acid aqueous solution is obtained by a mixing of 12 N hydrochloric acid, 16 N nitric acid and water in a mass ratio of 12 N hydrochloric acid:16 N nitric acid:water being 3.3:1.0:7.6.

The strong acid aqueous solution is a strong acid aqueous solution which is so-called aqua regia commonly used in an etching treatment. By performing an etching treatment with the strong acid aqueous solution, it follows that the transparent electrically conducting layer is etched. FIG. 1 is a schematic explanatory view showing a transparent electroconductive laminate subjected to an etching treatment. A transparent electroconductive laminate (10) has a structure in which a high refractive index antiblocking layer (3), a color difference adjusting layer (5), and a transparent electrically conducting layer (7) are formed in this order on one surface of a transparent polymer substrate (1). In this context, the portion shown by a reference numeral (11) is a portion from which the transparent electrically conducting layer (7) was eliminated by patterning by an etching treatment, and the portion shown by a reference numeral (13) is a portion which had been covered with a mask at the time of the etching treatment and a portion in which the transparent electrically conducting layer has been left as it is. In this context, the reflectance R1 means a reflectance at the portion of the reference numeral (13) in FIG. 1, and the reflectance R2 means a reflectance at the portion of the reference numeral (11) in FIG. 1. Then, the transparent electroconductive laminate according to the present invention is characterized as having a difference ΔR of R1 and R2 of not greater than 1, which are reflectances obtained by irradiation with a light source having a wavelength in a range of 500 to 750 nm. That is, in the transparent electroconductive laminate according to the present invention, there is almost no difference of reflectance between a part where the transparent electrically conducting layer (7) exists and a part where the transparent electrically conducting layer (7) does not exist. This achieves an extremely high level of visibility.

With regard to the measurement of the reflectance of the transparent electroconductive laminate, for example, using a spectrophotometer such as U-3000 available from Hitachi, Ltd., the spectral reflectance at an incident angle of 10° can be measured in accordance with JIS K5600-4-5.

Furthermore, with regard to the transparent electroconductive laminate according to the present invention, it is preferred that a difference ΔH of H1 and H2 be not greater than 0.3%, wherein H1 is a haze value of the transparent electroconductive laminate, and H2 is a haze value of a transparent electroconductive laminate after immersion into a strong acid aqueous solution at 40° C. for three minutes and dried, wherein the strong acid aqueous solution is obtained by a mixing of 12 N hydrochloric acid, 16 N nitric acid and water in a mass ratio of 12 N hydrochloric acid:16 N nitric acid:water being 3.3:1.0:7.6. In this context, the haze value H1 means a haze value at the portion of the reference numeral (13) in FIG. 1, and the haze value H2 means a haze value at the portion of the reference numeral (11) in FIG. 1. Then, in the transparent electroconductive laminate according to the present invention, it is preferred that the difference ΔH of haze value H1 and haze value H2 be not greater than 0.3%. In this case, in the transparent electroconductive laminate according to the present invention, it follows that there is almost no difference of the haze value between a part where the transparent electrically conducting layer (7) exists and a part where the transparent electrically conducting layer (7) does not exist. This achieves an extremely high level of visibility.

A Haze value of the transparent electroconductive laminate is obtained by calculating the following formula, in conformity with JIS (Japanese Industrial Standard) K7105:

$$H(\%) = \frac{Td}{Tt} \times 100$$

H: a Haze value (a fogging value) (%)
$T_d$: a diffuse transmittance (%)
$T_t$: a total light transmittance (%)

A total light transmittance ($T_t$ (%)) is obtained by measuring an incident light intensity ($T_0$) for a hard coat film and a total transmitted light intensity ($T_1$) through the hard coat film, and calculating the following formula:

$$Tt(\%) = \frac{T1}{T0} \times 100$$

Measurement of a haze value can be performed by use of, for example, a haze meter (manufactured by Suga Test Instruments Co., Ltd.).

Antiblocking Layer

The transparent electroconductive laminate according to the present invention has a structure in which a high refractive index antiblocking layer, a color difference adjusting layer, and a transparent electrically conducting layer are formed in this order on at least one surface of a transparent polymer substrate.

The transparent electroconductive laminate may optionally have an antiblocking layer formed on the other side of the transparent polymer substrate.

Forming the antiblocking layer on the other side of the substrate can prevent occurrence of blocking in a production process of the transparent electroconductive laminate, which provides improved preservation stability.

The antiblocking layer mentioned in this section may be the high refractive index antiblocking layer described above, or an antiblocking layer other than the high refractive index antiblocking layer.

A composition for forming an antiblocking layer other than the high refractive index antiblocking layer includes, for example, a composition for an antiblocking layer containing a first component and a second component. It may be preferable that the composition is a composition for an antiblocking layer in which a difference of SP values (ΔSP) of the first component (SP1) and the second component (SP2) is within a range of 1 to 2, and phase separation occurs between the first component and the second component after the composition for forming an antiblocking layer is applied, to form an antiblocking layer having a microscopic convexoconcave on its surface.

An unsaturated double bond containing acrylic copolymer is used as the first component.

The unsaturated double bond containing acrylic copolymer includes, for example, a resin obtained by copolymerization of (meth)acrylic monomer and other ethylenically unsaturated double bond containing monomer;

a resin obtained by a reaction of (meth)acrylic monomer with other ethylenically unsaturated double bond and epoxy group containing monomer; and a resin obtained by addition reaction of a component having both of an unsaturated double bond and other functional group, for example, acrylic acid or glycidyl acrylate, to a resin obtained by a reaction of (meth)acrylic monomer with other ethylenically unsaturated double bond and isocyanate containing monomer.

These unsaturated double bond containing acrylic copolymers can be used with alone or a combination of two or more. The unsaturated double bond containing acrylic copolymer may preferably have a weight-average molecular weight of 2000 to 100000, more preferably 5000 to 50000.

A polyfunctional unsaturated double bond containing monomer or oligomer thereof may be preferably used as the second component (monomer or oligomer).

An "oligomer" used in the present specification means a polymerization product having a repeat unit, in which the number of the repeat unit is 3 to 10.

The polyfunctional unsaturated double bond containing monomer includes, for example, a polyfunctional acrylate obtained by dealcoholization reaction of a polyalcohol and (meth)acrylate, specifically, dipentaerythritol hexa(meta) acrylate, dipentaerythritol penta(meta)acrylate, trimethylol propane tri(meta)acrylate, the trimethylolpropane tetra(meta)acrylate, neopentylglycol di(meta)acrylate, and the like. In addition, an acrylate monomer having polyethylene glycol structure such as polyethylene glycol #200 diacrylate (produced by Kyoeisha Chemical Co., Ltd.) may be used. These polyfunctional unsaturated double bond containing monomers can be used with alone or a combination of two or more.

In case that the first component and the second component are the above combinations, a suitable solvent includes, for example, a ketone solvent such as methyl ethyl ketone, acetone, methyl isobutyl ketone, cyclohexanone and the like; an alcohol solvent such as methanol, ethanol, propanol, isopropanol, butanol and the like; an ether solvent such as anisole, phenetole, propylene glycol monomethylether, ethyleneglycol dimethyl ether, ethyleneglycol diethyl ether, diethyleneglycol dimethyl ether, diethyleneglycol diethyl ether, and the like. These solvents may be used with alone or a combination of two or more.

The composition for forming an antiblocking layer may preferably contain a photopolymerization initiator. The photopolymerization initiator includes, for example, 2-hydroxy-2-methyl-1-phenyl propan-1-one, 1-hydroxy cyclohexyl phenyl ketone, 2-methyl-1-[4-(methylthio)phenyl]-2-morpholino propan-1-one, 2,2-dimethoxy-1,2-diphenylethan-1-one, 2-benzyl-2-dimethylamino-1-(4-morpholino phenyl)-butanone-1, and the like.

In the composition for forming an antiblocking layer, a difference of SP values of the first component and the second component provides phase separation.

An antiblocking layer having microscopic convexoconcave on its surface can be formed by the phase separation.

The difference of SP values of the first component and the second component may preferably be not less than 1, more preferably within a range of 1 to 2.

When the difference of the first component and the second component is not less than 1, the first component and the second component are less compatible. Thus phase separation seems to occur between the first component and the second component after the composition for forming an antiblocking layer is applied.

The composition for forming an antiblocking layer may further contain conventional additives such as an antistatic agent, a plasticizer, a surfactant, an antioxidant, an ultraviolet absorber and the like.

The composition for forming an antiblocking layer may contain a conventional resin component in addition to the first component and the second component.

The composition for forming an antiblocking layer has a technical feature of obtaining a resin layer with convexoconcave without including particles such as resin particles. Therefore the composition for forming an antiblocking layer may preferably include no resin particles.

On the other hand, the composition for forming an antiblocking layer may optionally contain at least one of inorganic particles, organic particles and a complex material thereof.

These particles may be added not for the purpose of forming convexoconcave on a surface of the resin layer. These particles may be added for the purpose of controlling phase separation and a segregation to obtain more microscopic convexoconcave. These particles may have a mean diameter of not greater than 0.5 μm, preferably 0.01 μm to 0.3 μm. When the mean diameter is more than 0.5 μm, a transparency may slightly be deteriorated.

Examples of the inorganic particles include at least one selected from the group consisting of silica, alumina, titania, zeolite, mica, synthetic mica, calcium oxide, zirconium oxide, zinc oxide, magnesium fluoride, smectite, synthetic smectite, vermiculite, ITO (indium oxide/tin oxide), ATO (antimony oxide/tin oxide), tin oxide, indium oxide and antimony oxide.

Examples of the organic particles include at least one selected from the group consisting of acrylic, olefin, polyether, polyester, urethane, polyester, silicone, polysilane, polyimide and fluorine particles.

The composition for forming an antiblocking layer can be prepared by mixing the first component and the second component, and an optional solvent, and optional additives such as a photopolymerization initiator, a catalyst, a photosensitizer.

A mass ratio of the first component and the second component in the composition for forming an antiblocking layer may preferably satisfy the following formula, the first composition:the second composition being 0.1:99.9 to 50:50, more preferably 0.3:99.7 to 20:80, most preferably 0.5:99.5 to 10:90.

In case that an additive such as a photopolymerization initiator, a catalyst or a photosensitizer are included in the composition, total amount of the additives may preferably be 0.01 to 20 parts by mass providing that 100 parts by mass of a total mass of the first component and the second component (a total of all these components is called "resin components"), more preferably 1 to 10 parts by mass.

In case that a solvent are included in the composition, an amount of the solvent may preferably be 1 to 9900 parts by mass providing that 100 parts by mass of a total mass of the first component and the second component, more preferably 10 to 900 parts by mass.

The composition for forming an antiblocking layer is applied and cured to form an antiblocking layer having a microscopic convexoconcave on its surface. A method for applying the composition for forming an antiblocking layer may include, for example, a dip coating method, an air knife coating method, a curtain coating method, a roller coating method, a wire bar coating method, a gravure coating method, an extrusion coating method and the like. A thickness of the antiblocking layer may be, for example 0.01 µm to 20 µm.

After applying the composition for forming an antiblocking layer, phase separation and curing are generated by irradiation of light. As the irradiation of light, a light having exposure value of, for example, 0.1 to 3.5 J/cm$^2$, preferably 0.5 to 1.5 J/cm$^2$, may be used. A wavelength region of the irradiation of light is not limited and may appropriately be, for example, not greater than 360 nm. A light with such wavelength can be obtained by a high-pressure mercury lamp, an extra high-pressure mercury lamp and the like. Irradiation of the light provides phase separation and curing.

Touch Panel

A touch panel according to the present invention has the transparent electroconductive laminate. The touch panel according to the present invention includes, for example, an electrostatic capacity type touch panel. The transparent electroconductive laminate according to the present invention may also be used in a resistive film type touch panel.

An embodiment of layer formation in use of the transparent electroconductive laminate as a substrate for a touch panel includes the following constructions:

a transparent electrically conductive layer/a color difference adjusting layer/a high refractive index antiblocking layer/a transparent polymer substrate;

a transparent electrically conductive layer/a metal-oxide layer/a color difference adjusting layer/a high refractive index antiblocking layer/a transparent polymer substrate;

a transparent electrically conductive layer/a color difference adjusting layer/a high refractive index antiblocking layer/a transparent polymer substrate/an antiblocking layer;

a transparent electrically conductive layer/a metal-oxide layer/a color difference adjusting layer/a high refractive index antiblocking layer/a transparent polymer substrate/an antiblocking layer;

a transparent electrically conductive layer/a color difference adjusting layer/a high refractive index antiblocking layer/a transparent polymer substrate/a high refractive index antiblocking layer/a color difference adjusting layer/a transparent electrically conductive layer;

a transparent electrically conductive layer/a metal-oxide layer/a color difference adjusting layer/a high refractive index antiblocking layer/a transparent polymer substrate/a high refractive index antiblocking layer/a color difference adjusting layer/a metal-oxide layer/a transparent electrically conductive layer;

an auxiliary electrode layer/a transparent electrically conductive layer/a color difference adjusting layer/a high refractive index antiblocking layer/a transparent polymer substrate;

an auxiliary electrode layer/a transparent electrically conductive layer/a metal-oxide layer/a color difference adjusting layer/a high refractive index antiblocking layer/a transparent polymer substrate;

an auxiliary electrode layer/a transparent electrically conductive layer/a color difference adjusting layer/a high refractive index antiblocking layer/a transparent polymer substrate/an antiblocking layer;

an auxiliary electrode layer/a transparent electrically conductive layer/a metal-oxide layer/a color difference adjusting layer/a high refractive index antiblocking layer/a transparent polymer substrate/an antiblocking layer;

an auxiliary electrode layer/a transparent electrically conductive layer/a color difference adjusting layer/a high refractive index antiblocking layer/a transparent polymer substrate/a high refractive index antiblocking layer/a color difference adjusting layer/a transparent electrically conductive layer/an auxiliary electrode layer;

an auxiliary electrode layer/a transparent electrically conductive layer/a metal-oxide layer/a color difference adjusting layer/a high refractive index antiblocking layer/a transparent polymer substrate/a high refractive index antiblocking layer/a color difference adjusting layer/a metal-oxide layer/a transparent electrically conductive layer/an auxiliary electrode layer.

The auxiliary electrode layer referred to herein means a layer usable as an electrode material for wiring. As the material of the auxiliary electrode layer, one with a specific resistance of $1\times10^{-6}$ Ωcm or more and $1\times10^{-4}$ Ωcm or less is desirable. When a metal material with a specific resistance of less than $1\times10^{-6}$ Ωcm is used, the layer is unstable from the viewpoints of uses and functions and it becomes difficult to form the layer as a thin film. On the other hand, when a metal material with a specific resistance of more than $1\times10^{-4}$ Ωcm is used, the resistance value becomes higher at the time of forming fine wiring since the resistance value is too high. For the foregoing reasons, as a metal suitable for practical use, a single metal selected from the group of Cu, Ag, Al, Au, Ni, Ni/Cr and Ti, or an alloy composed of a plurality of metals is recommended. In particular, from the points of being a metal which is high in electrical conductivity and excellent in processability such as pattern etching and electroplating, being satisfactory in electrical and mechanical connectability between an electrode and a lead part of a circuit or the like (solder, an anisotropic conductive connector and the like), being strong against bending, being high in thermal conductivity and being inexpensive, Cu, Al and the like are preferred and Cu is especially preferred.

Although the thickness of the auxiliary electrode layer is not particularly limited, the range of 0.001 to 100 µm in a usual design specification, preferably 0.01 to 25 µm, is recommended. Although a known treatment method can be used for the formation of an auxiliary electrode, it is preferred to form the electrode by a sputtering method. Afterward, as necessary, the conductivity may be enhanced by performing electrolytic/electroless wet metal plating or the like to further make the film thickness thick.

Moreover, as necessary, for the purpose of the protection (mainly oxidation prevention) of the auxiliary electrode layer, a high melting point metal layer composed of Ni, Ni/Cr, Cr, Ti, Mo and the like and an oxide layer composed of oxides thereof may be disposed as upper and lower layers of the auxiliary electrode layer.

EXAMPLES

The present invention will be further explained in detail in accordance with the following examples, but it is not construed as limiting the present invention to these examples. In the examples, "part" and "%" are based on mass unless otherwise specified.

Production Example 1: Production of a Phenolic Novolac Acrylate (1)

In a reaction vessel equipped with a stirrer, a thermometer, a dropping funnel and a reflux apparatus, 150 g of phenol novolac resin (a weight average molecular weight of 700 to 900, an epoxy equivalent of 150 to 200) and 550 g of epichlorohydrin were mixed, and 110 g of an aqueous solution of sodium hydroxide (48.5%) was added dropwise for 2 hours under a temperature of 100° C. and a reduced pressure of 100 to 200 mmHg.

After the reaction was finished, a reaction temperature of the reaction mixture was lowered to a room temperature, and excess amounts of an aqueous solution of sodium hydroxide were neutralized with an acid, then the reaction mixture was heated under a reduced pressure to remove excess amounts of epichlorohydrin.

Next, the resulting reaction mixture was dissolved in methyl isobutyl ketone, and a salt of byproduct was removed by water filtration to obtain a solution of phenol novolac epoxy resin.

To the resulting phenol novolac epoxy resin (solid contents: 100 parts by mass), 1000 ppm of methoquinone (hydroquinone monomethylether) and 2000 ppm of triphenylphosphine were added, and acrylic acid was added dropwise under a temperature of 100° C. so as to an acid value of the resulting resin became not greater than 1 mg KOH/g, to obtain a phenolic novolac epoxy acrylate (1). The obtained phenolic novolac epoxy acrylate (1) had a weight average molecular weight of 950, a hydroxyl value of 140 mgKOH/g and a refractive index of 1.572.

Production Example 2: Production of a Phenolic Novolac Acrylate (2)

In a reaction vessel equipped with a stirrer, a thermometer, a dropping funnel and a reflux apparatus, 150 g of phenol novolac resin (a weight average molecular weight of 900 to 1100, an epoxy equivalent of 150 to 200) and 550 g of epichlorohydrin were mixed, and 110 g of an aqueous solution of sodium hydroxide (48.5%) was added dropwise for 2 hours under a temperature of 100° C. and a reduced pressure of 100 to 200 mmHg.

After the reaction was finished, a reaction temperature of the reaction mixture was lowered to a room temperature, and excess amounts of an aqueous solution of sodium hydroxide were neutralized with an acid, then the reaction mixture was heated under a reduced pressure to remove excess amounts of epichlorohydrin.

Next, the resulting reaction mixture was dissolved in methyl isobutyl ketone, and a salt of byproduct was removed by water filtration to obtain a solution of phenol novolac epoxy resin.

To the resulting phenol novolac epoxy resin (solid contents: 100 parts by mass), 1000 ppm of methoquinone (hydroquinone monomethylether) and 2000 ppm of triphenylphosphine were added, and acrylic acid was added dropwise under a temperature of 100° C. so as to an acid value of the resulting resin became not greater than 1 mg KOH/g, to obtain a phenolic novolac epoxy acrylate (2). The obtained phenolic novolac epoxy acrylate (2) had a weight average molecular weight of 1200, a hydroxyl value of 137 mgKOH/g and a refractive index of 1.571.

Production Example 3: Production of an Unsaturated Double Bond Containing Acrylic Copolymer (I)

A mixture of 187.2 g of isobornyl methacrylate, 2.8 g of methyl methacrylate and 10.0 g of metacrylic acid was prepared. The mixture was constantly dropped to 360 g of propyleneglycol monomethyl ether charged in a reaction vessel equipped with a stirrer, a nitrogen introduction pipe, a cooling pipe and a dropping funnel under a nitrogen atmosphere and a heating at a temperature of 110° C. for three hours, simultaneously with a dropping of 80.0 g of a propyleneglycol monomethyl ether solution containing 2.0 g of tert-butyl peroxy-2-ethyl hexanoate, then the resulting reaction mixture was reacted at 110° C. for one hour.

Next, 17.0 g of a propyleneglycol monomethyl ether solution containing 0.2 g of tert-butyl peroxy-2-ethyl hexanoate was added to react at 110° C. for 30 minutes.

To the resulting reaction mixture, 6 g of a propylene glycol monomethyl ether solution containing 1.5 g of tetrabutylammonium bromide and 0.1 g of hydroquinone was added, then a solution containing 24.4 g of 4-hydroxybutyl acrylate glycidyl ether and 5.0 g of propylene glycol monomethyl ether was added for one hour under air bubbling, next the mixture was reacted for five hours.

An unsaturated double bond containing acrylic copolymer having 5500 of a number-average molecular weight and 18000 of a weight-average molecular weight was obtained. The resin had a SP value of 9.7 and Tg of 92° C.

Preparation Example 1: Preparation of a Composition for Forming an Antiblocking Layer (I)

The unsaturated double bond containing acrylic copolymer (1) (10 g) obtained by Production example 3 as a first component, 100 g of dipentaerythritol hexaacrylate (SP value: 12.1) as a second component and 5 g of Irgacure 184 as a reactive photopolymerization initiator were successively added, and 245 g of isobutyl alcohol was added to dissolve, then a composition for forming an antiblocking layer was obtained.

Example E1

Formation of Hard Coat Layer

A hard coating composition was prepared by using the phenolic novolac epoxy acrylate (1) obtained by Production example 1 as a component (A) and an ethoxylated orthophenylphenol acrylate (an acrylate having 1 mol of ethylene oxide structure, a viscosity at 25° C. of 130 mPa·s and a refractive index of 1.577) as a component (B). Raw materials shown in Table 1 were mixed in the solid amounts shown in Table 1, and were stirred to obtain a hard coating composition.

The viscosity at 25° C. of the component (B), the ethoxylated orthophenylphenol acrylate, was measured by a B-type viscometer (TVB-22L, manufactured by Toki Sangyo co., ltd.) and a M1 Rotor at a number of rotations of 60 rpm after 100 ml of the component (B), the ethoxylated orthophenylphenol acrylate, was sampled in a container as a test sample and was kept under a temperature of 20° C. The refractive index of the component (B) was measured by an Abbe's refractometer in conformity with JIS (Japanese Industrial Standard) K0062.

In addition, the resulting hard coating composition was dropped on an optical PC film (trade name Pureace, manufactured by Teijin Limited, 100 μm) and was coated with a bar coater #9.

After the coating, the resulting coat was dried at 70° C. for one minute and was irradiated by ultraviolet rays of 350 mJ with a ultraviolet ray irradiator (manufactured by Fusion) to obtain a hard coat film composed of the polycarbonate film and a hard coat layer having a thickness of 3.0 μm.

Formation of Color Difference Adjusting Layer

A dispersion of 15% titanium oxide (an average primary particle diameter: 40 nm) was diluted to a concentration of 5% in isobutyl alcohol. An urethane acrylate (an ultraviolet curing monomer, UN-3320HS, produced by Negami Chemical Industrial Co., Ltd.) was diluted to a concentration of 5% in methyl isobutyl ketone (MIBK). The dilute solution of titanium oxide (40 parts by mass) and 0.25 part by mass of a photopolymerization initiator (Irgacure 184, produced by BASF corporation) was mixed with 100 parts by mass of the dilute solution of urethane acrylate, and the resulting mixture was diluted to a concentration of 2.5% by mass in isobutyl alcohol (IBA), and coated with a bar coater #3.

After the coating, the resulting coat was dried at 70° C. for one minute and was irradiated by ultraviolet rays of 350 mJ with a ultraviolet ray irradiator (manufactured by Fusion) to obtain a color difference adjusting layer on the hard coat layer.

Formation of Transparent Electrically Conducting Layer

On the resulting color difference adjusting layer, an ITO layer was formed by a sputtering method in use of indium oxide-tin oxide target with a density of arrangement of 98% containing indium oxide and tin oxide with a mass ratio of 95:5, to obtain an amorphous ITO layer. A thickness of the resulting ITO layer was about 20 nm, and a surface electrical resistance after formation of the layer was about 210 Ω/square.

Then, a heat treatment at 130° C. for 90 minutes was performed to crystallize the transparent electrically conducting layer (ITO layer), to obtain a transparent electroconductive laminate. The resulting electrically conducting layer after crystallization of ITO layer had a surface electrical resistance of about 150 Ω/square.

The characteristics of the resulting transparent electroconductive laminate were shown in Table 1.

Examples E2 to E5

In a formation of a hard coat layer, a hard coat layer was formed in the same manner as in Example E1 except that its content and composition ratio of a hard coating composition was changed as shown in Table 1.

Then, in a formation of a color difference adjusting layer, a color difference adjusting layer was formed on the hard coat layer in the same manner as in Example E1 except that an amount of a diluted concentration of titanium oxide was changed as shown in Table 1.

Next, a transparent electrically conducting layer was formed on the color difference adjusting layer in the same manner as in Example E1.

As for Example E3, a transparent electroconductive laminate was obtained in use of an optical PC film (trade name Pureace C110, manufactured by Teijin Limited, 70 μm).

Examples E6 to E10, E12, E14 and E15

In a formation of a hard coat layer, a hard coat layer was formed in the same manner as in Example E1.

Then, in a formation of a color difference adjusting layer, a color difference adjusting layer was formed on the hard coat layer in the same manner as in Example E1 except that an amount of a diluted concentration of titanium oxide was changed as shown in Table 1.

Next, a transparent electrically conducting layer was formed on the color difference adjusting layer in the same manner as in Example E1.

As for Examples E7 and E8, a transparent electroconductive laminate was obtained in use of an optical PET film (trade name Teijin Tetron KEFW, manufactured by Teijin DePont Films Japan Limited, 188 μm).

As for Example E9, a transparent electroconductive laminate was obtained in use of an optical PET film (trade name Teijin Tetron KEFW, manufactured by Teijin DePont Films Japan Limited, 125 μm).

As for Example E10, a transparent electroconductive laminate was obtained in use of an optical PET film (trade name Teijin Tetron KEL86W, manufactured by Teijin DePont Films Japan Limited, 50 μm).

As for Example E14, a transparent electroconductive laminate was obtained in use of an optical modified PC film (trade name Pureace WR W-142, manufactured by Teijin Limited, 75 μm).

As for Example E15, a transparent electroconductive laminate was obtained in use of an optical modified PC film (trade name Pureace WR S-148, manufactured by Teijin Limited, 50 μm).

Example E11

In a formation of a hard coat layer, a hard coat layer was formed in the same manner as in Example E1.

A dispersion of 15% titanium oxide (an average primary particle diameter: 40 nm) was diluted to a concentration of 5% in isobutyl alcohol. An urethane acrylate (an ultraviolet curing monomer, UN-3320HS, produced by Negami Chemical Industrial Co., Ltd.) was diluted to a concentration of 5% in methyl isobutyl ketone (MIBK). The dilute solution of titanium oxide (40 parts by mass) and 0.25 part by mass of a photopolymerization initiator (Irgacure 184, produced by BASF corporation) was mixed with 100 parts by mass of the dilute solution of urethane acrylate, and the resulting mixture was diluted to a concentration of 2.5% by mass in isobutyl alcohol (IBA), and coated with a bar coater #3.

After the coating, the resulting coat was dried at 70° C. for one minute and was irradiated by ultraviolet rays of 350 mJ with a ultraviolet ray irradiator (manufactured by Fusion) to obtain a color difference adjusting layer 1 on the hard coat layer.

Then, 40 parts by mass of 5% dispersion of magnesium fluoride and 0.25 part by mass of a photopolymerization initiator (Irgacure 184, produced by BASF corporation) was mixed with 100 parts by mass of the dilute solution of urethane acrylate, and the resulting mixture was diluted to a concentration of 2.5% by mass in isobutyl alcohol (IBA), and coated with a bar coater #3.

After the coating, the resulting coat was dried at 70° C. for one minute and was irradiated by ultraviolet rays of 350 mJ with a ultraviolet ray irradiator (manufactured by Fusion) to obtain a color difference adjusting layer 2 on the color difference adjusting layer 1.

Next, a transparent electrically conducting layer was formed on the color difference adjusting layer 2 in the same manner as in Example E1.

Example E13

A hard coat layer, a color difference adjusting layer 1, a color difference adjusting layer 2 and a transparent electrically conducting layer were sequentially formed in the same manner as in Example E11, except that a diluted solution obtained by mixing 100 parts by mass of silicone acrylate (EB-1360, produced by Daicel-Allnex Ltd.) and 5 part by mass of a photopolymerization initiator (Irgacure 184, produced by BASF corporation) and diluting to a concentration of 2.5% in methyl isobutyl ketone was used in a formation of a color difference adjusting layer 2.

Example E14

A hard coat layer was formed in the same manner as in Example E1. On the other surface of the film, the composition for forming an antiblocking layer (I) obtained by Preparation example 1 was coated with a bar coater #9.

After the coating, the resulting coat was dried at 70° C. for one minute and was irradiated by ultraviolet rays of 350 mJ with a ultraviolet ray irradiator (manufactured by Fusion) to obtain an antiblocking layer having a thickness of 3.0 μm on the other surface of the hard coat layer.

Then, a color difference adjusting layer was formed on the hard coat layer in the same manner as in Example E1.

Next, a transparent electrically conducting layer was formed on the color difference adjusting layer in the same manner as in Example E1.

Comparative Examples E1 and E2

A hard coat layer was formed in the same manner as in Example E1 except that its content and composition ratio of a hard coating composition was changed as shown in Table 2. Then, a transparent electrically conducting layer was formed in the same manner as in Example E1.

Comparative Examples E3 to E9

A hard coat layer was formed in the same manner as in Example E9 except that its content and composition ratio of a hard coating composition was changed as shown in Table 2.

Comparative Example E10

A transparent electrically conducting layer was formed in the same manner as in Example E9 except that an amount of a diluted concentration of titanium oxide was changed as shown in Table 2 in a formation of a color difference adjusting layer.

In use of transparent electrically conducting layers obtained by the above Examples and Comparative examples, the tests described below were examined. Obtained test results were shown in Tables 1 and 2.

Measurement of a Reflectance Difference ΔR

A reflectance (R1) of the transparent electrically conducting layers obtained by the Examples and Comparative Examples were measured at an incident angle of 10 degrees with a spectrophotometer (U-3000, produced by Hitachi Ltd.) in conformity with JIS K5600-4-5.

A wavelength of the light source used in a measurement of the reflectance was in a range of 500 to 750 nm.

Then, the transparent electrically conducting layers obtained by the Examples and Comparative Examples were immersed into a strong acid aqueous solution obtained by a mixing of 12 N hydrochloric acid, 16 N nitric acid and water in a mass ratio of 12 N hydrochloric acid:16 N nitric acid:water being 3.3:1.0:7.6, at a temperature of 40° C. for three minutes and dried. To the treated transparent electrically conducting layers, a light source having a wavelength in a range of 500 to 750 nm was irradiated to measure a reflectance (R2).

In the measurement, the reflectance (R1) means a reflectance where a transparent electrically conducting layer exists, as shown a part (13) in FIG. 1.

The reflectance (R2) means a reflectance where a transparent electrically conducting layer does not exist, as shown a part (11) in FIG. 1.

A difference of R1 and R2 was referred to as ΔR. A maximum ΔR value within a wavelength range of 500 nm to 700 nm was shown in Tables 1 and 2.

Measurement of a Haze Value Difference ΔH

A Haze value of the transparent electrically conducting layers obtained by the Examples and Comparative Examples were measured with a Haze meter (manufactured by Suga Test Instruments Co., Ltd.), in conformity with JIS K7105, to obtain a haze value (H1).

Then, the transparent electrically conducting layers obtained by the Examples and Comparative Examples were immersed into a strong acid aqueous solution obtained by a mixing of 12 N hydrochloric acid, 16 N nitric acid and water in a mass ratio of 12 N hydrochloric acid:16 N nitric acid:water being 3.3:1.0:7.6, at a temperature of 40° C. for three minutes and dried. A haze value of the treated transparent electrically conducting layers was measured in the same manner described above to obtain a haze value (H2).

In the measurement, the haze value (H1) means a haze value where a transparent electrically conducting layer exists, as shown a part (13) in FIG. 1.

The haze value (R2) means a haze value where a transparent electrically conducting layer does not exist, as shown a part (11) in FIG. 1.

A difference of H1 and H2 was referred to as ΔH.

Evaluation Method of Interference Fringes

A test sample was affixed on a black acrylic plate with the size of 100 mm by 100 mm in use of an adhesive for optical film use to appear a coat layer of the test sample on the surface. A stand-type three-wavelength fluorescent light (SLH-399 model manufactured by Twinbird Corporation) was placed, and the test sample was placed perpendicularly below the fluorescent light in the distance between the light and the test sample being 10 cm, then the test sample was visually observed and evaluated under the following evaluation criteria. AS for a test sample having good evaluation result (○), a visual observation under the sunlight was performed.

○○: no interference fringes (interference pattern) are observed under either the three-wavelength fluorescent light or the sunlight.

○: no interference fringes (interference pattern) are observed under the three-wavelength fluorescent light, however a slight interference fringes are observed under the sunlight.

Δ: slight interference fringes (interference pattern) are observed.

x: interference fringes (interference pattern) are clearly observed.

Evaluation Method of Etching Mark

A patterned sample was prepared by etching treatment of immersing into a strong acid aqueous solution obtained by a mixing of 12 N hydrochloric acid, 16 N nitric acid and water in a mass ratio of 12 N hydrochloric acid:16 N nitric acid:water being 3.3:1.0:7.6, at a temperature of 40° C. for three minutes.

A stand-type three-wavelength fluorescent light (SLH-399 model manufactured by Twinbird Corporation) was placed, and the resulting patterned sample was placed perpendicularly below the fluorescent light in the distance between the light and the test sample being 10 cm, then the test sample was visually observed and evaluated under the following evaluation criteria. AS for a sample having good evaluation result (○), a visual observation under the sunlight was performed.

○○: hardly differentiating between a patterned part and a non-patterned part under either the three-wavelength fluorescent light or the sunlight ○: slightly differentiating between a patterned part and a non-patterned part under the sunlight, however hardly differentiating between a patterned part and a non-patterned part under the three-wavelength fluorescent light Δ: slightly differentiating between a patterned part and a non-patterned part under the three-wavelength fluorescent light x: clearly differentiating between a patterned part and a non-patterned part under the three-wavelength fluorescent light Adhesion Evaluation The adhesion test was performed in accordance with JIS K5400. Each of the transparent electroconductive laminates obtained in Examples and Comparative Examples was subjected to cross cutting so as to have 100 pieces of cut squares (grid pattern) with an area of 1 mm². Then, a cellophane pressure-sensitive adhesive tape was completely stuck on the prepared grid pattern and one end of the tape was pulled upward and peeled off. This peeling operation was performed three times on the same part. Afterward, the number of squares from which a part of the laminate was peeled off was judged according to the following criteria.

10: There is no square from which a part of the laminate was peeled off.

8: There are not more than 5 squares from which a part of the laminate was peeled off.

6: There are more than 5 and not more than 15 squares from which a part of the laminate was peeled off.

4: There are more than 15 and not more than 35 squares from which a part of the laminate was peeled off.

2: There are more than 35 and not more than 65 squares from which a part of the laminate was peeled off.

0: There are more than 65 and not more than 100 squares from which a part of the laminate was peeled off.

TABLE 1

|  |  | EXAMPLE | | | | | | |
|---|---|---|---|---|---|---|---|---|
|  |  | E1 | E2 | E3 | E4 | E5 | E6 | E7 |
| substrate | Type of substrate | PC | PC | PC | PC | PC | PC | PET |
|  | Thickness (μm) | 100 | 100 | 70 | 100 | 100 | 100 | 188 |
| Hard coat layer | Phenol novolac epoxy acrylate (1) | 72.50 | 85.00 | 60.00 |  | 60.00 | 72.50 | 72.50 |
|  | Phenol novolac epoxy acrylate (2) |  |  |  | 60.00 |  |  |  |
|  | Ethoxylated orthophenylphenol acrylate | 22.50 | 15.00 | 15.00 | 15.00 | 30.00 | 22.50 | 22.50 |
|  | Pentaerythritol triacrylate | 5.00 |  | 25.00 | 25.00 | 10.00 | 5.00 | 5.00 |
|  | I-184 | 5.00 | 5.00 | 5.00 | 5.00 | 5.00 | 5.00 | 5.00 |
|  | Bisphenol A ethyleneoxide-modified (2 mol) diacrylate |  |  |  |  |  |  |  |
|  | Acryloyl morpholine |  |  |  |  |  |  |  |
|  | High refractive index filler 1 (zirconia: ZRMIBK30 WT %) |  |  |  |  |  |  |  |
|  | High refractive index filler 2 (titania: TiMIBK15 WT %) |  |  |  |  |  |  |  |
|  | Bifunctional urethane acrylate (NV100: CN-9893) |  |  |  |  |  |  |  |
|  | Methyl isobutyl ketone | 18.13 | 21.25 | 15.00 | 15.00 | 15.00 | 18.13 | 18.13 |
|  | Isobutyl alcohol | 55.10 | 53.54 | 56.67 | 56.67 | 56.67 | 55.10 | 55.10 |
|  | Butyl acetate | 55.10 | 53.54 | 56.67 | 56.67 | 56.67 | 55.10 | 55.10 |
|  | Total amounts | 233.33 | 233.33 | 233.33 | 233.33 | 233.33 | 233.33 | 233.33 |
|  | Film thickness (μm) | 3.0 | 5.0 | 5.0 | 5.0 | 3.0 | 6.0 | 6.5 |
|  | A refractive index | 1.582 | 1.583 | 1.571 | 1.571 | 1.581 | 1.582 | 1.582 |
| Color difference adjusting layer evaluation | Total mass of particles (parts) | 40 | 40 | 37 | 37 | 40 | 40 | 30 |
|  | Δmax |R1-R2| (%) (500-750) | 0.65 | 0.54 | 0.72 | 0.68 | 0.63 | 0.63 | 0.58 |
|  | ΔHaze (%) | 0.1 | 0.1 | 0.0 | 0.1 | 0.1 | 0.1 | 0.0 |
|  | Evaluation of interference fringes | ○○ | ○○ | ○ | ○ | ○○ | ○○ | ○ |
|  | Evaluation of etching mark | ○○ | ○○ | ○ | ○ | ○○ | ○○ | ○○ |
|  | Adhesion evaluation | 10 | 10 | 10 | 10 | 10 | 10 | 10 |

TABLE 1-continued

| | | EXAMPLE | | | | | | |
|---|---|---|---|---|---|---|---|---|
| | | E8 | E9 | E10 | E11 | E12 | E13 | E14 |
| substrate | Type of substrate | PET | PET | PET | PC | PC | PC | modifiedPC-1 |
| | Thickness (μm) | 188 | 125 | 50 | 100 | 100 | 100 | 70 |
| Hard coat layer | Phenol novolac epoxy acrylate (1) | 72.50 | 72.50 | 72.50 | 72.50 | 72.50 | 72.50 | 72.50 |
| | Phenol novolac epoxy acrylate (2) | | | | | | | |
| | Ethoxylated orthophenylphenol acrylate | 22.50 | 22.50 | 22.50 | 22.50 | 22.50 | 22.50 | 22.50 |
| | Pentaerythritol triacrylate | 5.00 | 5.00 | 5.00 | 5.00 | 5.00 | 5.00 | 5.00 |
| | I-184 | 5.00 | 5.00 | 5.00 | 5.00 | 5.00 | 5.00 | 5.00 |
| | Bisphenol A ethyleneoxide-modified (2 mol) diacrylate | | | | | | | |
| | Acryloyl morpholine | | | | | | | |
| | High refractive index filler 1 (zirconia: ZRMIBK30 WT %) | | | | | | | |
| | High refractive index filler 2 (titania: TiMIBK15 WT %) | | | | | | | |
| | Bifunctional urethane acrylate (NV100: CN-9893) | | | | | | | |
| | Methyl isobutyl ketone | 18.13 | 18.13 | 18.13 | 18.13 | 18.13 | 18.13 | 18.13 |
| | Isobutyl alcohol | 55.10 | 55.10 | 55.10 | 55.10 | 55.10 | 55.10 | 55.10 |
| | Butyl acetate | 55.10 | 55.10 | 55.10 | 55.10 | 55.10 | 55.10 | 55.10 |
| | Total amounts | 233.33 | 233.33 | 233.33 | 233.33 | 233.33 | 233.33 | 233.33 |
| | Film thickness (μm) | 3.0 | 6.5 | 0.1 | 6.0 | 6.0 | 6.0 | 5.0 |
| | A refractive index | 1.582 | 1.582 | 1.582 | 1.582 | 1.582 | 1.582 | 1.582 |
| Color difference adjusting layer | Total mass of particles (parts) | 30 | 30 | 35 | 40/100 | 200 | 40/0 | 40 |
| evaluation | Δmax |R1−R2| (%) (500-750) | 0.61 | 0.46 | 0.39 | 0.28 | 0.97 | 0.83 | 0.71 |
| | ΔHaze (%) | 0.0 | 0.1 | 0.1 | 0.2 | 0.3 | 0.3 | 0.1 |
| | Evaluation of interference fringes | Δ | Δ | ○○ | ○○ | ○○ | ○○ | ○○ |
| | Evaluation of etching mark | ○ | ○ | ○○ | ○○ | Δ | Δ | ○ |
| | Adhesion evaluation | 10 | 10 | 10 | 10 | 8 | 8 | 10 |

TABLE 2

| | | COMPARATIVE EXAMPLE | | | | | | | | | |
|---|---|---|---|---|---|---|---|---|---|---|---|
| | | E1 | E2 | E3 | E4 | E5 | E6 | E7 | E8 | E9 | E10 |
| substrate | Type of substrate | PC | PC | PET | PET | PET | PET | PET | PET | PET | PET |
| | Thickness (μm) | 100 | 100 | 125 | 125 | 125 | 125 | 125 | 125 | 125 | 125 |
| Hard coat layer | Phenol novolac epoxy acrylate (1) | 95.00 | 55.00 | | 60.00 | | | | | | 72.50 |
| | Phenol novolac epoxy acrylate (2) | | | | | | | | | | |
| | Ethoxylated orthophenylphenol acrylate | | 5.00 | 45.00 | 15.00 | | | | | 22.50 | |
| | Pentaerythritol triacrylate | | | | 25.00 | 60.00 | 60.00 | 40.00 | 24.00 | 24.00 | 5.00 |
| | I-184 | 5.00 | 5.00 | 5.00 | 5.00 | 5.00 | 5.00 | 5.00 | 5.00 | 5.00 | 5.00 |
| | Bisphenol A ethyleneoxide-modified (2 mol) diacrylate | | | | 85.00 | | | | | | |
| | Acryloyl morpholine | | | | 15.00 | | | | | | |
| | High refractive index filler 1 (zirconia: ZRMIBK30 WT %) | | | | | | 40.00 | | 40.00 | | |
| | High refractive index filler 2 (titania: TiMIBK15 WT %) | | | | | 40.00 | | | | 40.00 | |
| | Bifunctional urethane acrylate (NV100: CN-9893) | | | | | | | 60.00 | 36.00 | 36.00 | |

TABLE 2-continued

| | | COMPARATIVE EXAMPLE | | | | | | | | | |
|---|---|---|---|---|---|---|---|---|---|---|---|
| | | E1 | E2 | E3 | E4 | E5 | E6 | E7 | E8 | E9 | E10 |
| | Methyl isobutyl ketone | 23.75 | 13.75 | | 15.00 | 93.33 | 226.67 | 60.00 | 129.33 | 262.67 | 18.13 |
| | Isobutyl alcohol | 52.29 | 57.29 | 64.17 | 56.67 | 17.50 | 9.17 | 34.17 | 14.08 | 78.67 | 55.10 |
| | Butyl acetate | 52.29 | 57.29 | 64.17 | 56.67 | 17.50 | 9.17 | 34.17 | 14.08 | 78.67 | 55.10 |
| | Total amounts | 233.33 | 233.33 | 233.33 | 233.33 | 233.33 | 350.00 | 233.33 | 262.50 | 525.00 | 233.33 |
| | Film thickness (μm) | 5.0 | 5.0 | 6.0 | 6.0 | 6.0 | 6.0 | 6.0 | 6.0 | 6.0 | 6.0 |
| | A refractive index | 1.579 | 1.591 | 1.565 | 1.560 | 1.585 | 1.615 | 1.510 | 1.584 | 1.614 | 1.582 |
| Color difference adjusting layer evaluation | Total mass of particles (parts) | 40 | 40 | 30 | 30 | 30 | 30 | 30 | 30 | 30 | 300 |
| | Δmax |R1-R2| (%) (500-750) | 0.83 | 0.76 | 1.65 | 1.92 | 2.75 | 3.21 | 2.33 | 2.99 | 3.12 | 1.21 |
| | ΔHaze (%) | 0.4 | 0.6 | 0.1 | 0.2 | 0.2 | 0.3 | 0.1 | 0.1 | 0.5 | 0.3 |
| | Evaluation of interference fringes | Δ | Δ | x | x | x | x | x | x | x | o |
| | Evaluation of etching mark | x | x | x | x | x | x | x | x | x | Δ |
| | Adhesion evaluation | 8 | 8 | 10 | 10 | 10 | 8 | 10 | 10 | 8 | 4 |

In the Table 1 and Table 2, each term means as follows.

I-184: 1-hydroxycyclohexyl phenyl ketone, a photoinitiator.

Bisphenol A ethyleneoxide-modified (2 mol) diacrylate: Aronix M-211B manufactured by Toa gosei Co., Ltd., bisphenol A ethyleneoxide-modified (2 mol) diacrylate.

High refractive index filler 1: zirconia: ZRMIBK30WT %, zirconium oxide, manufactured by CIK NanoTec.

High refractive index filler 2: titania: TiMIBK15WT %, titanium oxides, manufactured by CIK NanoTec.

Bifunctional urethane acrylate: NV (non-volatile component) 100, CN-9893 manufactured by Sartomer Corp.

Each of the transparent electroconductive laminates obtained in Examples had ΔR of not greater than 1 and ΔH of not greater than 0.3%. These results show the transparent electroconductive laminate in Examples had excellent visibility even if the etching treatment was performed. In addition, appearance of interference fringes were not observed in the transparent electroconductive laminates obtained in Examples. Furthermore, the transparent electroconductive laminates had excellent etching mark property and adhesion property.

In example E14, in which the transparent electroconductive laminate had an antiblocking layer on the back of the substrate, it shows that the transparent electroconductive laminate had excellent visibility, prevention of interference fringes, etching mark property and adhesion property even if the transparent electroconductive laminate had the antiblocking layer. Thus the experimental results show that the present invention can use a transparent electroconductive laminate formed as a winding type.

Comparative examples E1 and E2 were a comparative example in which amounts of the components (A) and (B) were out of the claimed invention of the present application. In each of these comparative examples, the obtained transparent electroconductive laminates had ΔH of greater than 0.3%, which resulted in inferior visibility.

Comparative example E3 was a comparative example in which bisphenol A diacrylate was used in place of the component (A). In the comparative example, the obtained transparent electroconductive laminate had ΔR of greater than 1, which resulted in inferior visibility. In addition, appearance of interference fringes was observed.

Comparative example E4 was a comparative example in which acryloyl morpholine was used in place of the component (B). In the comparative example, the obtained transparent electroconductive laminate had ΔR of greater than 1, which resulted in inferior visibility. In addition, appearance of interference fringes was observed.

Comparative examples E5 and E6 were comparative examples in which zirconium oxide or titanium oxides were used as a high refractive index material, in place of using the components (A) and (B). In the comparative examples, the obtained transparent electroconductive laminates had ΔR of greater than 1, which resulted in inferior visibility. In addition, appearance of interference fringes was observed.

Comparative examples E7 to E9 were comparative examples in which a bifunctional urethane acrylate was used in order to provide an elongation to a hard coat layer. These comparative examples had a slightly-increased elongation. However, the obtained transparent electroconductive laminates had ΔR of greater than 1, which resulted in inferior visibility.

Comparative example 10 was a comparative example in which a total mass of particles in the color difference adjusting layer exceed 200 parts by mass. In the comparative example, adhesion property was deteriorated.

Figure 2:
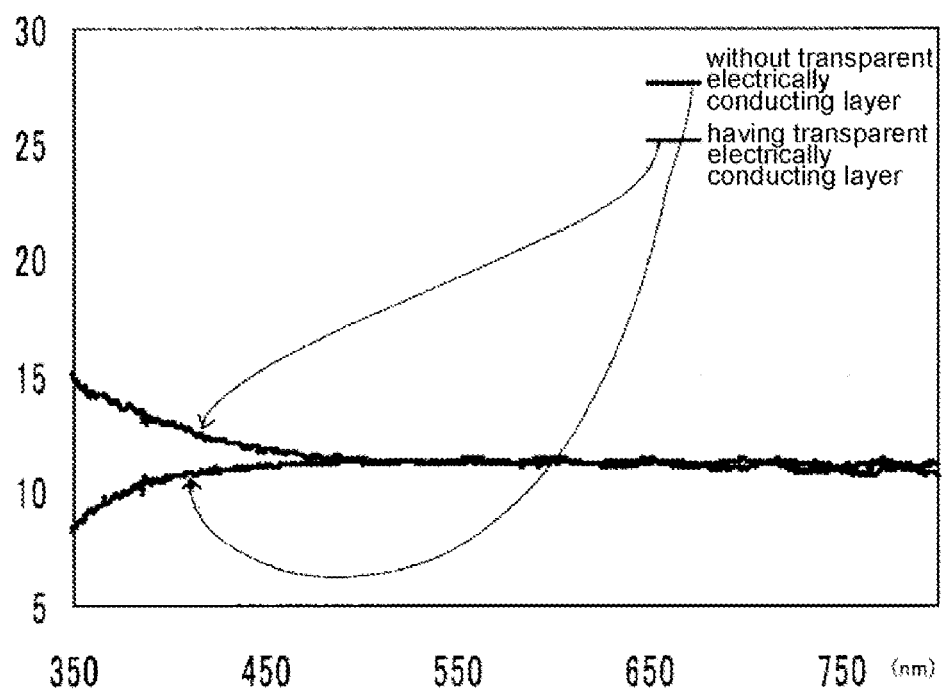
FIG. 2 is a graphical chart showing a reflectance of the transparent electroconductive laminate obtained in Example E9.
Figure 3:
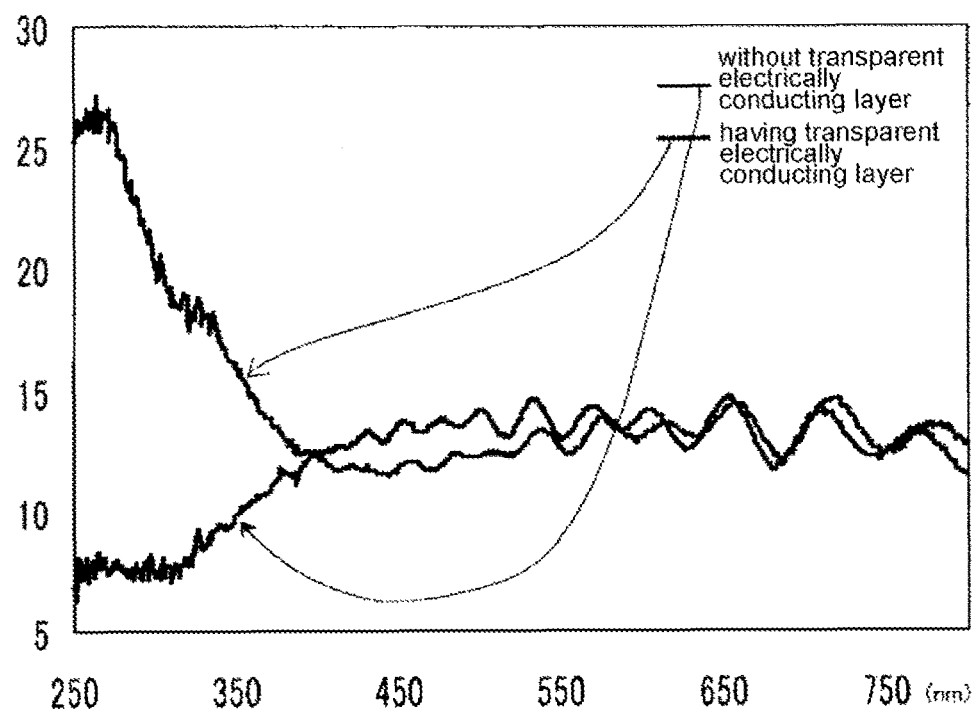
FIG. 3 is a graphical chart showing a reflectance of the transparent electroconductive laminate obtained in Comparative Example E4.

FIG. 2 is a graphical chart showing a reflectance of the transparent electroconductive laminate obtained in Example E9. FIG. 3 is a graphical chart showing a reflectance of the transparent electroconductive laminate obtained in Comparative Example E4. As shown in FIG. 2 and FIG. 3, the transparent electroconductive laminate in Example had extremely small reflectance difference ΔR between the parts where a transparent electrically conducting layer existed and did not exist.

Example F1

Formation of Hard Coat Layer

A hard coating composition was prepared by using the Phenolic novolac epoxy acrylate (1) obtained by Production example 1 as a component (A), an ethoxylated orthophenylphenol acrylate (an acrylate having 1 mol of ethylene oxide structure, a viscosity at 25° C. of 130 mPa·s and a refractive index of 1.577) as a component (B) and Ogsol EA-0200 (a fluorene unit-containing acrylate available from Osaka Gas Chemicals Co., Ltd., represented by the following formula (II)-1,

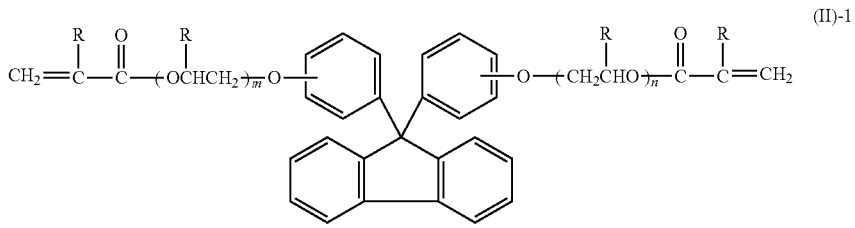

(II)-1 wherein each of R represents H, and m+n=2) as a component (C).

Raw materials shown in Table 3 were mixed in the solid amounts shown in Table 3, and were stirred to obtain a hard coating composition. The viscosity at 25° C. of the component (B), the ethoxylated orthophenylphenol acrylate, was measured by a B-type viscometer (TVB-22L, manufactured by Toki Sangyo co., ltd.) and a M1 Rotor at a number of rotations of 60 rpm after 100 ml of the component (B), the ethoxylated orthophenylphenol acrylate, was sampled in a container as a test sample and was kept under a temperature of 20° C. The refractive index of the component (B) was measured by an Abbe's refractometer in conformity with JIS (Japanese Industrial Standard) K0062.

The resulting hard coating composition was dropped on an optical PC film (trade name Pureace, manufactured by Teijin Limited, 100 μm) and was coated with a bar coater #9.

After the coating, the resulting coat was dried at 70° C. for one minute and was irradiated by ultraviolet rays of 350 mJ with a ultraviolet ray irradiator (manufactured by Fusion) to obtain a hard coat film composed of the polycarbonate film and a hard coat layer having a thickness of 3.0 μm.

Formation of Color Difference Adjusting Layer

A dispersion of 15% titanium oxide (an average primary particle diameter: 40 nm) was diluted to a concentration of 5% in isobutyl alcohol. An urethane acrylate (an ultraviolet curing monomer, UN-3320HS, produced by Negami Chemical Industrial Co., Ltd.) was diluted to a concentration of 5% in methyl isobutyl ketone (MIBK). The dilute solution of titanium oxide (40 parts by mass) and 0.25 part by mass of a photopolymerization initiator (Irgacure 184, produced by BASF corporation) was mixed with 100 parts by mass of the dilute solution of urethane acrylate, and the resulting mixture was diluted to a concentration of 2.5% by mass in isobutyl alcohol (IBA), and coated with a bar coater #3.

After the coating, the resulting coat was dried at 70° C. for one minute and was irradiated by ultraviolet rays of 350 mJ with a ultraviolet ray irradiator (manufactured by Fusion) to obtain a color difference adjusting layer on the hard coat layer.

Formation of Transparent Electrically Conducting Layer

On the resulting color difference adjusting layer, an ITO layer was formed by a sputtering method in use of indium oxide-tin oxide target with a density of arrangement of 98% containing indium oxide and tin oxide with a mass ratio of 95:5, to obtain an amorphous ITO layer. A thickness of the resulting ITO layer was about 20 nm, and a surface electrical resistance after formation of the layer was about 210 Ω/square.

Then, a heat treatment at 130° C. for 90 minutes was performed to crystallize the transparent electrically conducting layer (ITO layer), to obtain a transparent electroconductive laminate. The resulting electrically conducting layer after crystallization of ITO layer had a surface electrical resistance of about 150 Ω/square.

The characteristics of the resulting transparent electroconductive laminate were shown in Table 3.

Examples F2 to F5, F7 to F9

In a formation of a hard coat layer, a hard coat layer was formed in the same manner as in Example F1 except that its content and composition ratio of a hard coating composition was changed as shown in Table 3.

Then, a color difference adjusting layer was formed on the hard coat layer in the same manner as in Example F1 except that an amount of a diluted concentration of titanium oxide was changed as shown in Table 3.

Next, a transparent electrically conducting layer was formed on the color difference adjusting layer in the same manner as in Example F1.

As for Example F2, a transparent electroconductive laminate was produced in use of an optical PET film (trade name Teijin Tetron KEFW, manufactured by Teijin DePont Films Japan Limited, 188 μm).

As for Examples F3 and F7, a transparent electroconductive laminate was obtained in use of an optical PET film (trade name Teijin Tetron KEFW, manufactured by Teijin DePont Films Japan Limited, 125 μm).

As for Examples F4 and F5, a transparent electroconductive laminate was obtained in use of an optical PET film (trade name Teijin Tetron KEL86W, manufactured by Teijin DePont Films Japan Limited, 50 μm).

As for Example F8, a transparent electroconductive laminate was obtained in use of an optical modified PC film (trade name Pureace WR W-142, manufactured by Teijin Limited, 75 μm).

As for Example F9, a transparent electroconductive laminate was obtained in use of an optical modified PC film (trade name Pureace WR S-148, manufactured by Teijin Limited, 50 μm).

As for Example F4, Ogsol EA-F5503 (available from Osaka Gas Chemicals Co., Ltd.) was used as a component (C).

Example F6

In a formation of a hard coat layer, a hard coat layer was formed in the same manner as in Example F3.

A dispersion of 15% titanium oxide (an average primary particle diameter: 40 nm) was diluted to a concentration of 5% in isobutyl alcohol. An urethane acrylate (an ultraviolet curing monomer, UN-3320HS, produced by Negami Chemical Industrial Co., Ltd.) was diluted to a concentration of 5% in methyl isobutyl ketone (MIBK). The dilute solution of titanium oxide (40 parts by mass) and 0.25 part by mass of a photopolymerization initiator (Irgacure 184, produced by BASF corporation) was mixed with 100 parts by mass of the dilute solution of urethane acrylate, and the resulting mixture was diluted to a concentration of 2.5% by mass in isobutyl alcohol (IBA), and coated with a bar coater #3.

After the coating, the resulting coat was dried at 70° C. for one minute and was irradiated by ultraviolet rays of 350 mJ with a ultraviolet ray irradiator (manufactured by Fusion) to obtain a color difference adjusting layer 1 on the hard coat layer.

Then, 40 parts by mass of 5% dispersion of magnesium fluoride and 0.25 part by mass of a photopolymerization initiator (Irgacure 184, produced by BASF corporation) was mixed with 100 parts by mass of the dilute solution of urethane acrylate, and the resulting mixture was diluted to a concentration of 2.5% by mass in isobutyl alcohol (IBA), and coated with a bar coater #3.

After the coating, the resulting coat was dried at 70° C. for one minute and was irradiated by ultraviolet rays of 350 mJ with a ultraviolet ray irradiator (manufactured by Fusion) to obtain a color difference adjusting layer 2 on the color difference adjusting layer 1.

Next, a transparent electrically conducting layer was formed on the color difference adjusting layer 2 in the same manner as in Example F1 to obtain a transparent electroconductive laminate.

Comparative Examples F1 and F2

A hard coat layer was formed in the same manner as in Example F1 except that its content and composition ratio of a hard coating composition was changed as shown in Table 4. Then, a transparent electrically conducting layer was formed in the same manner as in Example F1.

As for Comparative Examples F1 and F2, a transparent electroconductive laminate was obtained in use of an optical PET film (trade name Teijin Tetron KEFW, manufactured by Teijin DePont Films Japan Limited, 125 μm).

In use of electrically conducting layers obtained by the above Examples and Comparative examples, a reflectance difference ΔR, a haze value difference ΔH, evaluation of interference fringes, etching mark, adhesion evaluation were performed. Obtained test results were shown in Tables 1, 2 and 3. Obtained test results were shown in Tables 3 and 4.

TABLE 3

| | | Example | | | | | | | | |
|---|---|---|---|---|---|---|---|---|---|---|
| | | F1 | F2 | F3 | F4 | F5 | F6 | F7 | F8 | F9 |
| substrate | Type of substrate | PC | PET | PET | PET | PET | PET | PET | modifiedPC-1 | modifiedPC-2 |
| | Thickness (μm) | 100 | 188 | 125 | 50 | 50 | 125 | 125 | 75 | 50 |
| Hard coat layer | Phenol novolac epoxy acrylate (1) | 70.00 | 40.00 | 50.00 | 50.00 | 50.00 | 50.00 | 50.00 | 72.50 | 72.50 |
| | Phenol novolac epoxy acrylate (2) | | | | | | | | | |
| | Ethoxylated orthophenylphenol acrylate | 15.00 | 20.00 | 22.50 | 22.50 | 22.50 | 22.50 | 22.50 | 22.50 | 22.50 |
| | Ogsol EA-0200 | 15.00 | 40.00 | 27.50 | | 27.50 | 27.50 | 27.50 | | |
| | Ogsol EA-F5503 | | | | 27.50 | | | | | |
| | Pentaerythritol triacrylate | | | | | | | | 5.00 | 5.00 |
| | I-184 | 5.00 | 5.00 | 5.00 | 5.00 | 5.00 | 5.00 | 5.00 | 5.00 | 5.00 |
| | Bisphenol A ethyleneoxide-modified (2 mol) diacrylate | | | | | | | | | |
| | Acryloyl morpholine | | | | | | | | | |
| | High refractive index filler 1 (zirconia: ZRMIBK30 WT %) | | | | | | | | | |
| | High refractive index filler 2 (titania: TiMIBK15 WT %) | | | | | | | | | |
| | Bifunctional urethane acrylate (NV100: CN-9893) | | | | | | | | | |
| | Methyl isobutyl ketone | 17.50 | 7.50 | 12.50 | 12.50 | 12.50 | 12.50 | 12.50 | 18.13 | 18.13 |
| | Isobutyl alcohol | 55.42 | 60.42 | 57.92 | 57.92 | 57.92 | 57.92 | 57.92 | 55.10 | 55.10 |
| | Butyl acetate | 55.42 | 60.42 | 57.92 | 57.92 | 57.92 | 57.92 | 57.92 | 55.10 | 55.10 |
| | Total amounts | 233.33 | 233.33 | 233.33 | 233.33 | 233.33 | 233.33 | 233.33 | 233.33 | 233.33 |
| | Film thickness (μm) | 3.0 | 5.0 | 5.0 | 5.0 | 0.1 | 6.0 | 9.0 | 5.0 | 5.0 |
| | A refractive index | 1.587 | 1.601 | 1.593 | 1.592 | 1.593 | 1.593 | 1.593 | 1.593 | 1.593 |
| Color difference adjusting layer evaluation | Total mass of particles (parts) | 40 | 30 | 30 | 30 | 35 | 40/100 | 200 | 40 | 40 |
| | Δmax |R1-R2| (%) (500-750) | 0.59 | 0.72 | 0.63 | 0.81 | 0.45 | 0.28 | 0.95 | 0.66 | 0.54 |
| | ΔHaze (%) | 0.1 | 0.1 | 0.0 | 0.1 | 0.1 | 0.2 | 0.3 | 0.1 | 0.0 |
| | Evaluation of interference fringes | ⊚ | ○ | ○ | ○ | ○ | ○ | ○ | ⊚ | ⊚ |
| | Evaluation of etching mark | ⊚ | ⊚ | ○ | ○ | ⊚ | ○ | Δ | ○ | ○ |
| | Adhesion evaluation | 10 | 10 | 10 | 10 | 10 | 10 | 8 | 10 | 10 |

TABLE 4

| | | Comparative Example | |
|---|---|---|---|
| | | F1 | F2 |
| substrate | Type of substrate | PET | PET |
| | Thickness (μm) | 125 | 125 |
| Hard coat layer | Phenol novolac epoxy acrylate (1) | 30.00 | 30.00 |
| | Phenol novolac epoxy acrylate (2) | | |
| | Ethoxylated orthophenylphenol acrylate | 15.00 | 15.00 |
| | Ogsol EA-0200 | 5.00 | 55.00 |
| | Ogsol EA-F5503 | | |

TABLE 4-continued

|  |  | Comparative Example | |
|---|---|---|---|
|  |  | F1 | F2 |
|  | Pentaerythritol triacrylate | 50.00 | |
|  | I-184 | 5.00 | 5.00 |
|  | Bisphenol A ethyleneoxide-modified (2 mol) diacrylate | | |
|  | Acryloyl morpholine | | |
|  | High refractive index filler 1 (zirconia: ZRMIBK30WT %) | | |
|  | High refractive index filler 2 (titania: TiMIBK15WT %) | | |
|  | Bifunctional urethane acrylate (NV100: CN-9893) | | |
|  | Methyl isobutyl ketone | 7.50 | 7.50 |
|  | Isobutyl alcohol | 60.42 | 60.42 |
|  | Butyl acetate | 60.42 | 60.42 |
|  | Total amounts | 233.33 | 233.33 |
|  | Film thickness (μm) | 5.0 | 5.0 |
|  | A refractive index | 1.558 | 1.600 |
| Color difference adjusting layer evaluation | Total mass of particles (parts) | 40 | 40 |
|  | Δmax |R1-R2| (%) (500-750) | 2.36 | 0.78 |
|  | ΔHaze (%) | 0.1 | 0.6 |
|  | Evaluation of interference fringes | x | ○ |
|  | Evaluation of etching mark | x | x |
|  | Adhesion evaluation | 10 | 8 |

In the Table 3 and Table 4, each term means as follows.

I-184: 1-hydroxycyclohexyl phenyl ketone, a photoinitiator.

Bisphenol A ethyleneoxide-modified (2 mol) diacrylate: Aronix M-211B manufactured by Toa gosei Co., Ltd., bisphenol A ethyleneoxide-modified (2 mol) diacrylate.

High refractive index filler 1: zirconia: ZRMIBK30 WT %, zirconium oxide, manufactured by CIK NanoTec.

High refractive index filler 2: titania: TiMIBK15WT %, titanium oxides, manufactured by CIK NanoTec.

Bifunctional urethane acrylate: NV (non-volatile component) 100, CN-9893 manufactured by Sartomer Corp.

Each of the transparent electroconductive laminates obtained in Examples had ΔR of not greater than 1 and ΔH of not greater than 0.3%. These results show the transparent electroconductive laminate in Examples had excellent visibility even if the etching treatment was performed.

In addition, appearance of interference fringes were not observed in the transparent electroconductive laminates obtained in Examples. Furthermore, the transparent electroconductive laminates had excellent etching mark property and adhesion property.

Comparative example F1 was a comparative example in which amounts of the components (A) and (C) were less than the claimed invention of the present application. In the comparative example, the obtained transparent electroconductive laminate had ΔR of greater than 1, which resulted in inferior visibility. In addition, appearance of interference fringes was observed.

Comparative example F2 was a comparative example in which an amount of the component (A) was less than the claimed invention of the present application, and an amount of the component (C) was more than the claimed invention of the present application. In the comparative example, the obtained transparent electroconductive laminate had ΔH of greater than 0.3%, which resulted in inferior visibility.

Production Example 4: Production of a Resin for Color Difference Adjusting Layer (C1)

In a 4 L flask equipped with a stirrer, a thermometer and a condenser, 1832 g of caprolactone (3 mol)-modified 2-hydroxyethyl acrylate (Placcel FA-3, produced by Daicel corporation), 592 g of phthalic anhydride, 3.6 g of triphenylphosphine and 1.36 g of hydroquinone were added, and heated at 100° C. to react. At the time where an acid value being 210 mgKOH/g, 748 g of bisphenol A diglycidyl ether (Epikote 828, produced by Japan Epoxy Resin Corporation) was added, then the reaction mixture was reacted until an acid value being 1 mgKOH/g, to obtain a resin for color difference adjusting layer (C1) that was an acrylate compound having two unsaturated double bonds.

The resulting resin for color difference adjusting layer (C1) had a weight-average molecular weight of 1550, a hydroxyl value of 85 mgKOH/g and a maximum breaking elongation of 120%.

Production Example 5: Production of a Resin for Color Difference Adjusting Layer (C2)

In a 4 L flask equipped with a stirrer, a thermometer and a condenser, 1832 g of caprolactone (3 mol)-modified 2-hydroxyethyl acrylate (Placcel FA-3, produced by Daicel corporation), 400 g of succinic anhydride, 3.6 g of triphenylphosphine and 1.36 g of hydroquinone were added, and heated at 100° C. to react. At the time where an acid value being 210 mgKOH/g, 748 g of bisphenol A diglycidyl ether (Epikote 828, produced by Japan Epoxy Resin Corporation) was added, then the reaction mixture was reacted until an acid value being 1 mgKOH/g, to obtain a resin for color difference adjusting layer (C2) that was an acrylate compound having two unsaturated double bonds.

The resulting resin for color difference adjusting layer (C2) had a weight-average molecular weight of 1450, a hydroxyl value of 94 mgKOH/g and a maximum breaking elongation of 110%.

Example G1

Formation of Hard Coat Layer

A hard coating composition was prepared by using the phenolic novolac epoxy acrylate (1) obtained by Production example 1 as a component (A) and an ethoxylated orthophenylphenol acrylate (an acrylate having 1 mol of ethylene oxide structure, a viscosity at 25° C. of 130 mPa·s and a refractive index of 1.577) as a component (B). Raw materials shown in Table 5 were mixed in the solid amounts shown in Table 5, and were stirred to obtain a hard coating composition.

The viscosity at 25° C. of the component (B), the ethoxylated orthophenylphenol acrylate, was measured by a B-type viscometer (TVB-22L, manufactured by Toki Sangyo co., ltd.) and a M1 Rotor at a number of rotations of 60 rpm after 100 ml of the component (B), the ethoxylated orthophenylphenol acrylate, was sampled in a container as a test sample and was kept under a temperature of 20° C. The refractive index of the component (B) was measured by an Abbe's refractometer in conformity with JIS (Japanese Industrial Standard) K0062.

In addition, the resulting hard coating composition was dropped on an optical PC film (trade name Pureace, manufactured by Teijin Limited, 100 μm) and was coated with a bar coater #9.

After the coating, the resulting coat was dried at 70° C. for one minute and was irradiated by ultraviolet rays of 350 mJ with a ultraviolet ray irradiator (manufactured by Fusion) to obtain a hard coat film composed of the polycarbonate film and a hard coat layer having a thickness of 3.0 μm.

Formation of Color Difference Adjusting Layer

A dispersion of 15% titanium oxide (an average primary particle diameter: 40 nm) was diluted to a concentration of 5% in isobutyl alcohol. The resin for color difference adjusting layer (C1) obtained in Production Example 4 was diluted to a concentration of 5% in methyl isobutyl ketone (MIBK).

The dilute solution of titanium oxide (40 parts by mass) and 0.25 part by mass of a photopolymerization initiator (Irgacure 184, produced by BASF corporation) was mixed with 100 parts by mass of the dilute solution of the resin for color difference adjusting layer (C1), and the resulting mixture was diluted to a concentration of 2.5% by mass in isobutyl alcohol (IBA), and coated with a bar coater #3.

After the coating, the resulting coat was dried at 70° C. for one minute and was irradiated by ultraviolet rays of 350 mJ with a ultraviolet ray irradiator (manufactured by Fusion) to obtain a color difference adjusting layer on the hard coat layer.

Formation of Transparent Electrically Conducting Layer

On the resulting color difference adjusting layer, an ITO layer was formed by a sputtering method in use of indium oxide-tin oxide target with a density of arrangement of 98% containing indium oxide and tin oxide with a mass ratio of 95:5, to obtain an amorphous ITO layer. A thickness of the resulting ITO layer was about 20 nm, and a surface electrical resistance after formation of the layer was about 210 Ω/square.

Then, a heat treatment at 130° C. for 90 minutes was performed to crystallize the transparent electrically conducting layer (ITO layer), to obtain a transparent electroconductive laminate. The resulting electrically conducting layer after crystallization of ITO layer had a surface electrical resistance of about 150 Ω/square.

The characteristics of the resulting transparent electroconductive laminate were shown in Table 5.

Examples G2 to G6

In a formation of a hard coat layer, a hard coat layer was formed in the same manner as in Example G1 except that its content and composition ratio of a hard coating composition was changed as shown in Table 5.

Then, in a formation of a color difference adjusting layer, a color difference adjusting layer was formed on the hard coat layer in the same manner as in Example G1 except that an amount of a diluted concentration of titanium oxide was changed as shown in Table 5.

Next, a transparent electrically conducting layer was formed on the color difference adjusting layer in the same manner as in Example G1.

Examples G7 to G11

In a formation of a hard coat layer, a hard coat layer was formed in the same manner as in Example G5 except that its content and composition ratio of a hard coating composition was changed as shown in Table 5.

Then, in a formation of a color difference adjusting layer, a color difference adjusting layer was formed on the hard coat layer in the same manner as in Example G1 except that an amount of a diluted concentration of titanium oxide was changed as shown in Table 5.

Next, a transparent electrically conducting layer was formed on the color difference adjusting layer in the same manner as in Example G1.

As for Example G7, the resin for color difference adjusting layer (C2) obtained in Production Example 5 was used for forming the color difference adjusting layer to obtain an electroconductive laminate.

As for Examples G8 and G9, an electroconductive laminate was obtained in use of an optical PET film (trade name Teijin Tetron KEFW, manufactured by Teijin DePont Films Japan Limited, 188 μm).

As for Example G10, an electroconductive laminate was obtained in use of an optical modified PC film (trade name Pureace WR W-142, manufactured by Teijin Limited, 75 μm).

As for Example G11, an electroconductive laminate was obtained in use of an optical modified PC film (trade name Pureace WR S-148, manufactured by Teijin Limited, 50 μm).

Comparative Example G1 and G2

A hard coat layer was formed in the same manner as in Example E1 except that its content and composition ratio of a hard coating composition was changed as shown in Table 6. Then, an electrically conducting layer was formed in the same manner as in Example G1.

Comparative Examples G3 to G9

A hard coat layer was formed in the same manner as in Example G8 except that its content and composition ratio of a hard coating composition was changed as shown in Table 6.

Comparative Example G10

An electrically conducting layer was formed in the same manner as in Example G9 except that an amount of a diluted concentration of titanium oxide was changed as shown in Table 6 in a formation of a color difference adjusting layer.

Comparative Example G11 to G20

An electrically conducting layer was formed in the same manner as in Example G8 except that a resin for color difference adjusting layer was changed as shown in Table 7 in a formation of a color difference adjusting layer;

a resin for color difference adjusting layer (C3) being WJV-572, produced by DIC corporation, having an average molecular weight of 3600, the number of unsaturated double bond of 6, a hydroxyl value of 10 mgKOH/g and a maximum breaking elongation of less than 30%, a resin for color difference adjusting layer (C4) being WJV-573, produced by DIC corporation, having an average molecular weight of 2700, the number of unsaturated double bond of 6, a hydroxyl value of 25 mgKOH/g and a maximum breaking elongation of less than 30%, a resin for color difference adjusting layer (C5) being V-4025, produced by DIC corporation, having an average molecular weight of 1200, the number of unsaturated double bond of 6, a hydroxyl value of 12 mgKOH/g and a maximum breaking elongation of less than 30%, a resin for color difference adjusting layer (C6) being RA-4500, produced by Mitsubishi Chemical Corporation, having an average molecular weight of 750, the number of unsaturated double bond of 4, a hydroxyl value of 76 mgKOH/g and a maximum breaking elongation of less than 30%, a resin for color difference adjusting layer (C7) being RA-5000, produced by Mitsubishi Chemical Corporation, having an average molecular weight of 1200, the number of unsaturated double bond of 2 to 3, a hydroxyl value of 62 mgKOH/g and a maximum breaking elongation of 80%, a resin for color difference adjusting layer (C8) being RA-3080, produced by Mitsubishi Chemical Corporation, having an average molecular weight of 5500, the number of unsaturated double bond of 2 to 3, a hydroxyl value of 72 mgKOH/g and a maximum breaking elongation of 100%, a resin for color difference adjusting layer (C9) being RA-3091, produced by Mitsubishi Chemical Corporation, having an average molecular weight of 9400, the number of unsaturated double bond of 2 to 3, a hydroxyl value of 73 mgKOH/g and a maximum breaking elongation of 80%, a resin for color difference adjusting layer (C10) being XRA-2109, produced by Mitsubishi Chemical Corporation, having an average molecular weight of 1350, the number of unsaturated double bond of 4 to 5, a hydroxyl value of 59 mgKOH/g and a maximum breaking elongation of less than 30%, a resin for color difference adjusting layer (C11) being RA-3053, produced by Mitsubishi Chemical Corporation, having an average molecular weight of 12000, the number of unsaturated double bond of 2, a hydroxyl value of 53 mgKOH/g and a maximum breaking elongation of 100%, a resin for color difference adjusting layer (C12) being a phenolic novolac epoxy acrylate (2) obtained Production example 2, having a maximum breaking elongation of 80%.

In use of electrically conducting layers obtained by the above Examples and Comparative examples, a reflectance difference ΔR, a haze value difference ΔH, evaluation of interference fringes, etching mark, adhesion evaluation of the electroconductive layer and adhesion evaluation of the auxiliary electrode layer were performed. Obtained test results were shown in Tables 5, 6 and 7.

Adhesion Evaluation of Transparent Electroconductive Laminate

The adhesion test was performed in accordance with JIS K5400. Each of transparent electroconductive laminates obtained in examples and comparative examples was subjected to cross cutting so as to have 100 pieces of cut squares (grid pattern) with an area of 1 mm². Then, a cellophane pressure-sensitive adhesive tape was completely stuck on the prepared grid pattern and one end of the tape was pulled upward and peeled off. This peeling operation was performed three times on the same part. Afterward, the number of squares from which a part of the laminate was peeled off was judged according to the following criteria.

10: There is no square from which a part of the laminate was peeled off.

8: There are not more than 5 squares from which a part of the laminate was peeled off.

6: There are more than 5 and not more than 15 squares from which a part of the laminate was peeled off.

4: There are more than 15 and not more than 35 squares from which a part of the laminate was peeled off.

2: There are more than 35 and not more than 65 squares from which a part of the laminate was peeled off.

0: There are more than 65 and not more than 100 squares from which a part of the laminate was peeled off.

Adhesion Evaluation of Auxiliary Electrode Layer

On the resulting color difference adjusting layer in the formation of the transparent electroconductive layer in Examples and Comparative examples, an ITO layer and Cu layer were sequentially formed by a sputtering method in use of indium oxide-tin oxide target with a density of arrangement of 98% containing indium oxide and tin oxide with a mass ratio of 95:5 and a copper target with a purity of 99.5%, to obtain an amorphous ITO layer and Cu layer. Then, a heat treatment at 130° C. for 90 minutes was performed to crystallize the transparent electrically conducting layer (ITO layer), to obtain a transparent electroconductive laminate. The resulting ITO layer had a film thickness of 20 nm, and the resulting Cu layer had a film thickness of 300 nm, and both of them had a surface electrical resistance of about 0.2 Ω/square.

Using the resulting test samples, the adhesion test was performed in accordance with JIS K5400. Each of the test samples was subjected to cross cutting so as to have 100 pieces of cut squares (grid pattern) with an area of 1 mm². Then, a cellophane pressure-sensitive adhesive tape was completely stuck on the prepared grid pattern and one end of the tape was pulled upward and peeled off. This peeling operation was performed three times on the same part. Afterward, the number of squares from which a part of the laminate was peeled off was judged according to the following criteria.

10: There is no square from which a part of the laminate was peeled off.

8: There are not more than 5 squares from which a part of the laminate was peeled off.

6: There are more than 5 and not more than 15 squares from which a part of the laminate was peeled off.

4: There are more than 15 and not more than 35 squares from which a part of the laminate was peeled off.

2: There are more than 35 and not more than 65 squares from which a part of the laminate was peeled off.

0: There are more than 65 and not more than 100 squares from which a part of the laminate was peeled off.

TABLE 5

| | | Example | | | | | | | | | | |
|---|---|---|---|---|---|---|---|---|---|---|---|---|
| | | G1 | G2 | G3 | G4 | G5 | G6 | G7 | G8 | G9 | G10 | G11 |
| substrate | Type of substrate | PC | PC | PC | PC | PC | PC | PC | PET | PET | modifiedPC-1 | modifiedPC-2 |
| | Thickness (μm) | 100 | 100 | 100 | 100 | 100 | 100 | 100 | 125 | 50 | 70 | 50 |
| Hard Coat layer | Composition | | | | | | | | | | | |
| | I-184D | 5.00 | 5.00 | 5.00 | 5.00 | 5.00 | 5.00 | 5.00 | 5.00 | 5.00 | 5.00 | 5.00 |
| | Composition (A-1) (NV100) | 85.00 | 60.00 | | 60.00 | 72.50 | 72.50 | 72.50 | 72.50 | 72.50 | 72.50 | 72.50 |
| | Composition (A-2) (NV100) | | | 60.00 | | | | | | | | |

TABLE 5-continued

| | | Example | | | | | | | | | | |
|---|---|---|---|---|---|---|---|---|---|---|---|---|
| | | G1 | G2 | G3 | G4 | G5 | G6 | G7 | G8 | G9 | G10 | G11 |
| | composition (B), Ethoxylated orthophenylphenol acrylate: 1 mol | 15.00 | 15.00 | 15.00 | 30.00 | 22.50 | 22.50 | 22.50 | 22.50 | 22.50 | 22.50 | 22.50 |
| | Pentaerythritol triacrylate | | 25.00 | 25.00 | 10.00 | 5.00 | 5.00 | 5.00 | 5.00 | 5.00 | 5.00 | 5.00 |
| | Bisphenol A ethyleneoxide-modified (2 mol) diacrylate | | | | | | | | | | | |
| | Acryloyl morpholine | | | | | | | | | | | |
| | High refractive index filler 1 (zirconia: ZRMIBK30 WT %) | | | | | | | | | | | |
| | High refractive index filler 2 (titania: TiMIBK15 WT %) | | | | | | | | | | | |
| | Bifunctional urethane acrylate (NV100: CN-9893) | | | | | | | | | | | |
| | Methyl isobutyl ketone | 21.25 | 15.00 | 15.00 | 15.00 | 18.13 | 18.13 | 18.13 | 18.13 | 18.13 | 18.13 | 18.13 |
| | Isobutyl alcohol | 53.54 | 56.67 | 56.67 | 56.67 | 55.10 | 55.10 | 55.10 | 55.10 | 55.10 | 55.10 | 55.10 |
| | Butyl acetate | 53.54 | 56.67 | 56.67 | 56.67 | 55.10 | 55.10 | 55.10 | 55.10 | 55.10 | 55.10 | 55.10 |
| | Total amounts | 233.33 | 233.33 | 233.33 | 233.33 | 233.33 | 233.33 | 233.33 | 233.33 | 233.33 | 233.33 | 233.33 |
| | Film thickness (μm) | 5.0 | 5.0 | 5.0 | 5.0 | 5.0 | 5.0 | 5.0 | 6.0 | 0.1 | 5.0 | 5.0 |
| | A refractive index | 1.583 | 1.571 | 1.571 | 1.581 | 1.582 | 1.582 | 1.582 | 1.582 | 1.582 | 1.582 | 1.582 |
| Color difference adjusting layer | Type of curing resin component | C1 | C1 | C1 | C1 | C1 | C1 | C2 | C1 | C1 | C1 | C1 |
| | Total mass of particles (parts) | 40 | 37 | 37 | 40 | 40 | 200 | 40 | 30 | 35 | 40 | 40 |
| Evaluation of a transparent electrically conductive layer | Δmax |R1−R2| (%) (500-750) | 0.54 | 0.72 | 0.68 | 0.63 | 0.63 | 0.97 | 0.63 | 0.46 | 0.39 | 0.71 | 0.52 |
| | ΔHaze (%) | 0.1 | 0.0 | 0.1 | 0.1 | 0.1 | 0.3 | 0.1 | 0.1 | 0.1 | 0.1 | 0.0 |
| | Evaluation of interference fringes | ⊚ | ○ | ○ | ⊚ | ⊚ | ⊚ | ⊚ | Δ | ⊚ | ⊚ | ⊚ |
| | Evaluation of etching mark | ⊚ | ○ | ○ | ⊚ | ⊚ | Δ | ⊚ | ○ | ⊚ | ○ | ○ |
| | Adhesion evaluation | 10 | 10 | 10 | 10 | 10 | 8 | 10 | 10 | 10 | 10 | 10 |
| Evaluation of an auxiliary electrode layer | Adhesion evaluation | 10 | 10 | 10 | 10 | 10 | 8 | 10 | 10 | 10 | 10 | 10 |

TABLE 6

| | | COMPARATIVE EXAMPLE | | | | |
|---|---|---|---|---|---|---|
| | | G1 | G2 | G3 | G4 | G5 |
| substrate | Type of substrate | PC | PC | PET | PET | PET |
| | Thickness (μm) | 100 | 100 | 125 | 125 | 125 |
| Hard Coat layer | Composition | | | | | |
| | I-184D | 5.00 | 5.00 | 5.00 | 5.00 | 5.00 |
| | Composition (A-1) (NV100) | 95.00 | 55.00 | | 60.00 | |
| | Composition (A-2) (NV100) | | | | | |
| | composition (B), Ethoxylated orthophenylphenol acrylate: 1 mol | 5.00 | 45.00 | 15.00 | | |
| | Pentaerythritol triacrylate | | | | 25.00 | 60.00 |
| | Bisphenol A ethyleneoxide-modified (2 mol) diacrylate | | | 85.00 | | |
| | Acryloyl morpholine | | | | 15.00 | |
| | High refractive index filler 1 (zirconia: ZRMIBK30 WT %) | | | | | 40.00 |
| | High refractive index filler 2 (titania: TiMIBK15 WT %) | | | | | |
| | Bifunctional urethane acrylate (NV100: CN-9893) | | | | | |

TABLE 6-continued

| | | COMPARATIVE EXAMPLE | | | | |
|---|---|---|---|---|---|---|
| | | G1 | G2 | G3 | G4 | G5 |
| | Methyl isobutyl ketone | 23.75 | 13.75 | | 15.00 | 93.33 |
| | Isobutyl alcohol | 52.29 | 57.29 | 64.17 | 56.67 | 17.50 |
| | Butyl acetate | 52.29 | 57.29 | 64.17 | 56.67 | 17.50 |
| | Total amounts | 233.33 | 233.33 | 233.33 | 233.33 | 233.33 |
| | Film thickness (μm) | 5.0 | 5.0 | 6.0 | 6.0 | 6.0 |
| | A refractive index | 1.579 | 1.591 | 1.565 | 1.560 | 1.585 |
| Color difference adjusting layer | Type of curing resin component | C1 | C1 | C1 | C1 | C1 |
| | Total mass of particles (parts) | 40 | 40 | 30 | 30 | 30 |
| Evaluation of a transparent electrically conductive layer | Δmax \|R1-R2\| (%) (500-750) | 0.83 | 0.76 | 1.65 | 1.92 | 2.75 |
| | ΔHaze (%) | 0.4 | 0.6 | 0.1 | 0.2 | 0.2 |
| | Evaluation of interference fringes | Δ | Δ | x | x | x |
| | Evaluation of etching mark | x | x | x | x | x |
| | Adhesion evaluation | 8 | 8 | 10 | 10 | 10 |
| Evaluation of an auxiliary electrode layer | Adhesion evaluation | 8 | 8 | 10 | 10 | 10 |

| | | COMPARATIVE EXAMPLE | | | | |
|---|---|---|---|---|---|---|
| | | G6 | G7 | G8 | G9 | G10 |
| substrate | Type of substrate | PET | PET | PET | PET | PET |
| | Thickness (μm) | 125 | 125 | 125 | 125 | 125 |
| Hard Coat layer | Composition | | | | | |
| | I-184D | 5.00 | 5.00 | 5.00 | 5.00 | 5.00 |
| | Composition (A-1) (NV100) | | | | | 72.50 |
| | Composition (A-2) (NV100) | | | | | |
| | composition (B), Ethoxylated orthophenylphenol acrylate: 1 mol | | | | | 22.50 |
| | Pentaerythritol triacrylate | 60.00 | 40.00 | 24.00 | 24.00 | 5.00 |
| | Bisphenol A ethyleneoxide-modified (2 mol) diacrylate | | | | | |
| | Acryloyl morpholine | | | | | |
| | High refractive index filler 1 (zirconia: ZRMIBK30 WT %) | | | 40.00 | | |
| | High refractive index filler 2 (titania: TiMIBK15 WT %) | 40.00 | | | 40.00 | |
| | Bifunctional urethane acrylate (NV100: CN-9893) | | 60.00 | 36.00 | 36.00 | |
| | Methyl isobutyl ketone | 226.67 | 60.00 | 129.33 | 262.67 | 18.13 |
| | Isobutyl alcohol | 9.17 | 34.17 | 14.08 | 78.67 | 55.10 |
| | Butyl acetate | 9.17 | 34.17 | 14.08 | 78.67 | 55.10 |
| | Total amounts | 350.00 | 233.33 | 262.50 | 525.00 | 233.33 |
| | Film thickness (μm) | 6.0 | 6.0 | 6.0 | 6.0 | 6.0 |
| | A refractive index | 1.615 | 1.510 | 1.584 | 1.614 | 1.582 |
| Color difference adjusting layer | Type of curing resin component | C1 | C1 | C1 | C1 | C1 |
| | Total mass of particles (parts) | 30 | 30 | 30 | 30 | 300 |
| Evaluation of a transparent electrically conductive layer | Δmax \|R1-R2\| (%) (500-750) | 3.21 | 2.33 | 2.99 | 3.12 | 1.21 |
| | ΔHaze (%) | 0.3 | 0.1 | 0.1 | 0.5 | 0.3 |
| | Evaluation of interference fringes | x | x | x | x | ○ |
| | Evaluation of etching mark | x | x | x | x | Δ |
| | Adhesion evaluation | 8 | 10 | 10 | 8 | 4 |
| Evaluation of an auxiliary electrode layer | Adhesion evaluation | 10 | 10 | 10 | 8 | 4 |

TABLE 7

| | | COMPARATIVE EXAMPLE | | | | | | | | | |
|---|---|---|---|---|---|---|---|---|---|---|---|
| | | G11 | G12 | G13 | G14 | G15 | G16 | G17 | G18 | G19 | G20 |
| substrate | Type of substrate | PET | PET | PET | PET | PET | PET | PET | PET | PET | PET |
| | Thickness (μm) | 125 | 125 | 125 | 125 | 125 | 125 | 125 | 125 | 125 | 125 |
| Hard Coat layer | Composition | | | | | | | | | | |
| | I-184D | 5.00 | 5.00 | 5.00 | 5.00 | 5.00 | 5.00 | 5.00 | 5.00 | 5.00 | 5.00 |
| | Composition (A-1) (NV100) | 72.50 | 72.50 | 72.50 | 72.50 | 72.50 | 72.50 | 72.50 | 72.50 | 72.50 | 72.50 |
| | Composition (A-2) (NV100) | | | | | | | | | | |

TABLE 7-continued

| | | COMPARATIVE EXAMPLE | | | | | | | | | |
|---|---|---|---|---|---|---|---|---|---|---|---|
| | | G11 | G12 | G13 | G14 | G15 | G16 | G17 | G18 | G19 | G20 |
| | composition (B), Ethoxylated orthophenylphenol acrylate: 1 mol | 22.50 | 22.50 | 22.50 | 22.50 | 22.50 | 22.50 | 22.50 | 22.50 | 22.50 | 22.50 |
| | Pentaerythritol triacrylate | 5.00 | 5.00 | 5.00 | 5.00 | 5.00 | 5.00 | 5.00 | 5.00 | 5.00 | 5.00 |
| | Bisphenol A ethyleneoxide-modified (2 mol) diacrylate | | | | | | | | | | |
| | Acryloyl morpholine | | | | | | | | | | |
| | High refractive index filler 1 (zirconia: ZRMIBK30 WT %) | | | | | | | | | | |
| | High refractive index filler 2 (titania: TiMIBK15 WT %) | | | | | | | | | | |
| | Bifunctional urethane acrylate (NV100: CN-9893) | | | | | | | | | | |
| | Methyl isobutyl ketone | 18.13 | 18.13 | 18.13 | 18.13 | 18.13 | 18.13 | 18.13 | 18.13 | 18.13 | 18.13 |
| | Isobutyl alcohol | 55.10 | 55.10 | 55.10 | 55.10 | 55.10 | 55.10 | 55.10 | 55.10 | 55.10 | 55.10 |
| | Butyl acetate | 55.10 | 55.10 | 55.10 | 55.10 | 55.10 | 55.10 | 55.10 | 55.10 | 55.10 | 55.10 |
| | Total amounts | 233.33 | 233.33 | 233.33 | 233.33 | 233.33 | 233.33 | 233.33 | 233.33 | 233.33 | 233.33 |
| | Film thickness (μm) | 6.0 | 6.0 | 6.0 | 6.0 | 6.0 | 6.0 | 6.0 | 6.0 | 6.0 | 6.0 |
| | A refractive index | 1.582 | 1.582 | 1.582 | 1.582 | 1.582 | 1.582 | 1.582 | 1.582 | 1.582 | 1.582 |
| Color difference adjusting layer | Type of curing resin component | C3 | C4 | C5 | C6 | C7 | C8 | C9 | C10 | C11 | C12 |
| | Total mass of particles (parts) | 30 | 30 | 30 | 30 | 30 | 30 | 30 | 30 | 30 | 30 |
| Evaluation of a transparent electrically conductive layer | Δmax \|R1-R2\| (%) (500-750) | 0.47 | 0.45 | 0.39 | 0.48 | 1.20 | 0.98 | 0.85 | 0.43 | 1.12 | 0.60 |
| | ΔHaze (%) | 0.1 | 0.1 | 0.1 | 0.1 | 2.2 | 1.5 | 0.9 | 0.1 | 1.9 | 0.1 |
| | Evaluation of interference fringes | Δ | Δ | Δ | Δ | Δ | Δ | Δ | Δ | Δ | Δ |
| | Evaluation of etching mark | ○ | ○ | ○ | ○ | ○ | ○ | ○ | ○ | ○ | ○ |
| | Adhesion evaluation | 10 | 10 | 10 | 10 | 10 | 10 | 10 | 10 | 10 | 10 |
| Evaluation of an auxiliary electrode layer | Adhesion evaluation | 0 | 0 | 0 | 0 | 0 | 0 | 0 | 0 | 0 | 0 |

In the Tables 5, 6 and 7, each term means as follows.

I-184: 1-hydroxycyclohexyl phenyl ketone, a photoinitiator.

Bisphenol A ethyleneoxide-modified (2 mol) diacrylate: Aronix M-211B manufactured by Toa gosei Co., Ltd., bisphenol A ethyleneoxide-modified (2 mol) diacrylate.

High refractive index filler 1: zirconia: ZRMIBK30 WT %, zirconium oxide, manufactured by CIK NanoTec.

High refractive index filler 2: titania: TiMIBK15WT %, titanium oxides, manufactured by CIK NanoTec.

Bifunctional urethane acrylate: NV (non-volatile component) 100, CN-9893 manufactured by Sartomer Corp.

Each of the electroconductive laminates obtained in Examples had ΔR of not greater than 1 and ΔH of not greater than 0.3%. These results show the electroconductive laminate in Examples had excellent visibility even if the etching treatment was performed.

In addition, appearance of interference fringes were not observed in the electroconductive laminates obtained in Examples. Furthermore, the electroconductive laminates had excellent etching mark property and adhesion property.

Comparative examples G1 and G2 were a comparative example in which amounts of the components (A) and (B) were out of the claimed invention of the present application. In each of these comparative examples, the obtained electroconductive laminates had ΔH of greater than 0.3%, which resulted in inferior visibility.

Comparative example G3 was a comparative example in which bisphenol A diacrylate was used in place of the component (A). In the comparative example G3, the obtained electroconductive laminate had ΔR of greater than 1, which resulted in inferior visibility. In addition, appearance of interference fringes was observed.

Comparative example G4 was a comparative example in which acryloyl morpholine was used in place of the component (B). In the comparative example G4, the obtained electroconductive laminate had ΔR of greater than 1, which resulted in inferior visibility. In addition, appearance of interference fringes was observed.

Comparative examples G5 and G6 were comparative examples in which zirconium oxide or titanium oxides were used as a high refractive index material, in place of using the components (A) and (B). In the comparative examples G5 and G6, ΔR of the obtained electroconductive laminates significantly exceeds 1, which resulted in significantly inferior visibility. In addition, appearance of interference fringes was observed.

Comparative examples G7 to G9 were comparative examples in which a bifunctional urethane acrylate was used in order to provide an elongation to a hard coat layer. These comparative examples had a slightly-increased elongation. However, the obtained electroconductive laminates had ΔR of greater than 1, which resulted in inferior visibility.

Comparative example G10 was a comparative example in which a total mass of particles in the color difference adjusting layer exceed 200 parts by mass. In the comparative examples, adhesion property was deteriorated.

Each of Comparative examples G11 to G20 was a comparative example of changing a resin composition of a resin for color difference adjusting layer, each of which had at least one parameters out of the present invention, selected from an average molecular weight, the number of unsaturated double bond, a maximum breaking elongation and a hydroxyl value. Each of the comparative examples involved inferior test result of auxiliary electrode layer adhesion.

Example H1

The unsaturated double bond containing acrylic copolymer (I) obtained by Production example 4 was used as a first component. As a second component, the phenolic novolac epoxy acrylate (1) obtained by Production example 1 as a component (A) and an ethoxylated orthophenylphenol acrylate (an acrylate having 1 mol of ethylene oxide structure, a viscosity at 25° C. of 130 mPa·s, a refractive index of 1.577) as a component (B) were used in order to obtain a composition for forming an antiblocking layer. A SP value of the second component was 12.2.

The raw materials shown in Table 8 were mixed in the solid amounts shown in Table 8, and were stirred to obtain a composition for forming an antiblocking layer.

The SP value of the second component was calculated as an average value based on SP values and mass contents of the components (A) and (B) in the second component.

The resulting composition for forming an antiblocking layer was dropped on an optical PC film (trade name Pureace, manufactured by Teijin Limited, 100 µm) and was coated with a bar coater #9.

After the coating, the resulting coat was dried at 70° C. for one minute and was irradiated by ultraviolet rays of 350 mJ with a ultraviolet ray irradiator (manufactured by Fusion) to obtain a high refractive index antiblocking layer having a thickness of 3.0 µm on the polycarbonate film.

The viscosity at 25° C. of the component (B), the ethoxylated orthophenylphenol acrylate, was measured by a B-type viscometer (TVB-22L, manufactured by Toki Sangyo co., ltd.) and a M1 Rotor at a number of rotations of 60 rpm after 100 ml of the component (B), the ethoxylated orthophenylphenol acrylate, was sampled in a container as a test sample and was kept under a temperature of 20° C. The refractive index of the component (B) was measured by an Abbe's refractometer in conformity with JIS (Japanese Industrial Standard) K0062.

Formation of Color Difference Adjusting Layer

A dispersion of 15% titanium oxide (an average primary particle diameter: 40 nm) was diluted to a concentration of 5% in isobutyl alcohol. An urethane acrylate (an ultraviolet curing monomer, UN-3320HS, produced by Negami Chemical Industrial Co., Ltd.) was diluted to a concentration of 5% in methyl isobutyl ketone (MIBK). The dilute solution of titanium oxide (40 parts by mass) and 0.25 part by mass of a photopolymerization initiator (Irgacure 184, produced by BASF corporation) was mixed with 100 parts by mass of the dilute solution of urethane acrylate, and the resulting mixture was diluted to a concentration of 2.5% by mass in isobutyl alcohol (IBA), and coated with a bar coater #3.

After the coating, the resulting coat was dried at 70° C. for one minute and was irradiated by ultraviolet rays of 350 mJ with a ultraviolet ray irradiator (manufactured by Fusion) to obtain a color difference adjusting layer on the high refractive index antiblocking layer.

Formation of Transparent Electrically Conducting Layer

On the resulting color difference adjusting layer, an ITO layer was formed by a sputtering method in use of indium oxide-tin oxide target with a density of arrangement of 98% containing indium oxide and tin oxide with a mass ratio of 95:5, to obtain an amorphous ITO layer. A thickness of the resulting ITO layer was about 20 nm, and a surface electrical resistance after formation of the layer was about 210 Ω/square.

Then, a heat treatment at 130° C. for 90 minutes was performed to crystallize the transparent electrically conducting layer (ITO layer), to obtain a transparent electroconductive laminate. The resulting electrically conducting layer after crystallization of ITO layer had a surface electrical resistance of about 150 Ω/square.

The characteristics of the resulting transparent electroconductive laminate were shown in Table 8.

Examples H2 to H5

In a formation of the high refractive index antiblocking layer, a high refractive index antiblocking layer was formed in the same manner as in Example H1 except that its content and composition ratio of a composition for forming an antiblocking layer was changed as shown in Table 8.

Then, in a formation of a color difference adjusting layer, a color difference adjusting layer was formed on the high refractive index antiblocking layer in the same manner as in Example H1 except that an amount of a diluted concentration of titanium oxide was changed as shown in Table 8.

Next, a transparent electrically conducting layer was formed on the color difference adjusting layer in the same manner as in Example H1.

As for Example H3, a transparent electroconductive laminate was obtained in use of an optical PC film (trade name Pureace C110, manufactured by Teijin Limited, 70 µm).

Examples H6 to H10, H12, H14 and H15

In a formation of the high refractive index antiblocking layer, the high refractive index antiblocking layer was formed in the same manner as in Example H1.

Then, in a formation of a color difference adjusting layer, a color difference adjusting layer was formed on the high refractive index antiblocking layer in the same manner as in Example H1 except that an amount of a diluted concentration of titanium oxide was changed as shown in Table 8.

Next, a transparent electrically conducting layer was formed on the color difference adjusting layer in the same manner as in Example H1.

As for Examples H7 and H8, a transparent electroconductive laminate was obtained in use of an optical PET film (trade name Teijin Tetron KEFW, manufactured by Teijin DePont Films Japan Limited, 188 µm).

As for Example H9, a transparent electroconductive laminate was obtained in use of an optical PET film (trade name Teijin Tetron KEFW, manufactured by Teijin DePont Films Japan Limited, 125 µm).

As for Example H10, a transparent electroconductive laminate was obtained in use of an optical PET film (trade name Teijin Tetron KEL86W, manufactured by Teijin DePont Films Japan Limited, 50 µm).

As for Example H14, a transparent electroconductive laminate was obtained in use of an optical modified PC film (trade name Pureace WR W-142, manufactured by Teijin Limited, 75 µm).

As for Example H15, a transparent electroconductive laminate was obtained in use of an optical modified PC film (trade name Pureace WR S-148, manufactured by Teijin Limited, 50 µm).

Example H11

In a formation of the high refractive index antiblocking layer, a high refractive index antiblocking layer was formed in the same manner as in Example H1.

In a formation of the color difference adjusting layer, a dispersion of 15% titanium oxide (an average primary particle diameter: 40 nm) was diluted to a concentration of 5% in isobutyl alcohol. An urethane acrylate (an ultraviolet curing monomer, UN-3320HS, produced by Negami Chemical Industrial Co., Ltd.) was diluted to a concentration of 5% in methyl isobutyl ketone (MIBK).

The dilute solution of titanium oxide (40 parts by mass) and 0.25 part by mass of a photopolymerization initiator (Irgacure 184, produced by BASF corporation) was mixed with 100 parts by mass of the dilute solution of urethane acrylate, and the resulting mixture was diluted to a concentration of 2.5% by mass in isobutyl alcohol (IBA), and coated with a bar coater #3.

After the coating, the resulting coat was dried at 70° C. for one minute and was irradiated by ultraviolet rays of 350 mJ with a ultraviolet ray irradiator (manufactured by Fusion) to obtain a color difference adjusting layer 1 on the high refractive index antiblocking layer.

Then, 40 parts by mass of 5% dispersion of magnesium fluoride and 0.25 part by mass of a photopolymerization initiator (Irgacure 184, produced by BASF corporation) was mixed with 100 parts by mass of the dilute solution of urethane acrylate, and the resulting mixture was diluted to a concentration of 2.5% by mass in isobutyl alcohol (IBA), and coated with a bar coater #3.

After the coating, the resulting coat was dried at 70° C. for one minute and was irradiated by ultraviolet rays of 350 mJ with a ultraviolet ray irradiator (manufactured by Fusion) to obtain a color difference adjusting layer 2 on the color difference adjusting layer 1.

Next, a transparent electrically conducting layer was formed on the color difference adjusting layer 2 in the same manner as in Example H1.

Example H13

A high refractive index antiblocking layer, a color difference adjusting layer 1, a color difference adjusting layer 2 and a transparent electrically conducting layer were sequentially formed in the same manner as in Example H11, except that a diluted solution obtained by mixing 100 parts by mass of silicone acrylate (EB-1360, produced by Daicel-Allnex Ltd.) and 5 part by mass of a photopolymerization initiator (Irgacure 184, produced by BASF corporation) and diluting to a concentration of 2.5% in methyl isobutyl ketone was used in a formation of a color difference adjusting layer 2.

Comparative Examples H1 and H2

A high refractive index antiblocking layer was formed in the same manner as in Example H1 except that its content and composition ratio of a composition for forming an antiblocking layer was changed as shown in Table 9.
Then, a transparent electrically conducting layer was formed in the same manner as in Example H1.

Comparative Examples H3 to H9

A high refractive index antiblocking layer was formed in the same manner as in Example H9 except that its content and composition ratio of a composition for forming an antiblocking layer was changed as shown in Table 9. Then, a transparent electrically conducting layer was formed in the same manner as in Example H9.

Comparative Example H10

A transparent electrically conducting layer was formed in the same manner as in Example H9 except that an amount of a diluted concentration of titanium oxide was changed as shown in Table 9 in a formation of a color difference adjusting layer.

In use of transparent electrically conducting layers obtained by the above Examples and Comparative examples, an antiblocking (AB) property, a reflectance difference ΔR, a haze value difference ΔH, evaluation of interference fringes, etching mark and adhesion evaluation of the electroconductive layer were performed. Obtained test results were shown in Tables 8 and 9.

Evaluation for Antiblocking (AB) Property

An antiblocking film obtained by Example or Comparative example was cut to the size of 2 cm by 5 cm, then a coating surface of the cut sample was affixed on a PET film (without an easily adhesive layer). The resulting film was put between a pair of glass plates, and left at room temperature for 24 hours under the condition of loading of 200 gf/cm². Then an occurrence of blocking (AB property) was visually evaluated based on the evaluation standard described below.

○: having antiblocking (AB) property
x: without antiblocking (AB) property

TABLE 8

| | | EXAMPLE | | | | | | |
|---|---|---|---|---|---|---|---|---|
| | | H1 | H2 | H3 | H4 | H5 | H6 | H7 |
| substrate | Type of substrate | PC | PC | PC | PC | PC | PC | PET |
| | Thickness (μm) | 100 | 100 | 70 | 100 | 100 | 100 | 188 |
| High refractive anti- blocking layer | Unsaturated double bond containing acrylic copolymer (I) | 2.00 | 2.00 | 2.00 | 2.00 | 2.00 | 2.00 | 2.00 |
| | Phenol novolac epoxy acrylate (1) | 72.50 | 85.00 | 60.00 | | 60.00 | 72.50 | 72.50 |
| | Phenol novolac epoxy acrylate (2) | | | | 60.00 | | | |
| | Ethoxylated orthophenylphenol acrylate | 22.50 | 15.00 | 15.00 | 15.00 | 30.00 | 22.50 | 22.50 |
| | Pentaerythritol triacrylate | 5.00 | | 25.00 | 25.00 | 10.00 | 5.00 | 5.00 |
| | I-184 | 5.00 | 5.00 | 5.00 | 5.00 | 5.00 | 5.00 | 5.00 |
| | Bisphenol A ethyleneoxide-modified (2 mol) diacrylate | | | | | | | |
| | Acryloyl morpholine | | | | | | | |
| | High refractive index | | | | | | | |

TABLE 8-continued

| | | \multicolumn{7}{c}{EXAMPLE} |
|---|---|---|---|---|---|---|---|---|
| | | H1 | H2 | H3 | H4 | H5 | H6 | H7 |
| | High refractive index filler 1 (zirconia: ZRMIBK30 WT %) | | | | | | | |
| | High refractive index filler 2 (titania: TiMIBK15 WT %) | | | | | | | |
| | Bifunctional urethane acrylate (NV100: CN-9893) | | | | | | | |
| | Methyl isobutyl ketone | 18.13 | 21.25 | 15.00 | 15.00 | 15.00 | 18.13 | 18.13 |
| | Isobutyl alcohol | 55.10 | 53.54 | 56.67 | 56.67 | 56.67 | 55.10 | 55.10 |
| | Butyl acetate | 55.10 | 53.54 | 56.67 | 56.67 | 56.67 | 55.10 | 55.10 |
| | Total amounts | 235.33 | 235.33 | 235.33 | 235.33 | 235.33 | 235.33 | 235.33 |
| | SP value of the first component | 9.7 | 9.7 | 9.7 | 9.7 | 9.7 | 9.7 | 9.7 |
| | SP value of the first component | 12.2 | 12.4 | 12.4 | 12.3 | 12.1 | 12.2 | 12.2 |
| | Thickness (μm) | 3.0 | 5.0 | 5.0 | 5.0 | 3.0 | 6.0 | 6.5 |
| | Antiblocking property | ○ | ○ | ○ | ○ | ○ | ○ | ○ |
| | A refractive index | 1.582 | 1.583 | 1.571 | 1.571 | 1.581 | 1.582 | 1.582 |
| Color difference evaluation | Total mass of particles (parts) | 40 | 40 | 37 | 37 | 40 | 40 | 30 |
| | Δmax |R1-R2| (%) (500-750) | 0.61 | 0.51 | 0.69 | 0.63 | 0.61 | 0.62 | 0.55 |
| | ΔHaze (%) | 0.1 | 0.1 | 0.0 | 0.1 | 0.1 | 0.1 | 0.0 |
| | Evaluation of interference fringes | ○○ | ○○ | ○ | ○ | ○○ | ○○ | ○ |
| | Evaluation of etching mark | ○○ | ○○ | ○ | ○ | ○○ | ○○ | ○○ |
| | Adhesion evaluation | 10 | 10 | 10 | 10 | 10 | 10 | 10 |

| | | \multicolumn{6}{c}{Example} |
|---|---|---|---|---|---|---|---|
| | | H8 | H9 | H10 | H11 | H12 | H13 | H14 |
| substrate | Type of substrate | PET | PET | PET | PC | PC | PC | modifiedPC-1 |
| | Thickness (μm) | 188 | 125 | 50 | 100 | 100 | 100 | 75 |
| High refractive antiblocking layer | Unsaturated double bond containing acrylic copolymer (I) | 2.00 | 2.00 | 6.00 | 2.00 | 2.00 | 2.00 | 2.00 |
| | Phenol novolac epoxy acrylate (1) | 72.50 | 72.50 | 72.50 | 72.50 | 72.50 | 72.50 | 72.50 |
| | Phenol novolac epoxy acrylate (2) | | | | | | | |
| | Ethoxylated orthophenylphenol acrylate | 22.50 | 22.50 | 22.50 | 22.50 | 22.50 | 22.50 | 22.50 |
| | Pentaerythritol triacrylate | 5.00 | 5.00 | 5.00 | 5.00 | 5.00 | 5.00 | 5.00 |
| | I-184 | 5.00 | 5.00 | 5.00 | 5.00 | 5.00 | 5.00 | 5.00 |
| | Bisphenol A ethyleneoxide-modified (2 mol) diacrylate | | | | | | | |
| | Acryloyl morpholine | | | | | | | |
| | High refractive index filler 1 (zirconia: ZRMIBK30 WT %) | | | | | | | |
| | High refractive index filler 2 (titania: TiMIBK15 WT %) | | | | | | | |
| | Bifunctional urethane acrylate (NV100: CN-9893) | | | | | | | |
| | Methyl isobutyl ketone | 18.13 | 18.13 | 18.13 | 18.13 | 18.13 | 18.13 | 18.13 |
| | Isobutyl alcohol | 55.10 | 55.10 | 55.10 | 55.10 | 55.10 | 55.10 | 55.10 |
| | Butyl acetate | 55.10 | 55.10 | 55.10 | 55.10 | 55.10 | 55.10 | 55.10 |
| | Total amounts | 235.33 | 235.33 | 239.33 | 235.33 | 235.33 | 235.33 | 235.33 |
| | SP value of the first component | 9.7 | 9.7 | 9.7 | 9.7 | 9.7 | 9.7 | 9.7 |
| | SP value of the first component | 12.2 | 12.2 | 12.2 | 12.2 | 12.2 | 12.2 | 12.2 |
| | Thickness (μm) | 3.0 | 6.5 | 0.1 | 6.0 | 6.0 | 6.0 | 5.0 |
| | Antiblocking property | ○ | ○ | ○ | ○ | ○ | ○ | ○ |
| | A refractive index | 1.582 | 1.582 | 1.582 | 1.582 | 1.582 | 1.582 | 1.582 |

TABLE 8-continued

| | | EXAMPLE | | | | | | |
|---|---|---|---|---|---|---|---|---|
| | | H1 | H2 | H3 | H4 | H5 | H6 | H7 |
| Color difference evaluation | Total mass of particles (parts) | 30 | 30 | 35 | 40/100 | 200 | 40/0 | 40 |
| | Δmax |R1-R2| (%) (500-750) | 0.59 | 0.49 | 0.36 | 0.25 | 0.92 | 0.79 | 0.65 |
| | ΔHaze (%) | 0.0 | 0.1 | 0.1 | 0.2 | 0.3 | 0.3 | 0.1 |
| | Evaluation of interference fringes | Δ | Δ | ∘∘ | ∘∘ | ∘∘ | ∘∘ | ∘∘ |
| | Evaluation of etching mark | ∘ | ∘ | ∘∘ | ∘∘ | Δ | Δ | ∘ |
| | Adhesion evaluation | 10 | 10 | 10 | 10 | 8 | 8 | 10 |

TABLE 9

| | | COMPARATIVE EXAMPLE | | | | | | | | | |
|---|---|---|---|---|---|---|---|---|---|---|---|
| | | H1 | H2 | H3 | H4 | H5 | HE | H7 | HE | H9 | H10 |
| substrate | Type of substrate | PC | PC | PET | PET | PET | PET | PET | PET | PET | PET |
| | Thickness (μm) | 100 | 100 | 125 | 125 | 125 | 125 | 125 | 125 | 125 | 125 |
| High refractive antiblocking layer | Unsaturated double bond containing acrylic copolymer (I) | 2.00 | 2.00 | 2.00 | 2.00 | 2.00 | 2.00 | 2.00 | 2.00 | 2.00 | 2.00 |
| | Phenol novolac epoxy acrylate (1) | 95.00 | 55.00 | | 60.00 | | | | | | 72.50 |
| | Phenol novolac epoxy acrylate (2) | | | | | | | | | | |
| | Ethoxylated orthophenylphenol acrylate | 5.00 | 45.00 | 15.00 | | | | | | | 22.50 |
| | Pentaerythritol triacrylate | | | | 25.00 | 60.00 | 60.00 | 40.00 | 24.00 | 24.00 | 5.00 |
| | I-184 | 5.00 | 5.00 | 5.00 | 5.00 | 5.00 | 5.00 | 5.00 | 5.00 | 5.00 | 5.00 |
| | Bisphenol A ethyleneoxide-modified (2 mol diacrylate | | | 85.00 | | | | | | | |
| | Acryloyl morpholine | | | | 15.00 | | | | | | |
| | High refractive index filler 1 (zirconia: ZRMIBK30 WT %) | | | | | 40.00 | | | 40.00 | | |
| | High refractive index filler 2 (titania: TiMIBK15 WT %) | | | | | | 40.00 | | | 40.00 | |
| | Bifunctional urethane acrylate (NV100: CN-9893) | | | | | | | 60.00 | 36.00 | 36.00 | |
| | Methyl isobutyl ketone | 23.75 | 13.75 | | 15.00 | 93.33 | 226.67 | 60.00 | 129.33 | 262.67 | 18.13 |
| | Isobutyl alcohol | 52.29 | 57.29 | 64.17 | 56.67 | 17.50 | 9.17 | 34.17 | 14.08 | 78.67 | 55.10 |
| | Butyl acetate | 52.29 | 57.29 | 64.17 | 56.67 | 17.50 | 9.17 | 34.17 | 14.08 | 78.67 | 55.10 |
| | Total amounts | 235.33 | 235.33 | 235.33 | 235.33 | 235.33 | 352.00 | 235.33 | 264.50 | 527.00 | 235.33 |
| | SP value of the first component | 9.7 | 9.7 | 9.7 | 9.7 | 9.7 | 9.7 | 9.7 | 9.7 | 9.7 | 9.7 |
| | SP value of the first component | 12.6 | 11.8 | 11.2 | 12.6 | 12.7 | 12.7 | 11.7 | 11.7 | 11.7 | 12.2 |
| | Thickness (μm) | 5.0 | 5.0 | 6.0 | 6.0 | 6.0 | 6.0 | 6.0 | 6.0 | 6.0 | 6.0 |
| | Antiblocking property | ∘ | ∘ | ∘ | ∘ | x | x | ∘ | x | x | ∘ |
| | A refractive index | 1.579 | 1.591 | 1.565 | 1.560 | 1.585 | 1.615 | 1.510 | 1.584 | 1.614 | 1.582 |
| Color difference evaluation | Total mass of particles (parts) | 40 | 40 | 30 | 30 | 30 | 30 | 30 | 30 | 30 | 300 |
| | Δmax |R1-R2| (%) (500-750) | 0.80 | 0.74 | 1.62 | 1.89 | 2.71 | 3.15 | 2.13 | 2.72 | 2.86 | 2.19 |
| | ΔHaze (%) | 0.4 | 0.6 | 0.1 | 0.2 | 0.2 | 0.3 | 0.1 | 0.1 | 0.5 | 0.3 |
| | Evaluation of interference fringes | Δ | Δ | x | x | x | x | x | x | x | ∘ |
| | Evaluation of etching mark | x | x | x | x | x | x | x | x | x | Δ |
| | Adhesion evaluation | 8 | 8 | 10 | 10 | 10 | 8 | 10 | 10 | 8 | 4 |

In the Table 8 and Table 9, each term means as follows.

I-184: 1-hydroxycyclohexyl phenyl ketone, a photoinitiator.

Bisphenol A ethyleneoxide-modified (2 mol) diacrylate: Aronix M-211B manufactured by Toa gosei Co., Ltd., bisphenol A ethyleneoxide-modified (2 mol) diacrylate, SP value of 11.3.

Acryloyl morpholine: SP value of 11.9

Bifunctional urethane acrylate: NV (non-volatile component) 100, CN-9893 manufactured by Sartomer Corp, SP value of 11.1.

High refractive index filler 1: zirconia: ZRMIBK30 WT %, zirconium oxide, manufactured by CIK NanoTec.

High refractive index filler 2: titania: TiMIBK15WT %, titanium oxides, manufactured by CIK NanoTec.

The high refractive index antiblocking layer in the transparent electroconductive laminates obtained in Examples had excellent antiblocking property. Furthermore, each of the transparent electroconductive laminates obtained in Examples had ΔR of not greater than 1 and ΔH of not greater than 0.3%. These results show the transparent electroconductive laminate in Examples had excellent visibility even if the etching treatment was performed.

In addition, appearance of interference fringes were not observed in the transparent electroconductive laminates obtained in Examples. Furthermore, the transparent electroconductive laminates had excellent etching mark property and adhesion property.

Comparative examples H1 and H2 were a comparative example in which amounts of the components (A) and (B) were out of the claimed invention of the present application. In each of these comparative examples, the obtained transparent electroconductive laminates had ΔH of greater than 0.3%, which resulted in inferior visibility.

Comparative example H3 was a comparative example in which bisphenol A diacrylate was used in place of the component (A). In the comparative example H3, the obtained transparent electroconductive laminate had ΔR of greater than 1, which resulted in inferior visibility. In addition, appearance of interference fringes was observed.

Comparative example H4 was a comparative example in which acryloyl morpholine was used in place of the component (B). In the comparative example H4, the obtained transparent electroconductive laminate had ΔR of greater than 1, which resulted in inferior visibility. In addition, appearance of interference fringes was observed.

Comparative examples H5 and H6 were comparative examples in which zirconium oxide or titanium oxides were used as a high refractive index material, in place of using the components (A) and (B). In the comparative examples H5 and H6, the obtained transparent electroconductive laminates had ΔR of greater than 1, which resulted in inferior visibility. In addition, appearance of interference fringes was observed.

Comparative examples H7 to H9 were comparative examples in which a bifunctional urethane acrylate was used in order to provide an elongation to a hard coat layer. These comparative examples had a slightly-increased elongation. However, the obtained transparent electroconductive laminates had ΔR of greater than 1, which resulted in inferior visibility.

Comparative example H10 was a comparative example in which a total mass of particles in the color difference adjusting layer exceed 200 parts by mass. In the comparative examples, adhesion property was deteriorated.

INDUSTRIAL APPLICABILITY

The transparent electroconductive laminate according to the present invention has excellent visibility. The transparent electroconductive laminate can preferably be used for a touch panel, especially, an electrostatic capacity type touch panel.

The electroconductive laminate according to the present invention also has excellent adhesion property to an auxiliary electrode layer. Thus the electroconductive laminate can preferably be used for a narrow flame touch panel display in view of increased demand in recent years.

DESCRIPTION OF THE REFERENCE NUMERALS

1: a transparent electroconductive laminate,
3: a hard coat layer,
5: a color difference adjusting layer,
7: a transparent electrically conducting layer,
10: a transparent electroconductive laminate,
11: a part where a transparent electrically conducting layer (7) is removed by etching treatment, and
13: a part where a mask is applied in etching treatment.

What is claimed is:

1. A transparent electroconductive laminate in which a hard coat layer, a color difference adjusting layer, and a transparent electrically conducting layer are formed in this order on at least one surface of a transparent polymer substrate, wherein (1) the hard coat layer is obtained by applying and curing a hard coating composition comprising (A) a phenolic novolac acrylate having two or more acrylate groups and (B) an aromatic group-containing mono or poly (meth)acrylate having 1 or 2 alkylene oxide structures comprising two or three carbon atoms in each molecule, wherein the hard coating composition comprises 60 to 85 parts by mass of the phenolic novolac acrylate (A) and 15 to 30 parts by mass of the (meth)acrylate (B), providing that 100 parts by mass of a resin content in the hard coating composition, and (2) the color difference adjusting layer comprises a curing resin component (i), and metal oxide particles having an average primary particle diameter of 100 nm or less (ii) and/or metal fluoride particles having an average primary particle diameter of 100 nm or less (iii), and where the total mass of particles (ii) and (iii) in the color difference adjusting layer is 0-200 parts by mass with respect to 100 parts by mass of the curing resin component (i), and (3) a difference ΔR of R1 and R2 is not greater than 1, wherein R1 is a reflectance obtained by irradiation with a light source having a wavelength in a range of 500 to 750 nm toward the transparent electroconductive laminate, and R2 is a reflectance obtained by irradiation with a light source having a wavelength in a range of 500 to 750 nm toward a transparent electroconductive laminate after immersion into a strong acid aqueous solution at 40° C. for three minutes and dried, wherein the strong acid aqueous solution is obtained by a mixing of 12 N hydrochloric acid, 16 N nitric acid and water in a mass ratio of 12 N hydrochloric acid:16 N nitric acid:water being 3.3:1.0:7.6.

2. The transparent electroconductive laminate according to claim 1, wherein the curing resin component (i) in the color difference adjusting layer is an ultraviolet curing resin, and a difference ΔH of H1 and H2 is not greater than 0.3%, wherein H1 is a haze value of the transparent electroconductive laminate, and H2 is a haze value of a transparent electroconductive laminate after immersion into a strong acid aqueous solution at 40° C. for three minutes and dried, wherein the strong acid aqueous solution is obtained by a mixing of 12 N hydrochloric acid, 16 N nitric acid and water in a mass ratio of 12 N hydrochloric acid:16 N nitric acid:water being 3.3: 1.0: 7.6.

3. The transparent electroconductive laminate according to claim 1, wherein the phenolic novolac acrylate (A) is represented by the following formula (I):

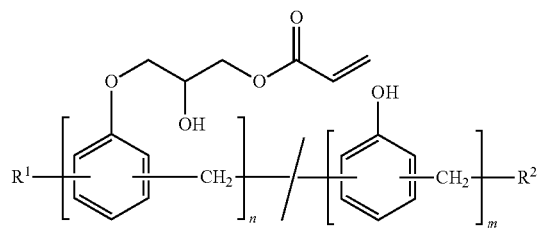

(I)

wherein $R^1$ represents H or $CH_2OH$, $R^2$ represents H or OH, n represents a number of 2 to 5 and m represents a number of 0 to 5.

4. The transparent electroconductive laminate according to claim 1, wherein the (meth)acrylate (B) is an aromatic group-containing (meth)acrylate having a refractive index within a range of 1.56 to 1.64.

5. The transparent electroconductive laminate according to claim 1, wherein
the hard coat layer is obtained by applying and curing the hard coating composition further comprising (C) a fluorene unit-containing (meth)acrylate having two or more (meth)acrylate groups in addition to the components (A) and (B), wherein
the hard coating composition comprises 60 to 70 parts by mass of the phenolic novolac acrylate (A), 15 to 30 parts by mass of the (meth)acrylate (B) and 15 to 40 parts by mass of the fluorene unit-containing (meth) acrylate (C), providing that 100 parts by mass of a resin content in the hard coating composition.

6. The transparent electroconductive laminate according to claim 5, wherein the fluorene unit-containing (meth) acrylate (C) is represented by the following formula (II):

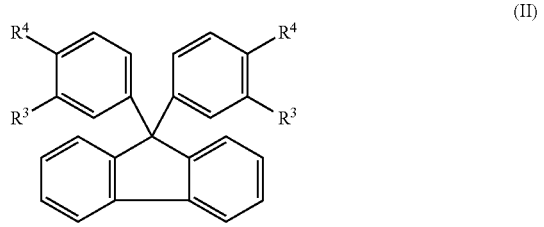

(II)

wherein each of $R^3$ independently represents H or $CH_3$, $R^4$ represents -A-OC(O)CR=$CH_2$, wherein A each represents $OCH_2CH_2$—, —$OCH_2CH_2CH_2$—, —$OCH(CH_3)CH_2$— or $OCH_2CH(CH_3)$— and R each represents H or $CH_3$.

7. The transparent electroconductive laminate according to claim 1, wherein a total content of ZnO, $TiO_2$, $CeO_2$, $SnO_2$, $ZrO_2$ and indium tin oxide in the hard coat layer is less than or equal to 0.0001% by mass.

8. The transparent electroconductive laminate according to claim 1, wherein
the hard coat layer has a refractive index within a range of 1.565 to 1.620.

9. The transparent electroconductive laminate according to claim 1, wherein
the curing resin component (i) in the color difference adjusting layer is a (meth)acrylate having two or more acrylate groups and a molecular weight of 1400 to 1800, and the curing resin component (i) has a hydroxyl value of 60 to 100 mgKOH/g, and a thickness of the color difference adjusting layer is within a range of 50 nm to 200 nm.

10. The transparent electroconductive laminate according to claim 1, wherein
the transparent electrically conducting layer is a crystalline layer comprising indium oxide, and
the transparent electrically conducting layer has a thickness within a range of 5 to 50 nm.

11. The transparent electroconductive laminate according to claim 1, wherein
the transparent electroconductive laminate has a metal oxide layer between the color difference adjusting layer and the transparent electrically conducting layer, and
the metal oxide layer has a thickness within a range of 0.5 to 5.0 nm.

12. The transparent electroconductive laminate according to claim 1, wherein
the hard coat layer, the color difference adjusting layer, and the transparent electrically conducting layer are formed in this order on one side of the transparent polymer substrate, and
an antiblocking layer is formed on the other side of the transparent polymer substrate.

13. The transparent electroconductive laminate according to claim 12, wherein
the antiblocking layer is obtained by applying and curing a composition for forming an antiblocking layer comprising a first component and a second component, wherein
the first component is an unsaturated double bond containing acrylic copolymer, and
the second component comprises a polyfunctional acrylate, and
a difference of solubility parameter values (ΔSP) of the first component (SP1) and the second component (SP2) is within a range of 1 to 2, and
phase separation occurs between the first component and the second component after the composition for forming an antiblocking layer is applied, to form an antiblocking layer having a microscopic convexoconcave on its surface.

14. A touch panel having the transparent electroconductive laminate according to claim 1.

15. A transparent electroconductive laminate in which a high refractive index antiblocking layer, a color difference adjusting layer, and a transparent electrically conducting layer are formed in this order on at least one surface of a transparent polymer substrate, wherein
(1) the high refractive index antiblocking layer has a refractive index within a range of 1.565 to 1.620, and is obtained by applying a composition for forming a high refractive index antiblocking layer comprising a first component and a second component, wherein
the first component is an unsaturated double bond containing acrylic copolymer, and
the second component comprises
(A) a phenolic novolac acrylate having two or more acrylate groups, and
(B) an aromatic group-containing mono or poly (meth) acrylate having 1 or 2 alkylene oxide structures comprising two or three carbon atoms in each molecule, wherein
the second component comprises 60 to 85 parts by mass of the phenolic novolac acrylate (A) and 15 to 30 parts by mass of the (meth)acrylate (B), providing that 100 parts by mass of the second component, and a difference of solubility parameter values (ΔSP) of the first component (SP1) and the second component (SP2) is within a range of 1 to 4, and a mass ratio of the first component to the second component in the composition is from 0.5:99.5 to 20:80, and phase separation occurs between the first component and the second component after the composition for forming a high refractive index antiblocking layer is applied, to form an antiblocking layer having a microscopic convexoconcave on its surface, (2) the color difference adjusting layer comprises a curing resin component (i), and metal oxide particles having an average primary particle diameter of 100 nm or less (ii) and/or metal fluoride particles having an average primary particle diameter of 100 nm or less (iii), and where the total mass of particles (ii) and (iii) in the color difference adjusting layer is 0-200 parts by mass with respect to 100 parts by mass of the curing resin component (i), and (3) a difference ΔR of R1 and R2 is not greater than 1, wherein R1 is a reflectance obtained by irradiation with a light source having a wavelength in a range of 500 to 750 nm toward the transparent electroconductive laminate, and R2 is a reflectance obtained by irradiation with a light source having a wavelength in a range of 500 to 750 nm toward a transparent electroconductive laminate after immersion into a strong acid aqueous solution at 40° C. for three minutes and dried, wherein the strong acid aqueous solution is obtained by a mixing of 12 N hydrochloric acid, 16 N nitric acid and water in a mass ratio of 12 N hydrochloric acid:16 N nitric acid:water being 3.3:1.0:7.6.

16. The transparent electroconductive laminate according to claim 15, wherein the curing resin component (i) in the color difference adjusting layer is an ultraviolet curing resin, and a difference ΔH of H1 and H2 is not greater than 0.3%, wherein H1 is a haze value of the transparent electroconductive laminate, and H2 is a haze value of a transparent electroconductive laminate after immersion into a strong acid aqueous solution at 40° C. for three minutes and dried, wherein the strong acid aqueous solution is obtained by a mixing of 12 N hydrochloric acid, 16 N nitric acid and water in a mass ratio of 12 N hydrochloric acid:16 N nitric acid:water being 3.3:1.0:7.6.

17. The transparent electroconductive laminate according to claim 15, wherein the phenolic novolac acrylate (A) is represented by the following formula (I):

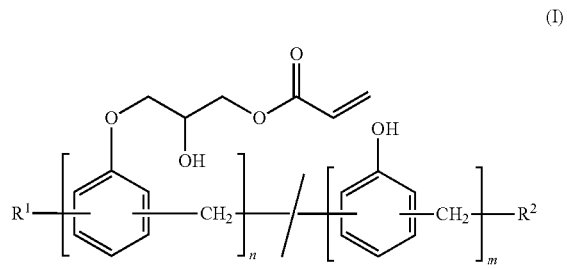

(I)

wherein $R^1$ represents H or $CH_2OH$, $R^2$ represents H or OH, n represents a number of 2 to 5 and m represents a number of 0 to 5.

18. The transparent electroconductive laminate according to claim 15, wherein the (meth)acrylate (B) is an aromatic group-containing (meth)acrylate having a refractive index within a range of 1.56 to 1.64.

19. The transparent electroconductive laminate according to claim 15, wherein a total content of ZnO, $TiO_2$, $CeO_2$, $SnO_2$, $ZrO_2$ and indium tin oxide in the high refractive index antiblocking layer is less than or equal to 0.0001% by mass.

20. The transparent electroconductive laminate according to claim 15, wherein the high refractive index antiblocking layer has an arithmetic average roughness (Ra) of 0.001 to 0.09 μm and a ten-point average roughness (Rz) of 0.01 to 0.5 μm.

21. The transparent electroconductive laminate according to claim 15, wherein the high refractive index antiblocking layer has a thickness within a range of 0.05 to 10 μm.

22. The transparent electroconductive laminate according to claim 15, wherein the transparent electrically conducting layer is a crystalline layer comprising indium oxide, and the transparent electrically conducting layer has a thickness within a range of 5 to 50 nm.

23. The transparent electroconductive laminate according to claim 15, wherein the transparent electroconductive laminate has a metal oxide layer between the color difference adjusting layer and the transparent electrically conducting layer, and the metal oxide layer has a thickness within a range of 0.5 to 5.0 nm.

24. The transparent electroconductive laminate according to claim 15, wherein the high refractive index antiblocking layer, the color difference adjusting layer, and the transparent electrically conducting layer are formed in this order on one side of the transparent polymer substrate, and an antiblocking layer is formed on the other side of the transparent polymer substrate.

25. The transparent electroconductive laminate according to claim 12, wherein the antiblocking layer is obtained by applying and curing a composition for forming an antiblocking layer comprising a first component and a second component, wherein the first component is an unsaturated double bond containing acrylic copolymer, and the second component comprises a polyfunctional acrylate, and a difference of solubility parameter values (ΔSP) of the first component (SP1) and the second component (SP2) is within a range of 1 to 2, and phase separation occurs between the first component and the second component after the composition for forming an antiblocking layer is applied, to form an antiblocking layer having a microscopic convexoconcave on its surface.

26. A touch panel having the transparent electroconductive laminate according to claim 15.

* * * * *